US008809992B2

(12) United States Patent
Yamazaki et al.

(10) Patent No.: US 8,809,992 B2
(45) Date of Patent: Aug. 19, 2014

(54) SEMICONDUCTOR DEVICE AND MANUFACTURING METHOD THEREOF

(75) Inventors: Shunpei Yamazaki, Tokyo (JP); Atsuo Isobe, Kanagawa (JP); Toshihiko Saito, Kanagawa (JP); Takehisa Hatano, Kanagawa (JP); Hideomi Suzawa, Kanagawa (JP); Shinya Sasagawa, Kanagawa (JP); Junichi Koezuka, Tochigi (JP); Yuichi Sato, Kanagawa (JP); Shinji Ohno, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/356,012

(22) Filed: Jan. 23, 2012

(65) Prior Publication Data

US 2012/0187397 A1    Jul. 26, 2012

(30) Foreign Application Priority Data

Jan. 26, 2011   (JP) .................................. 2011-014632
Jan. 26, 2011   (JP) .................................. 2011-014633

(51) Int. Cl.
*H01L 29/786*    (2006.01)
(52) U.S. Cl.
CPC .................................. *H01L 29/786* (2013.01)
USPC ........................................... 257/506; 257/43
(58) Field of Classification Search
CPC ...................... H01L 29/7869; H01L 29/78696
USPC ............ 257/43, 754–760, 506; 438/151, 156, 438/164, 584–688
See application file for complete search history.

(56) References Cited

U.S. PATENT DOCUMENTS 5,508,212 A *  4/1996  Wang et al. ................... 438/305
5,528,032 A     6/1996  Uchiyama
(Continued)

FOREIGN PATENT DOCUMENTS

EP    1737044 A    12/2006
EP    2226847 A    9/2010
(Continued)

OTHER PUBLICATIONS

Yamazaki et al., Machine Translation for the patent JP2008-103666, 2008, translated by Google Translation Function, pp. 1-36.*

(Continued)

*Primary Examiner* — Julia Slutsker
*Assistant Examiner* — Natalia Gondarenko
(74) *Attorney, Agent, or Firm* — Eric J. Robinson; Robinson Intellectual Property Law Office, P.C.

(57) ABSTRACT

A semiconductor device which includes an oxide semiconductor and has favorable electrical characteristics is provided. In the semiconductor device, an oxide semiconductor film and an insulating film are formed over a substrate. Side surfaces of the oxide semiconductor film are in contact with the insulating film. The oxide semiconductor film includes a channel formation region and regions containing a dopant between which the channel formation region is sandwiched. A gate insulating film is formed on and in contact with the oxide semiconductor film. A gate electrode with sidewall insulating films is formed over the gate insulating film. A source electrode and a drain electrode are formed in contact with the oxide semiconductor film and the insulating film.

34 Claims, 22 Drawing Sheets

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,126,174 B2 * | 10/2006 | Segawa et al. ............... 257/288 |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,821,002 B2 | 10/2010 | Yamazaki et al. |
| 7,910,490 B2 | 3/2011 | Akimoto et al. |
| 7,932,521 B2 | 4/2011 | Akimoto et al. |
| 8,193,045 B2 | 6/2012 | Omura et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0281400 A1 * | 12/2007 | Yamazaki et al. ............ 438/151 |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0185656 A1 * | 8/2008 | Koyama et al. ............... 257/369 |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0108294 A1 | 4/2009 | Choi et al. |
| 2009/0114910 A1 | 5/2009 | Chang |
| 2009/0127552 A1 | 5/2009 | Li et al. |
| 2009/0134399 A1 | 5/2009 | Sakakura et al. |
| 2009/0140053 A1 * | 6/2009 | Yamazaki et al. ............ 235/492 |
| 2009/0140337 A1 * | 6/2009 | Yamazaki ..................... 257/347 |
| 2009/0152506 A1 | 6/2009 | Umeda et al. |
| 2009/0152541 A1 | 6/2009 | Maekawa et al. |
| 2009/0243031 A1 * | 10/2009 | Natzle et al. .................. 257/508 |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0029068 A1 * | 2/2010 | Isobe et al. ................... 438/479 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0133533 A1 | 6/2010 | Umezaki |
| 2010/0136743 A1 | 6/2010 | Akimoto et al. |
| 2010/0140612 A1 * | 6/2010 | Omura et al. .................... 257/43 |
| 2010/0155721 A1 | 6/2010 | Lee et al. |
| 2010/0159639 A1 | 6/2010 | Sakata |
| 2010/0295042 A1 * | 11/2010 | Yano et al. ...................... 257/43 |
| 2011/0006301 A1 | 1/2011 | Yamazaki et al. |
| 2011/0012118 A1 | 1/2011 | Yamazaki et al. |
| 2011/0024740 A1 | 2/2011 | Yamazaki et al. |
| 2011/0024750 A1 | 2/2011 | Yamazaki et al. |
| 2011/0024751 A1 | 2/2011 | Yamazaki et al. |
| 2011/0027980 A1 | 2/2011 | Yamazaki et al. |
| 2011/0031491 A1 | 2/2011 | Yamazaki et al. |
| 2011/0037068 A1 | 2/2011 | Yamazaki et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0163311 A1 | 7/2011 | Akimoto et al. |
| 2012/0119212 A1 | 5/2012 | Endo et al. |
| 2012/0161121 A1 | 6/2012 | Yamazaki |
| 2012/0161122 A1 | 6/2012 | Yamazaki |
| 2012/0161123 A1 | 6/2012 | Yamazaki |
| 2012/0161124 A1 | 6/2012 | Yamazaki |
| 2012/0161125 A1 | 6/2012 | Yamazaki |
| 2012/0161126 A1 | 6/2012 | Yamazaki |
| 2012/0175609 A1 | 7/2012 | Yamazaki |
| 2012/0175625 A1 | 7/2012 | Yamazaki |
| 2012/0178224 A1 | 7/2012 | Yamazaki |
| 2012/0178249 A1 | 7/2012 | Yamazaki |
| 2012/0187396 A1 | 7/2012 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |

(56) References Cited

FOREIGN PATENT DOCUMENTS

| | | |
|---|---|---|
| JP | 05-251705 A | 9/1993 |
| JP | 06-275697 | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 | 4/2007 |
| JP | 2007-123861 | 5/2007 |
| JP | 2008-103666 | 5/2008 |
| JP | 2009-224479 | 10/2009 |
| WO | WO-2004/114391 | 12/2004 |

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2994, vol. 432, pp. 488-492.

Park.J et al., "Improvements in the Device Characteristics of Amorphous Indium Gallium Zinc Oxide Thin-Film Transisitorsd by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)_m$ (M=In,Ga; m=Integer) Described by Four-Dimensional Superspace Group,". Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papes, Jul. 2, 2008, pp. 275-278.

(56) References Cited

OTHER PUBLICATIONS

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers 2007, vol. 38, pp. 1830-1833.

Godo.H et al., "P-9:Numerical Analysis on Temperature Dependence of Characteristics of Amorphous In—Ga—Zn—Oxide TFT, ", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer, ", SID Digest '09 : SID International, Symposium Digest of Technical Paper, May 31, 2009, pp. 284-287.

Miyasaka.M, "Suftla Flexible Microelectronics on Their Way to Business,", SID Digest '07 : SID International Symposium Digest of Technical Papers, 2007, vol. 38 pp. 1673-1676.

Chern.H et al., "An Analytical Model for the Above-Threshold Characteristics of Polysilicon Thin-Film Transitors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composite for Display Applications,", SID Digest '09 ; SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized International Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, CU, or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

128

128a  128b 200  130  132

126a 128a 154a 150a 150b 154b 128b 126b
152a 122 152b

SEMICONDUCTOR DEVICE AND MANUFACTURING METHOD THEREOF

BACKGROUND OF THE INVENTION

1. Field of the Invention

The present invention relates to a semiconductor device which includes a circuit including a semiconductor element such as a transistor, and a method for manufacturing the semiconductor device. For example, the present invention relates to an electronic device which includes, as a component, a power device mounted on a power supply circuit; a semiconductor integrated circuit including a memory, a thyristor, a converter, an image sensor, or the like; an electro-optical device typified by a liquid crystal display panel; a light-emitting display device including a light-emitting element; or the like.

Note that in this specification, a semiconductor device means any device that can function by utilizing semiconductor characteristics. An electro-optical device, a light-emitting display device, a semiconductor circuit, and an electronic device are all semiconductor devices.

2. Description of the Related Art

A transistor formed over a glass substrate or the like is manufactured using amorphous silicon, polycrystalline silicon, or the like, as typically seen in a liquid crystal display device. Although a transistor including amorphous silicon has low field-effect mobility, it can be formed over a large-sized glass substrate. On the other hand, although a transistor including polycrystalline silicon has high field-effect mobility, it is difficult to be formed over a large glass substrate.

In view of the foregoing, attention has been drawn to a technique by which a transistor is manufactured using an oxide semiconductor, and such a transistor is applied to an electronic device an optical device. For example, Patent Document 1 and Patent Document 2 disclose a technique in which a transistor is manufactured using zinc oxide or an In—Ga—Zn—O-based oxide as an oxide semiconductor and such a transistor is used as a switching element or the like of a pixel of a display device.

Meanwhile, it has been pointed out that hydrogen is a source for supplying carriers particularly in an oxide semiconductor. Therefore, some measures need to be taken to prevent hydrogen from entering the oxide semiconductor at the time of depositing the oxide semiconductor. Further, fluctuation in the threshold voltage can be reduced by reducing the amount of hydrogen contained in not only the oxide semiconductor but also a gate insulating film in contact with the oxide semiconductor (see Patent Document 3).

REFERENCE

Patent Document

[Patent Document 1] Japanese Published Patent Application No. 2007-123861
[Patent Document 2] Japanese Published Patent Application No. 2007-096055
[Patent Document 3] Japanese Published Patent Application No. 2009-224479

SUMMARY OF THE INVENTION

However, in a transistor formed using an oxide semiconductor, once a surface or a side surface of an oxide semiconductor film is exposed to a reduced-pressure atmosphere in a manufacturing process, oxygen in the oxide semiconductor film is released and an oxygen defect (also referred to as oxygen deficiency) is formed. Carriers easily flow in a region where an oxygen defect is formed in the oxide semiconductor film, which causes a problem of large leakage current between a source and a drain in the transistor. Further, when carriers easily flow due to the oxygen defect formed in the oxide semiconductor film, the threshold voltage of the transistor shifts in the negative direction.

As described above, electrical characteristics of the transistor are degraded due to the oxygen defect formed in the oxide semiconductor film.

In view of the foregoing, an object of an embodiment of the present invention is to provide a transistor with favorable electrical characteristics which is formed using an oxide semiconductor and a method for manufacturing the same.

According to an embodiment of the present invention, in a manufacturing process of a transistor including an oxide semiconductor film, an insulating film containing oxygen is provided in contact with the oxide semiconductor film in order to prevent release of oxygen from the oxide semiconductor film. Hereinafter, specific description is given.

An embodiment of the present invention is a semiconductor device. In the semiconductor device, an oxide semiconductor film and an insulating film are formed over a substrate. A side surface of the oxide semiconductor film is in contact with the insulating film. The oxide semiconductor film includes a channel formation region and regions containing a dopant between which the channel formation region is sandwiched. A gate insulating film is formed on and in contact with the oxide semiconductor film. A gate electrode is formed over the gate insulating film and has a sidewall insulating film. A source electrode and a drain electrode are formed in contact with the oxide semiconductor film and the insulating film.

An embodiment of the present invention is a semiconductor device. In the semiconductor device, an oxide semiconductor film and an insulating film are formed over a substrate. A side surface of the oxide semiconductor film is in contact with the insulating film. The oxide semiconductor film includes a channel formation region, first regions containing a dopant between which the channel formation region is sandwiched, and second regions containing the dopant between which the first regions containing the dopant are sandwiched. A gate insulating film is formed on and in contact with the oxide semiconductor film. A gate electrode is formed over the gate insulating film and has sidewall insulating films. A source electrode and a drain electrode are formed in contact with the oxide semiconductor film and the insulating film. In the oxide semiconductor film, the dopant concentration of the first regions containing the dopant, which overlap with the sidewall insulating films, is different from that of the second regions containing the dopant, between which the first regions containing the dopant are sandwiched.

Further, it is preferable that the dopant concentration of the first regions containing the dopant be lower than that of the second regions containing the dopant.

Further, an embodiment of the present invention is a semiconductor device. In the semiconductor device, an oxide semiconductor film and an insulating film are formed over a substrate. A side surface of the oxide semiconductor film is in contact with the insulating film. The oxide semiconductor film includes a channel formation region and regions containing a dopant between which the channel formation region is sandwiched. A gate insulating film is formed on and in contact with the oxide semiconductor film. A gate electrode is formed over the gate insulating film and has sidewall insulating films. A source electrode and a drain electrode are formed in contact with the sidewall insulating films, the oxide semiconductor film, and the insulating film.

An embodiment of the present invention is a semiconductor device. In the semiconductor device, an oxide semiconductor film and an insulating film are formed over a substrate. A side surface of the oxide semiconductor film is in contact with the insulating film. The oxide semiconductor film includes a channel formation region, first regions containing a dopant between which the channel formation region is sandwiched, and second regions containing a dopant between which the first regions containing the dopant are sandwiched. A gate insulating film is formed on and in contact with the oxide semiconductor film. A gate electrode is formed over the gate insulating film and has sidewall insulating films. A source electrode and a drain electrode are formed in contact with the sidewall insulating films, the oxide semiconductor film, and the insulating film. In the oxide semiconductor film, the dopant concentration of the first regions containing the dopant, which overlap with the sidewall including films, is different from that of the second regions containing the dopant, which are in contact with the source electrode and the drain electrode.

Further, it is preferable that the dopant concentration of the first regions containing the dopant be lower than that of the second regions containing the dopant.

Further, it is preferable that the source electrode and the drain electrode each include a first conductive film and a second conductive film and the first conductive film be in contact with the sidewall insulating films. Further, it is preferable that the first conductive film be thinner than the second conductive film.

It is preferable that the insulating film be an insulating film from which oxygen is released by heat treatment. An insulating film which contains oxygen at a proportion exceeding the stoichiometric proportion is preferably used as the insulating film from which oxygen is released by heat treatment. When such an insulating film is provide in contact with an oxide semiconductor film, oxygen can be released from the insulating film to be diffused into the oxide semiconductor film in heat treatment. Thus, oxygen defects in the oxide semiconductor film can be reduced.

Examples of the insulating film from which oxygen is released by heat treatment include films of silicon oxide, silicon oxynitride, silicon nitride oxide, aluminum oxide, aluminum oxynitride, gallium oxide, hafnium oxide, yttrium oxide, and the like.

The oxide semiconductor preferable contains one or more elements selected from In, Ga, Sn, and Zn.

Here, for the oxide semiconductor, a CAAC-OS (c-axis aligned crystalline oxide semiconductor) film is preferably.

According to a structure of an embodiment of the present invention, oxygen defects contained in the oxide semiconductor film can be reduced. As a result, the threshold voltage of the transistor can be prevented from shifting in the negative direction. Further, leakage current between a source and a drain of the transistor, leakage current in the side surface of the oxide semiconductor film can be reduced. Consequently, the electrical characteristics of the transistor can be improved.

DETAILED DESCRIPTION OF THE INVENTION

Figure 1A:
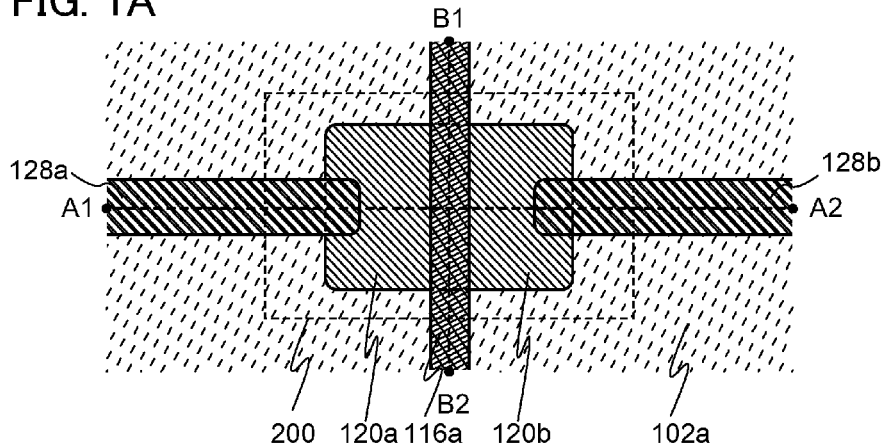
FIGS. 1A to 1C are a top view and cross-sectional views illustrating a semiconductor device according to an embodiment of the present invention.

Embodiments of the present invention will be described in detail with reference to the accompanying drawings. However, the present invention is not limited to the description below, and those skilled in the art will appreciate that a variety of modifications can be made to the modes and details without departing from the spirit and scope of the present invention.

Therefore, the present invention should not be construed as being limited to the description in the following embodiments. Note that the same portions or portions having the same function in the structure of the present invention described below are denoted by the same reference numerals in common among different drawings and repetitive description thereof will be omitted.

Note that in each drawing described in this specification, the size, the film thickness, or the region of each component is exaggerated for clarity in some cases. Therefore, embodiments of the present invention are not limited to such scales.

Note that terms such as "first", "second", and "third" in this specification are used in order to avoid confusion among components, and the terms do not limit the components numerically. Therefore, for example, the term "first" can be replaced with the term "second", "third", or the like as appropriate.

Embodiment 1

In this embodiment, structures of semiconductor devices each according to an embodiment of the present invention will be described with reference to FIGS. 1A to 1C and FIGS. 2A to 2C.

Figure 1B:
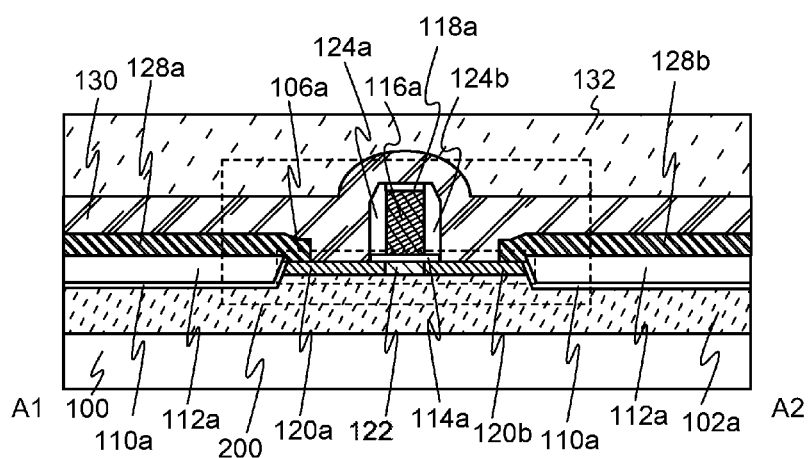
Figure 1C:
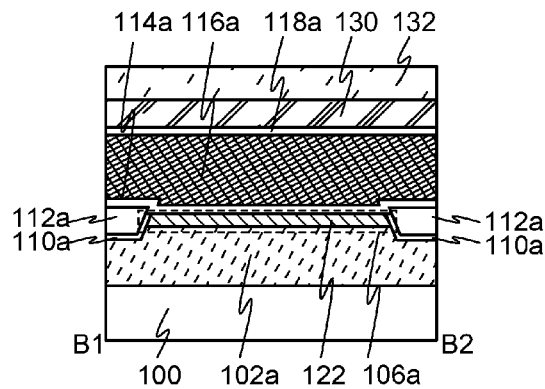

FIGS. 1A to 1C are a top view and cross-sectional views of a transistor 200. FIG. 1A is a top view of the transistor. FIG. 1B is a cross-sectional view taken along line A1-A2 in FIG. 1A. FIG. 1C is a cross-sectional view taken along line B1-B2 in FIG. 1A. Note that in FIG. 1A, some of components of the transistor 200 (e.g., a gate insulating film 114a, an insulating film 118a, sidewall insulating films 124a and 124b, an insulating film 130, an insulating film 132, and the like) are omitted for simplicity.

The transistor 200 illustrated in FIGS. 1A to 1C includes an insulating film 102a over a substrate 100; an oxide semiconductor film 106a over the insulating film 102a; the gate insulating film 114a in contact with the oxide semiconductor film 106a; a gate electrode 116a with the sidewall insulating films 124a and 124b formed over the gate insulating film 114a; and conductive films 128a and 128b formed in contact with the oxide semiconductor film 106a. Note that the conductive films 128a and 128b serve as a source electrode and a drain electrode. Further, the insulating film 118a is provided over the gate electrode 116a. Furthermore, the insulating film 130 and the insulating film 132 are provided to cover the transistor 200.

In the transistor 200 illustrated in FIGS. 1A to 1C, the insulating film 102a, an insulating film 110a, and the gate insulating film 114a are formed in contact with the oxide semiconductor film 106a. An insulating film 112a is provided in contact with the insulating film 110a. An insulating film from which oxygen is released by heat treatment is preferably used as the insulating films in contact with the oxide semiconductor film 106a.

Note that in this specification and the like, "oxygen is released by heat treatment" means that the amount of released oxygen which is converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS).

Here, a method in which the amount of released oxygen is measured by being converted into oxygen atoms using TDS analysis will be described below.

The amount of released gas in TDS analysis is proportional to the integral value of a spectrum. Therefore, the amount of released gas can be calculated from the ratio between the integral value of spectrum of the insulating film and the reference value of a standard sample. The reference value of a standard sample refers to the ratio of the density of a predetermined atom contained in a sample to the integral value of a spectrum.

For example, the number of the released oxygen molecules ($N_{O2}$) from an insulating film can be found according to Equation 1 with the TDS analysis results of a silicon wafer containing hydrogen at a predetermined density which is the standard sample and the TDS analysis results of the insulating film. Here, all spectra having a mass number of 32 which are obtained by the TDS analysis are assumed to originate from an oxygen molecule. Methanol ($CH_3OH$), which is given as a gas having a mass number of 32, is not taken into consideration on the assumption that it is unlikely to be present. Further, an oxygen molecule including an oxygen atom having a mass number of 17 or 18 which is an isotope of an oxygen atom is also not taken into consideration because the proportion of such a molecule in the natural world is minimal.

$$N_{O2}=N_{H2}/S_{H2} \times S_{O2} \times \alpha \quad \text{(Equation 1)}$$

$N_{H2}$ is the value obtained by conversion of the number of hydrogen molecules desorbed from the standard sample into density. $S_{H2}$ is the integral value of a spectrum when the standard sample is subjected to TDS analysis. Here, the reference value of the standard sample is set to $N_{H2}/S_{H2}$. $S_{O2}$ is the integral value of a spectrum when the insulating film is subjected to TDS analysis. $\alpha$ is a coefficient which influences spectrum intensity in TDS analysis. Refer to Japanese Published Patent Application No. H6-275697 for details of Equation 1. Note that the amount of released oxygen from the above insulating film is measured with a thermal desorption spectroscopy apparatus produced by ESCO Ltd., EMD-WA1000S/W using a silicon wafer containing a hydrogen atom at $1 \times 10^{16}$ atoms/cm$^3$ as the standard sample.

Further, in the TDS analysis, oxygen is partly detected as an oxygen atom. The ratio between oxygen molecules and oxygen atoms can be calculated from the ionization rate of the oxygen molecules. Note that, since the above $\alpha$ includes the ionization rate of the oxygen molecules, the number of the released oxygen atoms can also be estimated through the evaluation of the number of the released oxygen molecules.

Note that $N_{O2}$ is the number of the released oxygen molecules. For the insulating film, the amount of released oxygen when converted into oxygen atoms is twice the number of the released oxygen molecules.

In the above structure, the insulating film from which oxygen is released by heat treatment may be oxygen-excess silicon oxide ($SiO_X(X>2)$). In the oxygen-excess silicon oxide ($SiO_X(X>2)$), the number of oxygen atoms per unit volume is more than twice the number of silicon atoms per unit volume. The number of silicon atoms and the number of oxygen atoms per unit volume are measured by Rutherford backscattering spectrometry.

In general, when oxygen defects are formed in an oxide semiconductor film, some of the oxygen defects become donors and generate electrons which are carriers, in some cases. As a result, the threshold voltage of a transistor shifts in the negative direction. In addition, when an oxygen defect is formed in a side surface of the oxide semiconductor film, resistance in the side surface is decreased and leakage current might be generated between a source electrode and a drain electrode through the side surface of the oxide semiconductor film.

Therefore, in an embodiment of the present invention, an insulating film from which oxygen is released by heat treatment is provided in contact with side surface of the oxide semiconductor film 106a. Thus, oxygen is released from the insulating film in heat treatment to be diffused (or supplied) to the oxide semiconductor film 106a, so that the oxygen deficiency in the oxide semiconductor film 106a can be compensated. Accordingly, resistance in the side surface of the oxide semiconductor film 106a can be prevented from decreasing. Thus, leakage current between the source electrode and the drain electrode can be suppressed.

Examples of the insulating film from which oxygen is released by heat treatment include films of silicon oxide, silicon oxynitride, silicon nitride oxide, aluminum oxide, aluminum oxynitride, gallium oxide, hafnium oxide, yttrium oxide, and the like.

Oxygen does not easily permeate aluminum oxide. Therefore, an aluminum oxide film is provided in the vicinity of the oxide semiconductor film 106a. As a result, oxygen released from the insulating film by heat treatment, which is provided in contact with the oxide semiconductor film 106a, is prevented from being diffused.

For example, as the insulating film 110a, an insulating film from which oxygen is released by heat treatment, typically a silicon oxide film, can be used. As the insulating film 112a, a film which oxygen does not easily permeate, typically an aluminum oxide film, can be used. As described above, an insulating film from which oxygen is released by heat treatment is used as the insulating film 110a in contact with the oxide semiconductor film 106a, whereby oxygen can be diffused (or supplied) to the oxide semiconductor film 106a. A film which oxygen does not easily permeate is used as the insulating film 112a in contact with the insulating film 110a, whereby oxygen is prevented from being released to the outside from the insulating film 110a and the oxide semiconductor film 106a.

Further, the insulating film 110a is provided on the side surfaces of the oxide semiconductor film 106a, so that the source electrode and the drain electrode are not in contact with the side surfaces of the oxide semiconductor film 106a. Accordingly, leakage current generated between the source electrode and the drain electrode through the side surfaces of the oxide semiconductor film 106a can be further prevented.

As the gate insulating film 114a, an insulating film from which oxygen is released by heat treatment, typically a silicon oxide film, can be used. Thus, oxygen is diffused (or supplied) to the oxide semiconductor film 106a to compensate oxygen defects in the oxide semiconductor film 106a. Accordingly, the interface state between the gate insulating film 114a and the oxide semiconductor film 106a can be reduced, and charges which might be generated due to operation of the transistor or the like can be prevented from being trapped by the interface between the gate insulating film 114a and the oxide semiconductor film 106a, or the like. Thus, the threshold voltage can be prevented from shifting in the negative direction and degradation of electrical characteristics of the transistor can be prevented.

A metal oxide containing at least one element selected from In, Ga, Sn, and Zn is used for the oxide semiconductor film 106a. Typically, a four-component metal oxide such as an In—Sn—Ga—Zn—O-based metal oxide; a three-component metal oxide such as an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, or a Sn—Al—Zn—O-based metal oxide; a two-component metal oxide such as an In—Zn—O—based metal oxide or a Sn—Zn—O-based metal oxide; or ZnO, SnO, or InO can be used. Moreover, silicon oxide may be included in the above described metal oxides.

Here, for example, an In—Ga—Zn—O-based material means an oxide including indium (In), gallium (Ga), and zinc (Zn), and there is no particular limitation on the composition ratio. An element other than indium, gallium, and zinc may also be included. At this time, the amount of oxygen is preferably in excess of stoichiometric proportion in the oxide semiconductor film. When the amount of oxygen is in excess of stoichiometric proportion, generation of carriers which results from oxygen defects in the oxide semiconductor film can be suppressed.

Note that a metal oxide which is used as the oxide semiconductor film 106a has an energy gap of 2 eV or more, preferably 2.5 eV or more, further preferably 3 eV or more. In this manner, the off-state current of the transistor can be reduced by using a metal oxide having a wide energy gap for the oxide semiconductor film 106a.

The oxide semiconductor film 106a is in a single crystal state, a polycrystalline (also referred to as polycrystal) state, an amorphous state, or the like.

The oxide semiconductor film 106a is preferably a CAAC-OS (c-axis aligned crystalline oxide semiconductor) film.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

The oxide semiconductor film 106a may contain nitrogen at a concentration of lower than or equal to $5\times10^{18}$ atoms/cm$^3$.

The concentration of an alkali metal or an alkaline earth metal in the oxide semiconductor film 106a is preferably lower than or equal to $1\times10^{18}$ atoms/cm$^3$, more preferably lower than or equal to $2\times10^{16}$ atoms/cm$^3$. When an alkali metal or an alkaline earth metal is bonded with an oxide semiconductor, carriers are generated in some cases, which cause an increase in off-state current of the transistor.

Further, the concentration of hydrogen in the oxide semiconductor film 106a is preferably lower than $5\times10^{18}$ atoms/cm$^3$, more preferably lower than or equal to $1\times10^{18}$ atoms/cm$^3$, still more preferably lower than or equal to $5\times10^{17}$ atoms/cm$^3$, further more preferably lower than or equal to $1\times10^{16}$ atoms/cm$^3$. By a bond of an oxide semiconductor and hydrogen, part of contained hydrogen serves as a donor to generate electrons as carriers. Therefore, it is preferable to reduce the concentration of hydrogen in the oxide semiconductor film. The concentration of hydrogen in the oxide semiconductor film is reduced, whereby the threshold voltage of the transistor can be prevented from shifting in the negative direction.

The oxide semiconductor film 106a includes a channel formation region 122 and regions 120a and 120b containing a dopant between which the channel formation region 122 is sandwiched. The regions 120a and 120b containing the dopant serve as a source region and a drain region. The regions 120a and 120b containing the dopant contain, as a dopant, at least one of hydrogen, helium, neon, argon, krypton, xenon, a Group 15 element such as nitrogen, phosphorus, or arsenic, and a Group 13 element such as boron or aluminum.

In the oxide semiconductor film 106a, the dopant concentration in the regions 120a and 120b containing the dopant is higher than or equal to $5\times10^{18}$ atoms/cm$^3$ and lower than or equal to $1\times10^{22}$ atoms/cm$^3$, preferably higher than or equal to $5\times10^{18}$ atoms/cm$^3$ and lower than $5\times10^{19}$ atoms/cm$^3$.

Further, in the oxide semiconductor film 106a, the regions 120a and 120b contain the dopant, so that the carrier density or defects are increased. Therefore, the conductivity of the regions 120a and 120b containing the dopant can be higher than that of the region which does not contain a dopant (i.e., the channel formation region 122). Note that an excessive increase in the dopant concentration causes inhibition of carrier movement by the dopant, which leads to lower conductivity of the regions 120a and 120b containing the dopant.

The conductivity of the regions 120a and 120b containing the dopant is preferably higher than or equal to $1\times10^6$ ohms/square and lower than or equal to $1\times10^8$ ohms/square.

The existence of the regions 120a and 120b containing the dopant in the oxide semiconductor film 106a can relax an electric field applied to an end portion of the channel formation region 122. Therefore, a short-channel effect of the transistor can be suppressed.

In the transistor 200 illustrated in FIGS. 1A to 1C, the insulating film 110a is provided in contact with the side surfaces of the oxide semiconductor film 106a. With such a structure, the source electrode and the drain electrode are not in contact with the side surfaces of the oxide semiconductor film 106a, so that leakage current generated between the source electrode and the drain electrode, which is due to a decrease in the resistance of the side surfaces of the oxide semiconductor film 106a, can be suppressed. Further, the source electrode and the drain electrode do not overlap with the gate electrode 116a, so that parasitic capacitance generated between the source electrode and the gate electrode 116a and between the drain electrode and the gate electrode 116a can be reduced. Thus, high-speed operation of the transistor can be achieved. Furthermore, the hydrogen concentration of the channel formation region in the oxide semiconductor film 106a can be reduced, whereby off-state current of the transistor can be extremely small. For example, the off-state current at room temperature (25° C.) can be smaller than or equal to 10 zA (1 zA (zeptoampere) is $1\times10^{-21}$ A). Thus, electrical characteristics of the transistor 200 can be improved.

Although the conductive films 128a and 128b are not in contact with the sidewall insulating films 124a and 124b, respectively, in FIGS. 1A to 1C, the conductive films 128a and 128b may be in contact with the sidewall insulating films 124a and 124b, respectively.

Next, a transistor 210, which has a partly different structure from the transistor 200 illustrated in FIGS. 1A to 1C, will be described with reference to FIGS. 2A to 2C.

Figure 2A:
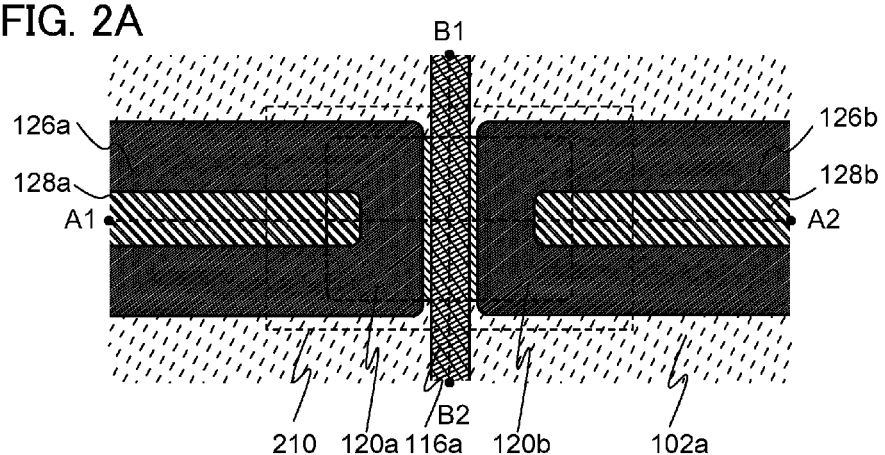
FIGS. 2A to 2C are a top view and cross-sectional views illustrating a semiconductor device according to an embodiment of the present invention.
Figure 2B:
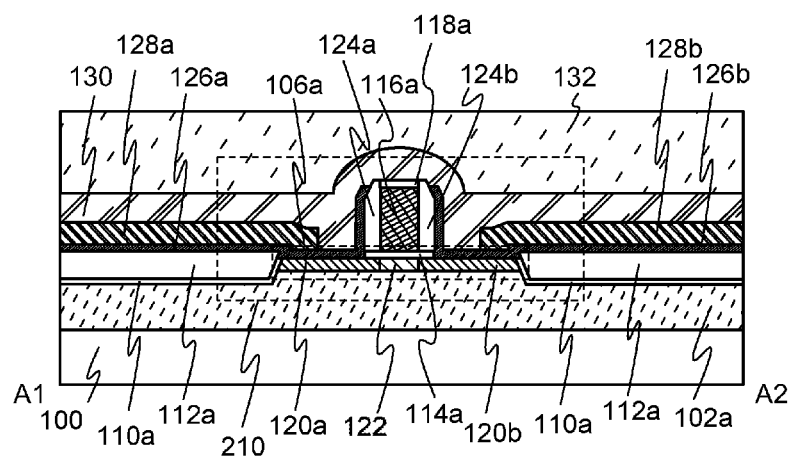
Figure 2C:
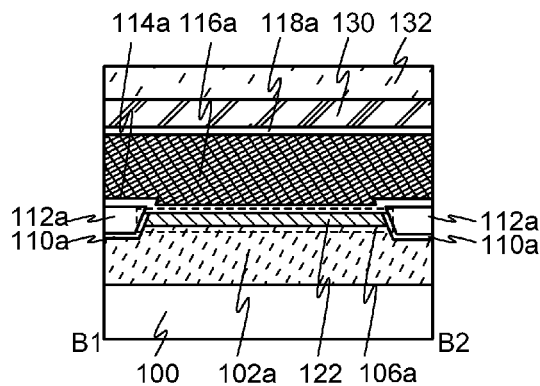

FIGS. 2A to 2C are a top view and cross-sectional views of the transistor 210. FIG. 2A is a top view of the transistor 210. FIG. 2B is a cross-sectional view taken along line A1-A2 in FIG. 2A. FIG. 2C is a cross-sectional view taken along line B1-B2 in FIG. 2A. Note that in FIG. 2A, some of components of the transistor 210 (e.g., the gate insulating film 114a, the insulating film 118a, the sidewall insulating films 124a and 124b, the insulating film 130, the insulating film 132, and the like) are omitted for simplicity.

The transistor 210 illustrated in FIGS. 2A to 2C includes the insulating film 102a over the substrate 100; the oxide semiconductor film 106a over the insulating film 102a; the gate insulating film 114a in contact with the oxide semiconductor film 106a; the gate electrode 116a with the sidewall insulating films 124a and 124b formed over the gate insulating film 114a; and conductive films 126a and 126b in contact with the sidewall insulating films 124a and 124b and the oxide semiconductor film 106a. In addition, the conductive film 128a is formed over the conductive film 126a, and the conductive film 128b is formed over the conductive film 126b. Note that the conductive films 126a and 126b may serve as a source electrode and a drain electrode; alternatively, the conductive films 126a and 128a and the conductive films 126b and 128b may serve as the source electrode and the drain electrode. Further, the insulating film 118a is provided over the gate electrode 116a. Furthermore, the insulating film 130 and the insulating film 132 are provided to cover the transistor 210.

In the transistor 210 illustrated in FIGS. 2A to 2C, the insulating film 102a, the insulating film 110a, and the gate insulating film 114a are formed in contact with the oxide semiconductor film 106a. The insulating film 112a is provided in contact with the insulating film 110a. An insulating film from which oxygen is released by heat treatment is preferably used as the insulating films in contact with the oxide semiconductor film 106a.

The transistor 210 illustrated in FIGS. 2A to 2C includes the conductive films 126a and 126b which are provided in contact with the sidewall insulating films 124a and 124b and the oxide semiconductor film 106a, which is different from the transistor 200 illustrated in FIGS. 1A to 1C. It is preferable that the conductive films 126a and 126b be thinner than the conductive films 128a and 128b.

In the case where the conductive films 126a and 126b serving as the source electrode and the drain electrode are provided in contact with the sidewall insulating films 124a and 124b, a surface of the oxide semiconductor film 106a can be surely covered with the conductive films 126a and 126b even when mask misalignment occurs in the manufacturing process of the transistor. Further, variation in electrical characteristics of transistors due to mask misalignment can be suppressed. Furthermore, the oxide semiconductor film 106a is not exposed to an etching gas in formation of the source electrode and the drain electrode, which is preferable.

In this embodiment, the transistor in which a region between the source electrode and the drain electrode has a rectangular shape in a top view is described; however, one of the source electrode and the drain electrode may have an U shape, a C shape, or the like in a top view as appropriate. A channel width of a transistor having such a shape can be increased, leading to an increase in on-state current.

Embodiment 2

In this embodiment, methods for manufacturing the transistors illustrated in FIGS. 1A to 1C and FIGS. 2A to 2C will be described with reference to FIGS. 3A to 3E, FIGS. 4A to 4D, FIGS. 5A to 5C, FIGS. 6A to 6C, and FIGS. 7A to 7D.

First, the method for manufacturing the transistor 200 illustrated in FIGS. 1A to 1C will be described below with reference to FIGS. 3A to 3E, FIGS. 4A to 4D, FIGS. 5A to 5C, and FIGS. 6A to 6C.

Figure 3A:
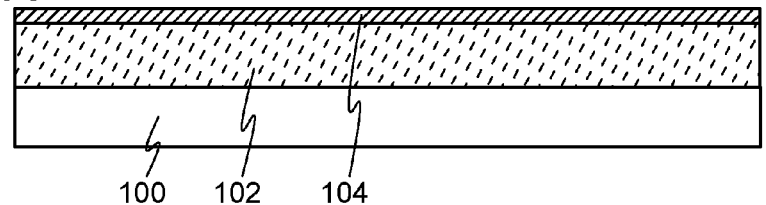
FIGS. 3A to 3E are cross-sectional views illustrating a method for manufacturing a semiconductor device according to an embodiment of the present invention.

First, an insulating film 102 is formed over the substrate 100, and then, an oxide semiconductor film 104 is formed over the insulating film 102 (see FIG. 3A).

There is no particular limitation on a material and the like of the substrate 100 as long as the material has heat resistance high enough to withstand at least heat treatment to be performed later. For example, a glass substrate, a ceramic substrate, a quartz substrate, a sapphire substrate, or the like may be used as the substrate 100. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 100. Still alternatively, any of these substrates further provided with a semiconductor element may be used as the substrate 100.

A flexible substrate may alternatively be used as the substrate 100. A separation layer may be provided between the substrate 100 and the insulating film 102. The separation layer can be used when part or the whole of a semiconductor device formed over the separation layer is separated from the substrate 100 and transferred onto another substrate. In such a case, the semiconductor device can be transferred to a substrate having low heat resistance or a flexible substrate as well.

The insulating film 102 is formed by a sputtering method, a CVD method, or the like. The insulating film 102 is preferably an insulating film from which oxygen is released by heat treatment. The insulating film from which oxygen is released by heat treatment is preferably an insulating film which contains oxygen at a proportion exceeding the stoichiometric proportion. When the insulating film from which oxygen is released by heat treatment is subjected to heat treatment, oxygen is released and the released oxygen can be diffused (or supplied) to an oxide semiconductor film to be formed later. Silicon oxide, silicon oxynitride, silicon nitride oxide, aluminum oxide, aluminum oxynitride, gallium oxide, hafnium oxide, yttrium oxide, or the like can be used for the insulating film 102, for example. The insulating film 102 formed by a sputtering method can easily release oxygen by heat treatment, which is preferable.

The thickness of the insulating film 102 is greater than or equal to 50 nm and less than or equal to 800 nm, preferably greater than or equal to 200 nm and less than or equal to 500 nm With the use of the thick insulating film 102, the amount of oxygen released from the insulating film 102 can be increased, and the interface state at the interface between the insulating film 102 and an oxide semiconductor film to be formed later can be reduced.

The insulating film 102 may have a single-layer structure or a stacked-layer structure. For example, the insulating film 102 may be a single layer of a silicon oxide film or a stacked layer of a silicon oxide film and one of an aluminum oxide film and a silicon nitride oxide film. An aluminum oxide film and a silicon nitride oxide film can each serve as a blocking film. Accordingly, an impurity contained in the substrate 100 can be blocked by the aluminum oxide film and the silicon nitride oxide film, so that the impurity can be prevented from entering an oxide semiconductor film to be formed later. In this embodiment, the case where a silicon oxide film is used as the insulating film 102 is described.

In the case of forming the insulating film 102 by a sputtering method, an oxygen gas, a mixed gas of oxygen and a rare gas, or the like can be used as a deposition gas. Further, when the amount of oxygen in the deposition gas is large, the amount of oxygen contained in the insulating film 102 can be increased, which is preferable. Typically, the oxygen concentration of the deposition gas is preferably higher than or equal to 6% and lower than or equal to 100%.

In the case where a silicon oxide film is formed as the insulating film 102, an RF sputtering method is preferably used under the following conditions: quartz (preferably synthetic quartz) is used as a target; the substrate temperature is higher than or equal to 30° C. and lower than or equal to 450° C. (preferably higher than or equal to 70° C. and lower than or equal to 200° C.); the distance between the substrate and the target (the T-S distance) is greater than or equal to 20 mm and less than or equal to 400 mm (preferably greater than or equal to 40 mm and less than or equal to 200 mm); the pressure is higher than or equal to 0.1 Pa and lower than or equal to 4 Pa (preferably higher than or equal to 0.2 Pa and lower than or equal to 1.2 Pa); the high-frequency power is higher than or equal to 0.5 kW and lower than or equal to 12 kW (preferably higher than or equal to 1 kW and lower than or equal to 5 kW); and the proportion of $O_2/(O_2+Ar)$ in the deposition gas is higher than or equal to 1% and lower than or equal to 100% (preferably higher than or equal to 6% and lower than or equal to 100%). Note that a silicon target may be used as the target instead of the quartz (preferably synthetic quartz) target. In addition, oxygen alone may be used as the deposition gas.

The oxide semiconductor film 104 can be formed by a sputtering method, a coating method, a printing method, a pulsed laser deposition method, or the like. Here, the oxide semiconductor film 104 is formed by a sputtering method to a thickness of greater than or equal to 1 nm and less than or equal to 50 nm, preferable greater than or equal to 3 nm and less than or equal to 30 nm.

Next, a sputtering apparatus used for forming the oxide semiconductor film 104 is described in detail.

The leakage rate of a deposition chamber used for forming the oxide semiconductor film 104 is preferably lower than or equal to $1\times10^{-10}$ Pa·m$^3$/second.

Thus, entry of an impurity including hydrogen into a film to be formed by a sputtering method can be decreased.

In order to decrease the leakage rate, internal leakage as well as external leakage needs to be reduced. The external leakage is due to inflow of gas from the outside of a vacuum system through a minute hole, a sealing defect, or the like. The internal leakage is due to leakage through a partition, such as a valve, in a vacuum system or due to released gas from an internal member. Measures need to be taken from both aspects of external leakage and internal leakage in order that the leakage rate be lower than or equal to $1 \times 10^{-10}$ Pa·m$^3$/second.

In order to reduce external leakage, an open/close portion of the deposition chamber is preferably sealed with a metal gasket. For the metal gasket, a metal material covered with iron fluoride, aluminum oxide, or chromium oxide is preferably used. The metal gasket realizes higher adhesion than an O-ring, and can reduce the external leakage. Further, by use of a passive metal such as iron covered with iron fluoride, aluminum covered with aluminum oxide, or chromium covered with chromium oxide, released gas containing hydrogen generated from the metal gasket is suppressed, so that the internal leakage can also be reduced.

As a member forming an inner wall of the deposition chamber, aluminum, chromium, titanium, zirconium, nickel, or vanadium, from which the amount of a released gas containing hydrogen is smaller, is used. An alloy material containing iron, chromium, nickel, and the like covered with the above-mentioned material may be used. The alloy material containing iron, chromium, nickel, and the like is rigid, resistant to heat, and suitable for processing. Here, when surface unevenness of the member is decreased by polishing or the like to reduce the surface area, the released gas can be reduced. Alternatively, the above-mentioned member of the deposition apparatus may be formed using a passive metal such as iron covered with iron fluoride, aluminum covered with aluminum oxide, or chromium covered with chromium oxide.

Furthermore, it is preferable to provide a gas refiner for a sputtering gas just in front of the deposition chamber. At this time, the length of a pipe between the gas refiner and the deposition chamber is less than or equal to 5 m, preferably less than or equal to 1 m. When the length of the pipe is less than or equal to 5 m or less than or equal to 1 m, the effect of the released gas from the pipe can be reduced accordingly.

Evacuation of the deposition chamber is preferably performed with a rough vacuum pump, such as a dry pump, and a high vacuum pump, such as a sputter ion pump, a turbo molecular pump, or a cryopump, in appropriate combination. The turbo molecular pump has an outstanding capability in evacuating a large-sized molecule, whereas it has a low capability in evacuating hydrogen or water. Hence, combination of a cryopump having a high capability in evacuating water and a sputter ion pump having a high capability in evacuating hydrogen is effective.

An adsorbate present at the inner wall of the deposition chamber does not affect the pressure in the deposition chamber because it is adsorbed on the inner wall, but the adsorbate leads to release of gas at the time of the evacuation of the deposition chamber. Therefore, although the leakage rate and the evacuation rate do not have a correlation, it is important that the adsorbate present in the deposition chamber be desorbed as much as possible and evacuation be performed in advance with the use of a pump having high evacuation capability. Note that the deposition chamber may be subjected to baking for promotion of desorption of the adsorbate. By the baking, the rate of desorption of the adsorbate can be increased about tenfold. The baking should be performed at a temperature greater than or equal to 100° C. and less than or equal to 450° C. At this time, when the adsorbate is removed while an inert gas is introduced, the rate of desorption of water or the like, which is difficult to desorb only by evacuation, can be further increased.

As described above, in the process for forming the oxide semiconductor film 104 and preferably in the process for forming the insulating film 102, entry of an impurity including hydrogen is suppressed as much as possible through control of the pressure of the deposition chamber, leakage rate of the deposition chamber, and the like, whereby entry of an impurity including hydrogen to the oxide semiconductor film 104 can be reduced. In addition, diffusion of an impurity including hydrogen from the insulating film 102 to the oxide semiconductor film 104 can be reduced.

Hydrogen contained in an oxide semiconductor film reacts with oxygen bonded to a metal atom to be water, and in addition, a defect is formed in a lattice from which oxygen is detached (or a portion from which oxygen is detached). For the prevention of the foregoing, it is important to reduce defects in the oxide semiconductor film by reducing the impurity including hydrogen as much as possible in the deposition step of the oxide semiconductor film. Reliability of the transistor can be increased by thus forming a channel formation region with a purified oxide semiconductor film from which an impurity including hydrogen is removed as much as possible.

In a sputtering method, an RF power supply device, an AC power supply device, a DC power supply device, or the like can be used as appropriate as a power supply device for generating plasma.

The oxide semiconductor film 104 includes at least one element selected from In, Ga, Sn, and Zn. Such an oxide semiconductor film can be formed using a target of a four-component metal oxide such as an In—Sn—Ga—Zn—O-based metal oxide; a three-component metal oxide such as an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, or a Sn—Al—Zn—O-based metal oxide; a two-component metal oxide such as an In—Zn—O-based metal oxide or a Sn—Zn—O-based metal oxide; a Zn—O-based metal oxide or a Sn—O-based metal oxide; or the like. In addition, the oxide semiconductor film 104 may contain an element other than In, Ga, Sn, and Zn, for example, $SiO_2$.

For example, an In—Ga—Zn—O-based oxide semiconductor means an oxide semiconductor containing indium (In), gallium (Ga), and zinc (Zn), and there is no limitation on the composition ratio thereof.

In addition, as the oxide semiconductor film, a thin film of a material represented by the chemical expression, $InMO_3(ZnO)_m$ (m>0), can be used. Here, M represents one or more metal elements selected from Zn, Ga, Al, Mn, and Co. For example, M can be Ga, Ga and Al, Ga and Mn, Ga and Co, or the like.

In the case where an In—Ga—Zn—O-based material is used as the oxide semiconductor, an example of the target is a metal oxide target having a composition ratio of $In_2O_3$:$Ga_2O_3$:ZnO=1:1:1 [molar ratio]. Alternatively, a target having a composition ratio of $In_2O_3$:$Ga_2O_3$:ZnO=1:1:2 [molar ratio], a target having a composition ratio of $In_2O_3$:$Ga_2O_3$:ZnO=1:1:4 [molar ratio], or a target having a composition ratio of $In_2O_3$:$Ga_2O_3$:ZnO=2:1:8 [molar ratio] can be used.

In the case where an In—Zn—O-based material is used as an oxide semiconductor, a target therefor has a composition ratio of In:Zn=50:1 to 1:2 in an atomic ratio ($In_2O_3$:

ZnO=25:1 to 1:4 in a molar ratio), preferably, In:Zn=20:1 to 1:1 in an atomic ratio ($In_2O_3$:ZnO=10:1 to 1:2 in a molar ratio), further preferably, In:Zn=15:1 to 1.5:1 in an atomic ratio ($In_2O_3$:ZnO=15:2 to 3:4 in a molar ratio). For example, in a target used for formation of an In—Zn—O-based oxide semiconductor which has an atomic ratio of In:Zn:O=X:Y:Z, the relation of Z>1.5X+Y is satisfied.

As a sputtering gas, a rare gas (typically argon) atmosphere, an oxygen atmosphere, or a mixed gas of a rare gas and oxygen is used as appropriate. It is preferable that a high-purity gas from which an impurity including hydrogen is removed be used as a sputtering gas.

Note that it is preferable that the insulating film 102 and the oxide semiconductor film 104 be successively formed. When the oxide semiconductor film 104 is formed without being exposed to air after formation of the insulating film 102, attachment of hydrogen to the interface between the insulating film 102 and the oxide semiconductor film 104 can be reduced. Alternatively, in a multi-chamber sputtering apparatus with a heating apparatus, the insulating film 102 may be formed, the insulating film 102 may be heated by the heating apparatus to release hydrogen, and then the oxide semiconductor film 104 may be formed over the insulating film 102.

Figure 3B:
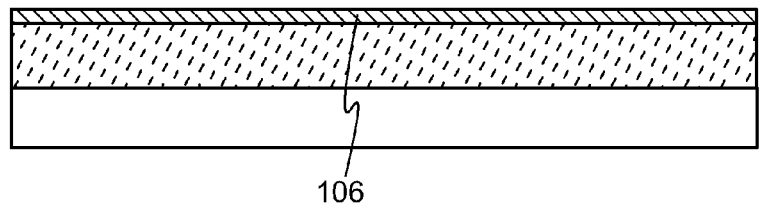

Next, the substrate 100 is subjected to heat treatment, so that hydrogen is released from the oxide semiconductor film 104 and oxygen contained in the insulating film 102 is diffused to the oxide semiconductor film 104 and the vicinity of the interface between the insulating film 102 and the oxide semiconductor film 104. As a result, as illustrated in FIG. 3B, an oxide semiconductor film 106 in which the hydrogen concentration and the oxygen defects are reduced can be formed.

The temperature of the heat treatment is preferably a temperature at which hydrogen is released from the oxide semiconductor film 104 and oxygen contained in the insulating film 102 is released and diffused to the oxide semiconductor film 104. The temperature is, for example, higher than or equal to 150° C. and lower than the strain point of the substrate, preferably higher than or equal to 250° C. and lower than or equal to 450° C., more preferably higher than or equal to 300° C. and lower than or equal to 450° C.

A rapid thermal annealing (RTA) apparatus can be used in the heat treatment. With the use of the RTA apparatus, the heat treatment can be performed at a temperature higher than or equal to the strain point of the substrate 100 if the heating time is short. Therefore, time to release hydrogen from the oxide semiconductor film 104 and to diffuse oxygen from the insulating film 102 to the oxide semiconductor film 104 can be shortened.

The heat treatment can be performed in an inert gas atmosphere; for example, the heat treatment is preferably performed in a rare gas (such as helium, neon, argon, xenon, or krypton) atmosphere or a nitrogen atmosphere. Alternatively, the heat treatment may be performed in an oxygen atmosphere or a reduced-pressure atmosphere. The treatment time is from three minutes to 24 hours.

Oxygen defects in the oxide semiconductor film serve as donors to generate electrons as carriers. When heat treatment is performed while the oxide semiconductor film 104 covers the insulating film 102, oxygen contained in the insulating film 102 is diffused to the oxide semiconductor film 104, so that the oxygen defects in the oxide semiconductor film 106 can be reduced. Further, the insulating film 102 is covered with the oxide semiconductor film 104 and a surface of the insulating film 102 is not exposed, so that oxygen released from the insulating film 102 can be efficiently diffused to the oxide semiconductor film 104. Accordingly, the oxygen defects in the oxide semiconductor film and the interface state between the insulating film 102 and the oxide semiconductor film 106 can be reduced.

Further, in the deposition step of the oxide semiconductor film 104, entry of an impurity including hydrogen is suppressed as much as possible through control of the pressure of the deposition chamber, leakage rate of the deposition chamber, and the like, whereby the impurity including hydrogen can be prevented from entering the insulating film 102 and the oxide semiconductor film 104. Furthermore, the impurity including hydrogen can be prevented from diffusing from the insulating film 102 to the oxide semiconductor film 104. Moreover, the hydrogen concentration in the oxide semiconductor film 104 can be reduced by the heat treatment. By a bond with hydrogen in an oxide semiconductor, part of hydrogen serves as a donor to generate electrons as carriers. Therefore, the impurities, typically hydrogen, are reduced as much as possible in the deposition step of the oxide semiconductor film 104 and in the following heat treatment, whereby defects in the oxide semiconductor film can be reduced.

Figure 3C:
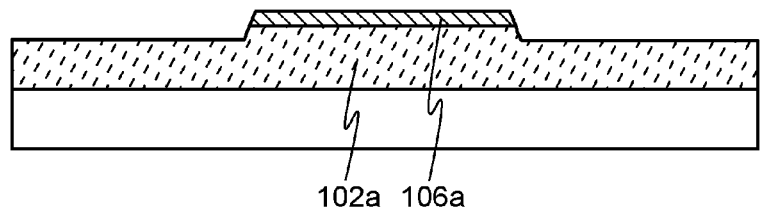

Next, after formation of a mask over the oxide semiconductor film 106, the oxide semiconductor film 104 is selectively etched with the use of the mask to form the island-shaped oxide semiconductor film 106a and the insulating film 102a (see FIG. 3C).

The mask used in etching of the oxide semiconductor film 106 and the insulating film 102 can be formed as appropriate by a photolithography process, an inkjet method, a printing method, or the like. Wet etching or dry etching can be used in etching of the oxide semiconductor film 106 and wet etching and dry etching may be used in combination. At this time, etching is preferably performed so that an end portion of the oxide semiconductor film 106a has a tapered shape. In the case of using a photolithography process, the tapered shape can be obtained by etching while removing the resist mask.

As an etchant used for wet etching, a mixed solution of phosphoric acid, acetic acid, and nitric acid, or the like can be used.

As an etching gas used for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr); methane ($CH_4$); oxygen ($O_2$); any of these gases to which a rare gas such as helium (He) or argon (Ar) is added; or the like can be used.

As a dry etching method, a parallel plate reactive ion etching (RIE) method, an inductively coupled plasma (ICP) etching method, or the like can be used. In order to process the film into a desired shape, the etching conditions (the amount of electric power applied to a coil-shaped electrode, the amount of electric power applied to an electrode on a substrate side, the temperature of the electrode on the substrate side, or the like) are adjusted as appropriate.

For example, dry etching is performed under the following conditions: ICP is 45 W; bias is 100 W; the pressure is 1.9 Pa; the etching gas is a mixed gas of $BCl_3$ and $Cl_2$; and the flow rate of $BCl_3$ is 60 sccm and the flow rate of $Cl_2$ is 20 sccm. When dry etching is performed under such conditions, the insulating film 102 can be selectively removed to form the insulating film 102a after the oxide semiconductor film 106 is formed into an island shape. It is preferable that impurities including hydrogen not be included in the etching.

Although the depth to which the insulating film 102 is removed depends on the thickness of the insulating film 102, the insulating film 102 is preferably removed by 100 nm in depth in the case where the thickness of the insulating film 102 is 450 nm, for example.

After that, the mask is removed. Note that when a stripping solution is used for removing the mask, oxygen may be released from a side surface of the oxide semiconductor film 106a in some cases. Therefore, an ashing method may alternatively be used for removing the mask.

When an oxide semiconductor film is selectively etched, for example when a side surface of an oxide semiconductor film is exposed to plasma including chlorine radicals, fluorine radicals, or the like in dry etching, metal atoms exposed on the side surface of the oxide semiconductor film are bonded with the chlorine radicals, the fluorine radicals, or the like. At this time, the bonds of the metal atoms and the chlorine atoms or the fluorine atoms are released and consequently oxygen atoms which had been bonded with the metal atoms in the oxide semiconductor film become active. The active oxygen atoms are easily reacted and desorbed. Thus, oxygen defects are likely to be generated on the side surface of the oxide semiconductor film.

When the side surface of the oxide semiconductor film exposed in the etching process is active, oxygen is extracted in a reduced-pressure atmosphere or a reducing atmosphere, or in heat treatment in a reduced-pressure atmosphere, and oxygen defects are generated in the side surface of the oxide semiconductor film. Part of the oxygen defects becomes a donor and generates an electron which is a carrier, so that the side surface of the oxide semiconductor film has an n-type conductivity.

The source electrode and the drain electrode of the transistor are in contact with the side surface of the oxide semiconductor film having the n-type conductivity, so that leakage current is generated between the source electrode and the drain electrode through the side surface of the oxide semiconductor film. The leakage current increases the off-state current of the transistor. Further, there is a possibility that current flowing through the side surface of the oxide semiconductor film causes formation of a transistor in which the side surface of the oxide semiconductor film is a channel region.

Figure 3D:
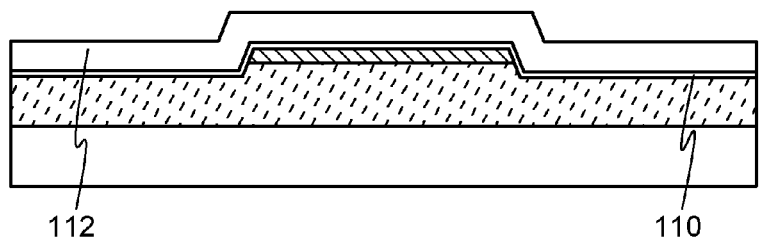

Therefore, next, an insulating film 110 and an insulating film 112 are formed over the insulating film 102a and the oxide semiconductor film 106a (see FIG. 3D). As in the insulating film 102, each of the insulating film 110 and the insulating film 112 is preferably formed using an insulating film from which oxygen is released by heat treatment. Further, the insulating film 110 and the insulating film 112 can be formed by a deposition method similar to the deposition method of the insulating film 102 as appropriate. It is preferable that the insulating film 110 and the insulating film 112 be formed at temperature as low as possible, preferably at room temperature, in order to reduce the amount of oxygen released from the side surfaces of the oxide semiconductor film 106a when the insulating film 110 and the insulating film 112 are formed.

For example, silicon oxide can be used for the insulating film 110, and aluminum oxide can be used for the insulating film 112. Alternatively, aluminum oxide may be used for the insulating film 110, and silicon oxide may be used for the insulating film 112. Note that a stacked-layer structure including the insulating film 110 and the insulating film 112 is described in this embodiment; however, an embodiment of the present invention is not limited thereto and a single-layer structure of the insulating film 110 or the insulating film 112 may be employed.

When the insulating film 110 from which oxygen is released by heating is provided in contact with the side surfaces of the oxide semiconductor film 106a, even when oxygen defects might be generated in the side surface of the oxide semiconductor film 106a, oxygen can be supplied to the surface of the oxide semiconductor film 106a, which is in contact with the insulating film 110, and the oxide semiconductor film 106a in the vicinity thereof by release of oxygen contained in the insulating film 110 by heat treatment. Thus, oxygen defects in the surface of the oxide semiconductor film 106a, which is in contact with the insulating film, typically the side surfaces of the oxide semiconductor film 106a, can be reduced.

Figure 3E:
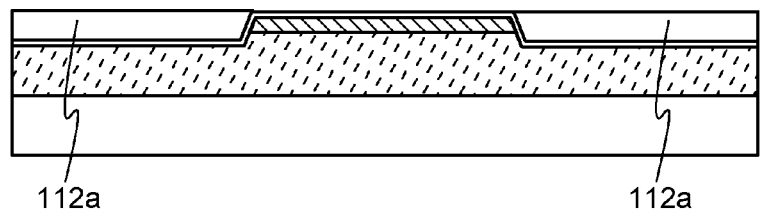

Next, the insulating film 112 is subjected to planarization treatment to form the insulating film 112a (see FIG. 3E). The planarization treatment can be performed by polishing treatment such as a chemical mechanical polishing (CMP) method, etching treatment such as dry etching or wet etching, or a combination of polishing treatment and etching treatment. Here, the case where the insulating film 112 is subjected to CMP treatment as the planarization treatment is described. The planarization treatment is performed on the insulating film 112 until the insulating film 110 is exposed or the surface of the insulating film 112 is level with the surface of the insulating film 110. Since the oxide semiconductor film 106a is as thin as several nanometers to several tens of nanometers, it is preferable that the oxide semiconductor film 106a not be removed by the planarization treatment.

For example, the insulating film 112 is subjected to CMP treatment under the following conditions: a polyurethane polishing cloth is used; silica slurry (a grain size of 60 nm) is used as a chemical solution supplied as slurry; the slurry flow rate is greater than or equal to 100 ml/min and less than or equal to 500 ml/min; the polishing pressure is higher than or equal to 0.005 MPa and lower than or equal to 0.08 MPa; the spindle rotation speed is greater than or equal to 20 rpm and less than or equal to 50 rpm; the table rotation speed is greater than or equal to 20 rpm and less than or equal to 50 rpm; and the treatment time is 0.2 minutes.

Next, the exposed portion of the insulating film 110 is removed, so that the surface of the oxide semiconductor film 106a is exposed. Thus, the insulating films 110a is formed (see FIG. 4A). The insulating film 110 is removed by etching treatment. Note that the etching condition where a selectivity ratio of the insulating film 110 with respect to the oxide semiconductor film 106a is high needs to be employed. The surface of the oxide semiconductor film 106a is planarized after the exposed portion of the insulating film 110 is removed, so that electrical characteristics of the transistor can be improved.

Dry etching is performed under the following conditions: ICP is 500 W; bias is 50 W; the pressure is 1.5 Pa; the etching gas is a mixed gas of $CF_4$ and $O_2$; and the flow rate of $CF_4$ is 70 sccm and the flow rate of $O_2$ is 30 sccm. When the dry etching is performed under such conditions, the insulating film 110 can be selectively removed to form the insulating film 110a. Further, the oxide semiconductor film 106a can be prevented from being removed. It is preferable that impurities including hydrogen not be included in the etching.

Here, heat treatment may be performed. Through the heat treatment, impurities including hydrogen in the oxide semiconductor film 106a can be removed. In addition, oxygen contained in the insulating films 102a, 110a, and 112a is released, whereby oxygen can be supplied to the surfaces of the oxide semiconductor film 106a, which are in contact with the insulating films 102a and 110a; thus, oxygen defects in the surfaces of the oxide semiconductor film 106a, which are in contact with insulating films, can be reduced.

Figure 4A:
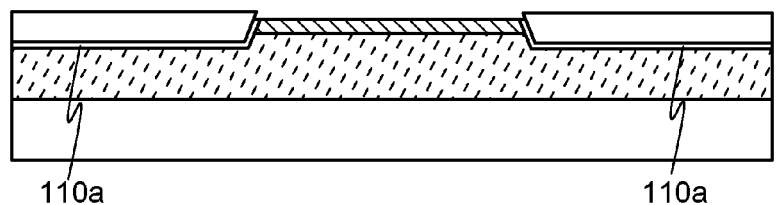
FIGS. 4A to 4D are cross-sectional views illustrating a method for manufacturing a semiconductor device according to an embodiment of the present invention.
Figure 4B:
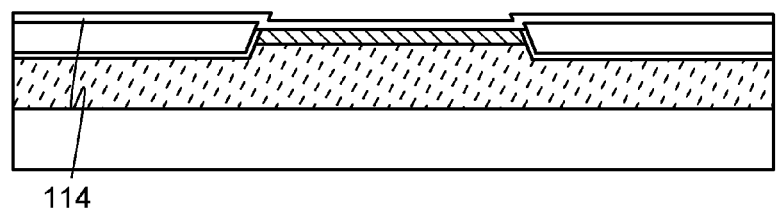

Next, an insulating film 114 is formed over the oxide semiconductor film 106a and the insulating film 112a (see FIG. 4B). The insulating film 114 is preferably formed using an insulating film from which oxygen is released by heat treatment, as in the insulating film 102. Alternatively, the insulating film 114 is formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide, so that gate leakage current can be reduced.

The insulating film 114 can be formed by a deposition method similar to the deposition method of the insulating film 102 as appropriate. The thickness of the insulating film 114 is preferably greater than or equal to 1 nm and less than or equal to 300 nm, more preferably greater than or equal to 5 nm and less than or equal to 50 nm. It is preferable that the insulating film 114 be formed at temperature as low as possible, preferably at room temperature, in order to reduce the amount of oxygen released from the surface of the oxide semiconductor film 106a when the insulating film 114 is formed.

Figure 4C:
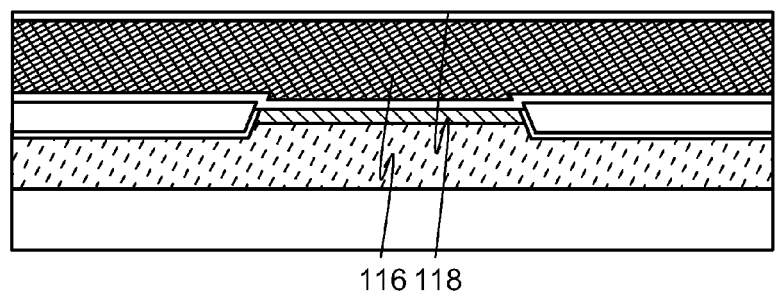

Next, an insulating film 118 is formed after the conductive film 116 is formed (see FIG. 4C). The conductive film 116 is formed by a sputtering method, a CVD method, an evaporation method, or the like. The conductive film 116 can be formed using a metal element selected from aluminum, chromium, copper, tantalum, titanium, molybdenum, and tungsten, an alloy containing any of these metal elements as a component, an alloy containing any of these metal elements in combination, or the like. Further, one or more metal elements selected from manganese or zirconium may be used.

In addition, the conductive film 116 may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, a three-layer structure in which a titanium film, an aluminum film, and a titanium film are stacked in this order, and the like can be given. Alternatively, a film, an alloy film, or a nitride film which contains aluminum and one or more elements selected from titanium, tantalum, tungsten, molybdenum, chromium, neodymium, and scandium may be used.

Alternatively, as the conductive film 116, a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added, can be used. It is also possible to have a stacked-layer structure formed using the above light-transmitting conductive material and the above metal element.

As a material film in contact with the gate insulating film 114, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a film of a metal nitride (such as InN or ZnN) is preferably provided between the insulating film 114 and the insulating film 116. These films each have a work function of 5 eV or higher, preferably 5.5 eV or higher; thus, the threshold voltage of the electrical characteristics of the transistor can be positive. Accordingly, a so-called normally-off switching element can be obtained. For example, in the case of using an In—Ga—Zn—O film containing nitrogen, an In—Ga—Zn—O film having a nitrogen concentration higher than at least the oxide semiconductor film 106a, specifically, an In—Ga—Zn—O film having a nitrogen concentration of 7 at. % or higher is used.

The insulating film 118 can be formed using a material and a deposition method similar to those of the insulating film 102. The thickness of the insulating film 118 is greater than or equal to 10 nm and less than or equal to 150 nm In this embodiment, a silicon oxynitride film is formed as the insulating film 118.

Figure 4D:
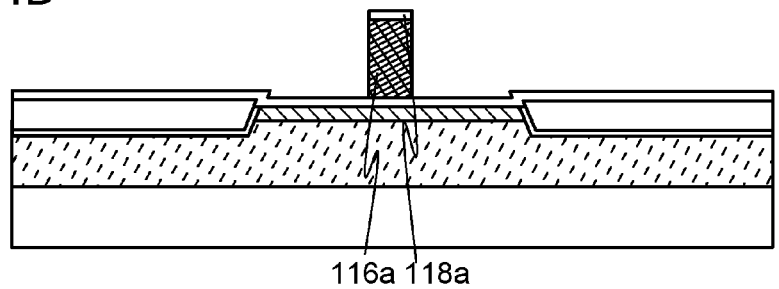

Next, a mask is formed over the insulating film 118, and the conductive film 116 and the insulating film 118 are etched to form the gate electrode 116a and the insulating film 118a (see FIG. 4D). The mask formed over the insulating film 118 can be formed by a printing method, an inkjet method, or a photolithography method as appropriate. The mask is removed after the gate electrode 116a and the insulating film 118a are formed. With the insulating film 118a, a short circuit between the gate electrode 116a and the source and drain electrodes to be formed later can be prevented.

Wet etching or dry etching can be used in etching of the conductive film 116 and the insulating film 118 and wet etching and dry etching may be used in combination. The etching conditions (e.g., an etching gas or an etchant, etching time, and temperature) are set as appropriate in accordance with the material so that the conductive film 116 and the insulating film 118 can be etched to have a desired shape. Note that, in order to process the channel length (L) of the transistor minutely, dry etching is preferably used.

As an etching gas used for dry etching of the insulating film 118, for example, a gas containing fluorine, such as sulfur hexafluoride (SF$_6$), nitrogen trifluoride (NF$_3$), or trifluoromethane (CHF$_3$), a mixed gas of carbon tetrafluoride (CF$_4$) and hydrogen, or the like can be used. A rare gas (helium (He), argon (Ar), or xenon (Xe)), carbon monoxide, carbon dioxide, or the like may be added to the etching gas used for dry etching. As an etching gas of the conductive film 116, a chloride gas such as chlorine, boron chloride, silicon chloride, or carbon tetrachloride; a fluoride gas such as carbon tetrafluoride, sulfur fluoride, or nitrogen fluoride; oxygen; or the like can be used as appropriate.

Figure 5A:
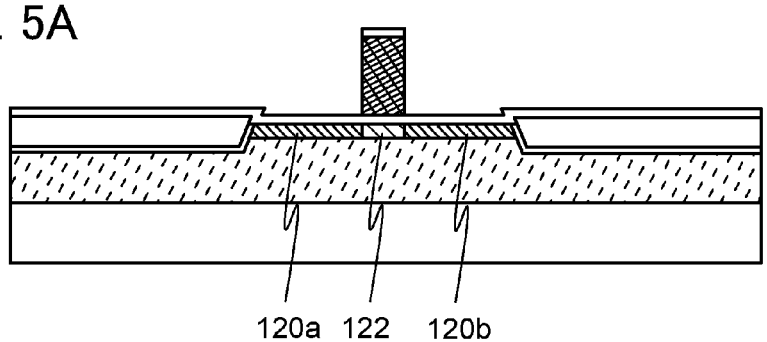
FIGS. 5A to 5C are cross-sectional views illustrating a method for manufacturing a semiconductor device according to an embodiment of the present invention.

Next, treatment for adding a dopant is performed on the oxide semiconductor film 106a, so that the regions 120a and 120b containing the dopant are formed (see FIG. 5A). The dopant is added with the use of the gate electrode 116a and the insulating film 118a as masks, whereby the regions 120a and 120b containing the dopant and a region to which the dopant is not added (the channel formation region 122) can be formed in a self-aligned manner.

The dopant can be added to the oxide semiconductor film 106a by an ion doping method, an ion implantation method, a plasma immersion ion implantation method, or the like. As the dopant to be added, at least one element selected from hydrogen, helium, neon, argon, krypton, xenon, a Group 15 element such as nitrogen, phosphorus, or arsenic, or a Group 13 element such as boron or aluminum is used. Here, since the gate electrode 116a and the insulating film 118a serve as masks, the regions 120a and 120b to which the dopant is added and the channel formation region 122 can be formed in a self-aligned manner.

Alternatively, the dopant can be added by a method other than an ion doping method, an ion implantation method, and a plasma immersion ion implantation method. For example, the dopant can be added in the following manner: plasma is generated in an atmosphere of gas containing an element to be added and plasma treatment is performed on a film to which the dopant is added. A dry etching apparatus, a plasma CVD apparatus, a high-density plasma CVD apparatus, or the like can be used to generate the plasma.

As for the condition of adding the dopant, for example, the acceleration voltage is set to 20 kV in the case where the dopant is nitrogen. In the case where the dopant is phosphorus, the acceleration voltage is set to 40 kV. Heat treatment is preferably performed at a temperature lower than 450° C. in the case where the dose of nitrogen or phosphorus is less than or equal to $1\times10^{15}$ ions/cm$^2$, though it depends on the thickness, the material, and the like of the gate insulating film 114a to be formed in a later step. Thus, the sheet resistance of the regions 120a and 120b containing the dopant can be lower than or equal to $1\times10^7$ ohms/square. In the case where the dose is greater than or equal to $5\times10^{14}$ ions/cm$^2$ and less than $5\times10^{15}$ ions/cm$^2$, the heat treatment is preferably performed at a temperature higher than or equal to 450° C. and lower than or equal to 600° C. Thus, the sheet resistance of the regions 120a and 120b containing the dopant can be lower than or equal to $1\times10^5$ ohms/square. In the case where the dose is greater than or equal to $5\times10^{15}$ ions/cm$^2$, the heat treatment is preferably performed at a temperature higher than 600° C. Thus, the sheet resistance of the regions 120a and 120b containing the dopant can be lower than or equal to $1\times10^5$ ohms/square.

The sheet resistance of the regions 120a and 120b containing the dopant is reduced, whereby the on-state current and the field-effect mobility of the transistor can be increased.

Figure 5B:
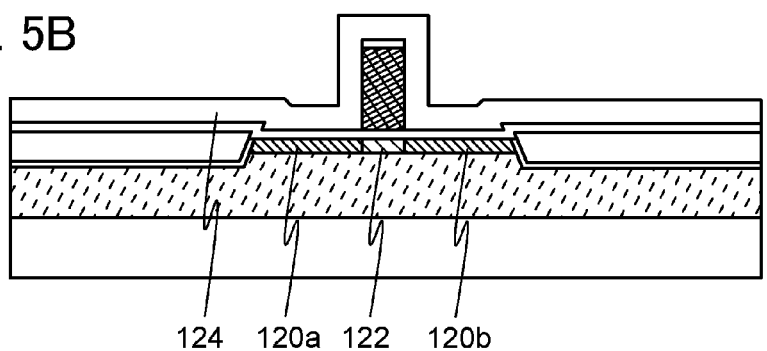

Next, an insulating film 124 is formed to cover the insulating films 112a and 112b, the oxide semiconductor film 106a, the insulating film 118a, and the like (see FIG. 5B). The insulating film 124 can be formed using a material and a deposition method similar to those of the insulating film 102. For example, a structure in which a silicon oxide film is stacked over a silicon nitride film can be employed. In this embodiment, the insulating film 124 has a single-layer structure of a silicon oxide film.

Next, heat treatment may be performed. The heat treatment is performed typically at a temperature higher than or equal to 150° C. and lower than or equal to 450° C., preferably higher than or equal to 250° C. and lower than or equal to 325° C. Alternatively, the heat treatment may be performed while the temperature is gradually increased from 250° C. to 325° C.

When the heat treatment is performed, oxygen is diffused to the oxide semiconductor film 106a from the insulating films in contact with the oxide semiconductor film 106a, so that oxygen defects in the surfaces of the oxide semiconductor film 106a, which are in contact with the insulating films, and the vicinity thereof can be reduced. Further, resistance of the regions 120a and 120b containing the dopant can be reduced. Note that the regions 120a and 120b containing the dopant may be in a crystalline state or in an amorphous state after the heat treatment.

Figure 5C:
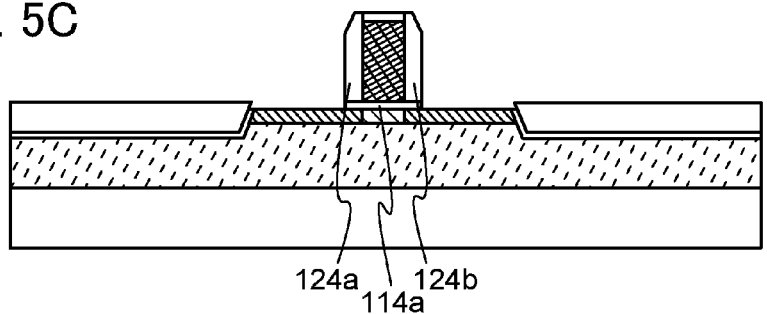

Next, the insulating film 124 is subjected to highly anisotropic etching to form the sidewall insulating films 124a and 124b (see FIG. 5C).

Figure 6A:
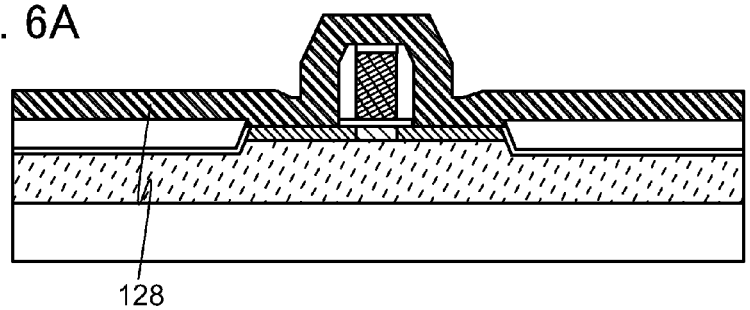
FIGS. 6A to 6C are cross-sectional views illustrating a method for manufacturing a semiconductor device according to an embodiment of the present invention.

Next, a conductive film 128 is formed (see FIG. 6A). Any of metals such as aluminum, titanium, chromium, nickel, copper, yttrium, zirconium, molybdenum, silver, tantalum, and tungsten, or an alloy containing any of the metals as its main component is used for the conductive film 128. The conductive film 128 may have a single-layer structure or a stacked-layer structure. For example, a single-layer structure of an aluminum film containing silicon, a two-layer structure in which a titanium film is formed over an aluminum film, a two-layer structure in which a titanium film is formed over a tungsten film, a two-layer structure in which a copper film is formed over a copper-magnesium-aluminum alloy film, a three-layer structure in which a titanium film, an aluminum film, and a titanium film are stacked in that order, and the like can be given. Further, as in the conductive film 116, a transparent conductive material containing indium oxide, tin oxide, or zinc oxide may be used. The case where titanium is used for the conductive film 128 is described in this embodiment.

Figure 6B:
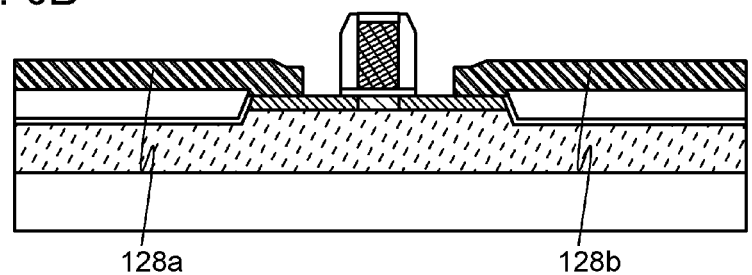

Next, a mask is formed over the conductive film 128, and the conductive film 128 is etched to form the conductive films 128a and 128b (see FIG. 6B). For the etching of the conductive film 128, either wet etching or dry etching can be used, or wet etching and dry etching may be used in combination. The etching conditions (e.g., an etching gas or an etchant, etching time, and temperature) are set as appropriate in accordance with the material so that the conductive film 128 can be etched to have a desired shape. Note that dry etching is preferably used for finely processing the transistor.

As an etching gas used for dry etching of the conductive film 128, for example, a gas containing fluorine, such as sulfur hexafluoride ($SF_6$), nitrogen trifluoride ($NF_3$), or trifluoromethane ($CHF_3$), a mixed gas of carbon tetrafluoride ($CF_4$) and hydrogen, or the like can be used. A rare gas (helium (He), argon (Ar), or xenon (Xe)), carbon monoxide, carbon dioxide, or the like may be added to the etching gas used for dry etching.

Etching in the case where titanium is used for the conductive film 128 is performed under the following conditions, for example: ICP is 450 W; bias is 100 W; the pressure is 1.9 Pa; the etching gas is a mixed gas of $BCl_3$ and $Cl_2$; and the flow rate of $BCl_3$ is 60 sccm and the flow rate of $Cl_2$ is 20 sccm. With such conditions, the conductive films 128a and 128b can be formed.

Figure 6C:
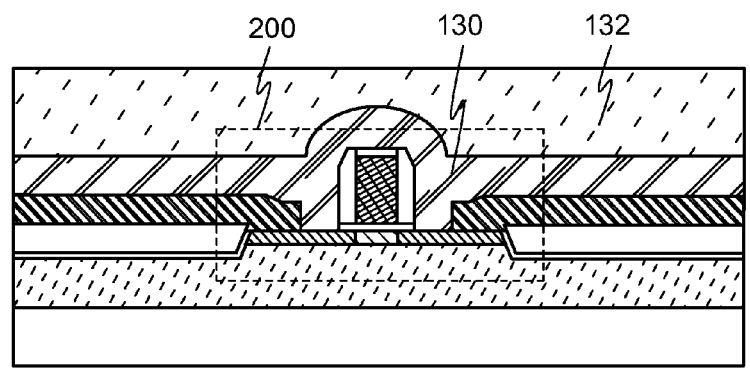

Next, the insulating film 130 is formed over the conductive films 128a and 128b and the insulating film 118a, and the insulating film 132 is formed over the insulating film 130 (see FIG. 6C). The insulating film 130 and the insulating film 132 can each be formed using a material containing an inorganic insulating material such as silicon oxide, silicon nitride oxide, silicon nitride, hafnium oxide, aluminum oxide, or tantalum oxide. Moreover, the insulating film 130 and the insulating film 132 can each be formed using an organic insulating material such as polyimide or acrylic. Here, a two-layer structure of the insulating film 130 and the insulating film 132 is employed; however, a structure of an insulating film which covers the transistor is not limited thereto. After the formation of the insulating film 132, a surface thereof may be planarized by CMP, etching treatment, or the like.

Through the above steps, the transistor 200 of an embodiment of the present invention can be manufactured (see FIG. 6C).

In the manufacturing method according to an embodiment of the present invention, impurities including hydrogen in the oxide semiconductor film can be reduced. Accordingly, a channel formation region in the oxide semiconductor film can be made to be an i-type (intrinsic) semiconductor or a semiconductor extremely close to an i-type semiconductor. Thus, the off-state current of the transistor can be extremely small.

Further, in the manufacturing method according to an embodiment of the present invention, heat treatment is performed after an oxide semiconductor film is formed over an insulating film from which oxygen is released by heat treatment, whereby oxygen defects in the oxide semiconductor film and the interface state at the interface between the insulating film and the oxide semiconductor film can be reduced. After the oxide semiconductor film is selectively etched, an insulating film from which oxygen is released by heat treatment is formed in contact with the side surfaces of the etched oxide semiconductor film. Thus, the side surfaces of the etched oxide semiconductor film are not exposed to a reduced-pressure atmosphere and an etchant, whereby generation of oxygen defects in the side surfaces of the oxide semiconductor film can be reduced. Furthermore, by a heating step after formation of a gate insulating film, oxygen is diffused to the oxide semiconductor film from the insulating films from which oxygen is released by heat treatment; therefore, even when oxygen defects are generated in the side surfaces of the oxide semiconductor film, the oxygen defects can be compensated. As a result, the threshold voltage of the transistor can be prevented from shifting in the negative direction and leakage current between a source and a drain of the transistor can be reduced, leading to improvement in electrical characteristics of the transistor.

Next, the method for manufacturing the transistor 210 illustrated in FIGS. 2A to 2C will be described below with reference to FIGS. 3A to 3E, FIGS. 4A to 4D, FIG. 5A to 5C, and FIGS. 7A to 7D.

The transistor 210 illustrated in FIGS. 2A to 2C includes the conductive films 126a and 126b which are provided in contact with the sidewall insulating films 124a and 124b and the oxide semiconductor film 106a, which is different from the transistor 200 illustrated in FIGS. 1A to 1C. Therefore, detailed description of the steps before forming the conductive films 126a and 126b is omitted.

First, in accordance with the steps illustrated in FIG. 3A to 3E, FIGS. 4A to 4D, and FIGS. 5A to 5C, the insulating film 102a over the substrate 100, the oxide semiconductor film 106a, the insulating film 110a in contact with the side surfaces of the oxide semiconductor film 106a, the insulating film 112a over the insulating film 110a, the insulating film 114, the gate electrode 116a over the insulating film 114, and the insulating film 118a over the gate electrode 116a are formed. Further, the channel formation region 122 and the regions 120a and 120b containing the dopant, between which the channel formation region 122 is sandwiched, are formed in the oxide semiconductor film 106a, and the sidewall insulating films 124a and 124b and the gate insulating film 114a are formed.

Figure 7A:
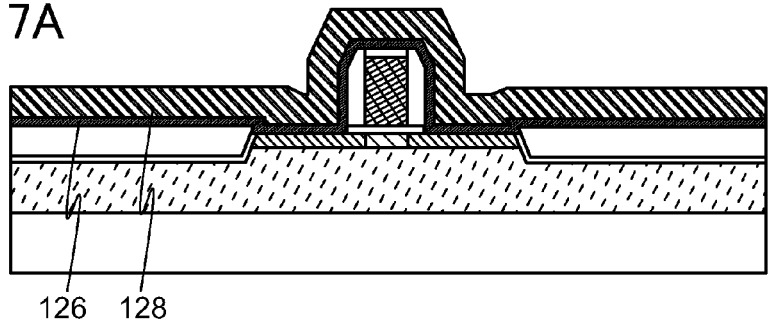
FIGS. 7A to 7D are cross-sectional views illustrating a method for manufacturing a semiconductor device according to an embodiment of the present invention.

Next, a conductive film 126 is formed, and the conductive film 128 is formed over the conductive film 126 (see FIG. 7A). Any of metals such as aluminum, titanium, chromium, nickel, copper, yttrium, zirconium, molybdenum, silver, tantalum, and tungsten, or an alloy containing any of the metals as its main component is used for each of the conductive film 126 and the conductive film 128. The conductive film 126 and the conductive film 128 may each have a single-layer structure or a stacked-layer structure. For example, a single-layer structure of an aluminum film containing silicon, a two-layer structure in which a titanium film is formed over an aluminum film, a two-layer structure in which a titanium film is formed over a tungsten film, a two-layer structure in which a copper film is formed over a copper-magnesium-aluminum alloy film, a three-layer structure in which a titanium film, an aluminum film, and a titanium film are stacked in that order, and the like can be given. Further, as in the conductive film 116, a transparent conductive material containing indium oxide, tin oxide, or zinc oxide may be used. The case where tungsten is used for the conductive film 126 and titanium is used for the conductive film 128 is described in this embodiment. The conductive film 126 is preferably thinner than the conductive film 128. For example, the thickness of the conductive film 126 is greater than or equal to 10 nm and less than or equal to 50 nm, and the thickness of the conductive film 128 is greater than or equal to 50 nm and less than or equal to 500 nm. When the conductive film 126 is formed to be thin, processing in a later step can be performed easily. Specifically, in the case where the conductive film 126 is thick, variation in etching rate of the conductive film 126 becomes large in a later etching step and the conductive films 126a and 126b might not be in contact with the sidewall insulating films 124a and 124b in a portion where etching rate is large. However, when the conductive film 126 is thin, variation in etching rate of the conductive film 126 can be small, and the conductive films 126a and 126b can be easily processed to be in contact with the sidewall insulating films 124a and 124b.

Figure 7B:
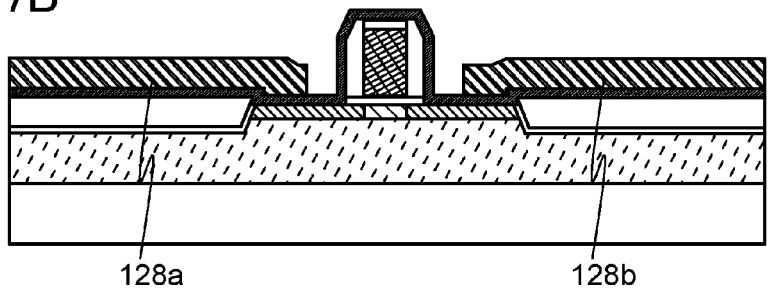

Next, a mask is formed over the conductive film 128, and the conductive film 128 is etched to form the conductive films 128a and 128b (see FIG. 7B). For the etching of the conductive film 128, either wet etching or dry etching can be used, or wet etching and dry etching may be used in combination. The etching conditions (e.g., an etching gas or an etchant, etching time, and temperature) are set as appropriate in accordance with the material so that the conductive film 128 can be etched to have a desired shape. Note that dry etching is preferably used for finely processing the transistor.

As an etching gas used for dry etching of the conductive film 128, for example, a gas containing fluorine, such as sulfur hexafluoride ($SF_6$), nitrogen trifluoride ($NF_3$), or trifluoromethane ($CHF_3$), a mixed gas of carbon tetrafluoride ($CF_4$) and hydrogen, or the like can be used. A rare gas (helium (He), argon (Ar), or xenon (Xe)), carbon monoxide, carbon dioxide, or the like may be added to the etching gas used for dry etching.

Etching in the case where tungsten is used for the conductive film 126 and titanium is used for the conductive film 128 is performed under the following conditions, for example: ICP is 450 W; bias is 100 W; the pressure is 1.9 Pa; the etching gas is a mixed gas of $BCl_3$ and $Cl_2$; and the flow rate of $BCl_3$ is 60 sccm and the flow rate of $Cl_2$ is 20 sccm. With such conditions, the conductive film 128 can be removed while the conductive film 126 is not removed. Further, by removal of part of the conductive film 128, the conductive films 128a and 128b can be formed.

Figure 7C:
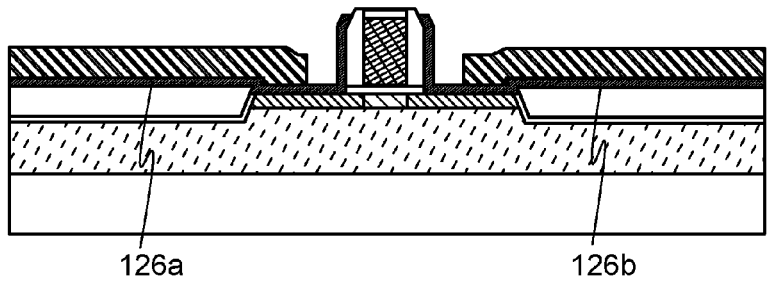

Next, a mask is formed over the conductive films 128a and 128b and the conductive film 126 and part of the conductive film 126, which includes a portion overlapping with the gate electrode 116a, is etched; thus, the conductive films 126a and 126b, which function as a source electrode and a drain electrode, are formed (see FIG. 7C). When the conductive films 126a and 126b are provided in contact with the sidewall insulating films 124a and 124b, a surface of the oxide semiconductor film 106a can be surely covered with the conductive films 126a and 126b even when mask misalignment occurs. Further, variation in electrical characteristics of transistors due to mask misalignment can be suppressed. Furthermore, the oxide semiconductor film 106a is not exposed to an etching gas in formation of the source electrode and the drain electrode, which is preferable. Moreover, since the insulating film 118a is formed over the gate electrode 116a, a short circuit between the gate electrode 116a and the conductive films 126a and 126b can be prevented.

Etching in the case where tungsten is used for the conductive film 126 is performed under the following conditions, for example: ICP is 500 W; bias is 10 W; the pressure is 1.5 Pa; the etching gas is a mixed gas of $CF_4$, $Cl_2$, and $O_2$; and the flow rate of $CF_4$ is 25 sccm, the flow rate of $Cl_2$ is 25 sccm, and the flow rate of $O_2$ is 10 sccm. With such conditions, only part of the conductive film 126 can be removed while the insulating film 118a and the sidewall insulating films 124a and 124b are not removed. Further, the part of the conductive film 126 is removed, so that the conductive films 126a and 126b can be formed.

Figure 7D:
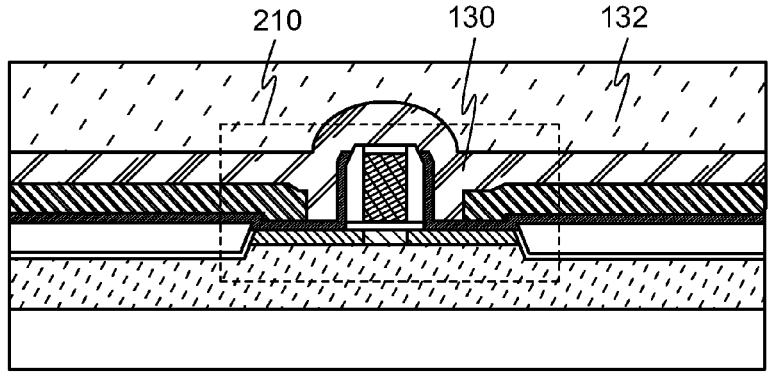

Next, the insulating film 130 is formed over the conductive films 126a and 126b, the conductive films 128a and 128b, and the insulating film 118a, and the insulating film 132 is formed over the insulating film 130 (see FIG. 7D). The insulating film 130 and the insulating film 132 can each be formed using a material containing an inorganic insulating material such as silicon oxide, silicon nitride oxide, silicon nitride, hafnium oxide, aluminum oxide, or tantalum oxide. Moreover, the insulating film 130 and the insulating film 132 can each be formed using an organic insulating material such as polyimide or acrylic. Here, a two-layer structure of the insulating film 130 and the insulating film 132 is employed; however, a structure of an insulating film which covers the transistor is not limited thereto. After the formation of the insulating film 132, a surface thereof may be planarized by CMP, etching treatment, or the like.

Through the above steps, the transistor 210 of an embodiment of the present invention can be manufactured (see FIG. 7D).

In the manufacturing method according to an embodiment of the present invention, impurities including hydrogen in the oxide semiconductor film can be reduced. Accordingly, a channel formation region in the oxide semiconductor film can be made to be an i-type (intrinsic) semiconductor or a semiconductor extremely close to an i-type semiconductor. Thus, the off-state current of the transistor can be extremely small.

Further, in the manufacturing method according to an embodiment of the present invention, heat treatment is performed after an oxide semiconductor film is formed over an insulating film from which oxygen is released by heat treatment, whereby oxygen defects in the oxide semiconductor film and the interface state at the interface between the insulating film and the oxide semiconductor film can be reduced. After the oxide semiconductor film is selectively etched, an insulating film from which oxygen is released by heat treatment is formed in contact with the side surfaces of the etched oxide semiconductor film. Thus, the side surfaces of the etched oxide semiconductor film are not exposed to a reduced-pressure atmosphere and an etchant, whereby generation of oxygen defects in the side surfaces of the oxide semiconductor film can be reduced. Furthermore, by a heating step after formation of a gate insulating film, oxygen is diffused to the oxide semiconductor film from the insulating films from which oxygen is released by heat treatment; therefore, even when oxygen defects are generated in the side surfaces of the oxide semiconductor film, the oxygen defects can be compensated. As a result, the threshold voltage of the transistor can be prevented from shifting in the negative direction and leakage current between a source and a drain of the transistor can be reduced, leading to improvement in electrical characteristics of the transistor.

When the conductive films 126a and 126b serving as the source electrode and the drain electrode are provided in contact with the sidewall insulating films 124a and 124b, a surface of the oxide semiconductor film 106a can be surely covered with the conductive films 126a and 126b even when mask misalignment occurs. Further, variation in electrical characteristics of transistors due to mask misalignment can be suppressed. Furthermore, the oxide semiconductor film 106a is not exposed to an etching gas in formation of the source electrode and the drain electrode, which is preferable. Moreover, since the insulating film 118a is formed over the gate electrode 116a, a short circuit between the gate electrode 116a and the conductive films 126a and 126b can be prevented.

Embodiment 3

In this embodiment, an example of a method for manufacturing a transistor with larger on-state current than the transistors illustrated in FIGS. 1A to 1C and FIGS. 2A to 2C will be described with reference to FIGS. 3A to 3E, FIGS. 4A to 4D, FIGS. 5A to 5C, FIGS. 6A to 6C, FIGS. 7A to 7D, FIGS. 8A and 8B, FIGS. 9A and 9B, FIGS. 10A and 10B, and FIGS. 11A and 11B.

First, an example of a method for manufacturing a transistor with larger on-state current than the transistor illustrated in FIGS. 1A to 1C is described with reference to FIGS. 3A to 3E, FIGS. 4A to 4D, FIGS. 5A to 5C, and FIGS. 8A and 8B. The difference between the structure of a transistor 220 illustrated in FIG. 8B and that of the transistor 200 illustrated in FIGS. 1A to 1C is a structure of the regions containing a dopant in the oxide semiconductor film 106a.

First, as in the transistor 200 illustrated in FIGS. 1A to 1C, through the steps illustrated in FIGS. 3A to 3E, FIGS. 4A to 4D, and FIGS. 5A to 5C, the insulating film 102a over the substrate 100, the oxide semiconductor film 106a, the insulating film 110a in contact with the side surfaces of the oxide semiconductor film 106a, the insulating film 112a over the insulating film 110a, the insulating film 114, the gate electrode 116a over the insulating film 114, and the insulating film 118a over the gate electrode 116a are provided. Further, in the oxide semiconductor film 106a, the channel formation region 122 and the regions 120a and 120b containing the dopant between which the channel formation region 122 is sandwiched are formed. Furthermore, the sidewall insulating films 124a and 124b and the gate insulating film 114a are formed.

Figure 8A:
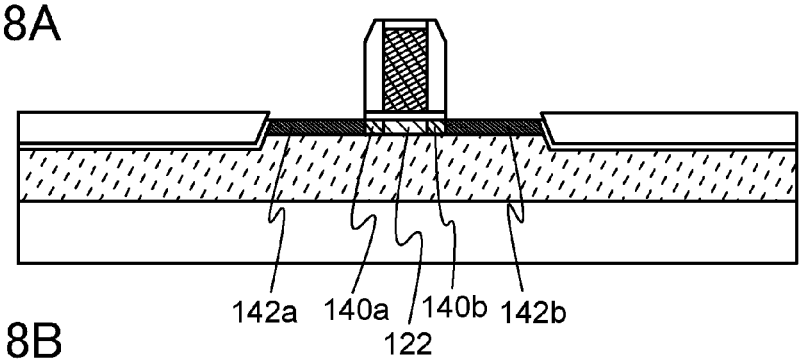
FIGS. 8A and 8B are cross-sectional views illustrating a method for manufacturing a semiconductor device according to an embodiment of the present invention.

Next, the dopant is further added to the oxide semiconductor film 106a, so that regions 140a, 140b, 142a, and 142b containing the dopant are formed (see FIG. 8A). Here, the dopant is added to the oxide semiconductor film 106a with the use of the gate electrode 116a, the insulating film 118a, and the sidewall insulating films 124a and 124b as masks, so that the regions 140a, 140b, 142a, and 142b to which the dopant is added and a region to which the dopant is not added (the channel formation region 122) are formed in a self-aligned manner.

For example, the concentration of the dopant in the regions 140a and 140b containing the dopant is preferably substantially the same as that in the regions 120a and 120b containing the dopant illustrated in FIG. 5A. Further, the concentration of the dopant in the regions 142a and 142b containing the dopant is preferably higher than that in the regions 140a and 140b containing the dopant.

Specifically, the concentrations of the dopant in the regions 140a, 140b, 142a, and 142b containing the dopant is higher than or equal to $5 \times 10^{18}$ atoms/cm$^3$ and lower than or equal to $1 \times 10^{22}$ atoms/cm$^3$, preferably higher than or equal to $5 \times 10^{18}$ atoms/cm$^3$ and lower than $5 \times 10^{20}$ atoms/cm$^3$.

After formation of the regions 140a, 140b, 142a, and 142b containing the dopant, heat treatment may be performed so that the sheet resistance of the regions 140a, 140b, 142a, and 142b containing the dopant is further reduced.

As a result, the contact resistance between the conductive film 128a and the region 142a containing the dopant and between the conductive film 128b and the region 142b containing the dopant can be reduced and an electric field applied to each end portion of the channel formation region 122 can be relaxed. Accordingly, on-state current of the transistor can be increased and a short channel effect can be suppressed.

After that, the conductive films 128a and 128b are formed. Next, the insulating film 130 is formed over the conductive films 128a and 128b and the insulating film 118a, and the insulating film 132 is formed over the insulating film 130.

Figure 8B:
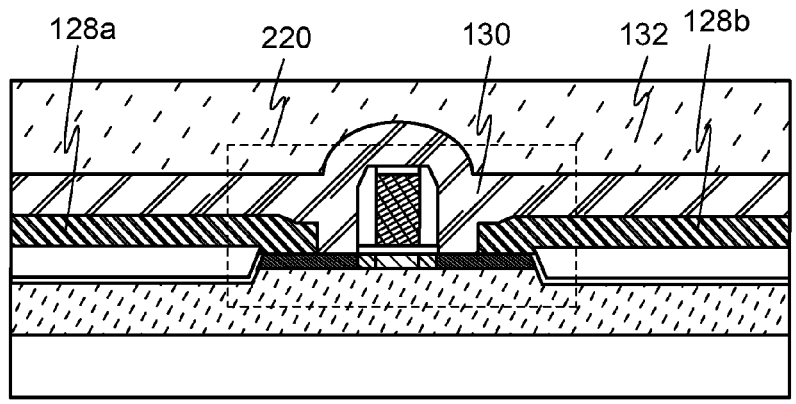

Through the above steps, the transistor 220 according to an embodiment of the present invention can be manufactured (see FIG. 8B). The transistor described in this embodiment includes, in the oxide semiconductor film, the channel formation region 122 serving as a channel region, the regions 140a and 140b containing the dopant, between which the channel formation region 122 is sandwiched, and the regions 142a and 142b containing the dopant, between which the regions 140a and 140b are sandwiched, and which are in contact with the conductive films 128a and 128b serving as a source electrode and a drain electrode. Thus, on-state current of the transistor can be increased and a short channel effect can be suppressed. Further, the threshold voltage can be prevented from shifting in the negative direction, and leakage current between a source and a drain of the transistor can be reduced; thus, electrical characteristics of the transistor can be improved.

Next, another example of a method for manufacturing a transistor with larger on-state current than the transistor 200 illustrated in FIGS. 1A to 1C is described with reference to FIGS. 3A to 3E, FIGS. 4A to 4D, FIGS. 5A to 5C, and FIGS. 9A and 9B. The difference between the structure of a transistor 230 illustrated in FIG. 9B and the structures of the transistor illustrated in FIGS. 1A to 1C and the transistor illustrated in FIG. 8B is a structure of the regions containing a dopant in the oxide semiconductor film 106a.

First, as in the transistor 200 illustrated in FIGS. 1A to 1C, through the steps illustrated in FIGS. 3A to 3E, FIGS. 4A to 4D, and FIGS. 5A to 5C, the insulating film 102a over the substrate 100, the oxide semiconductor film 106a, the insulating film 110a in contact with the side surfaces of the oxide semiconductor film 106a, the insulating film 112a over the insulating film 110a, the gate insulating film 114a, the gate electrode 116a over the insulating film 114a, and the insulating film 118a over the gate electrode 116a are provided. Further, in the oxide semiconductor film 106a, the channel formation region 122 and the regions 120a and 120b containing the dopant between which the channel formation region 122 is sandwiched are formed. Further, the sidewall insulating films 124a and 124b are formed.

Figure 9A:
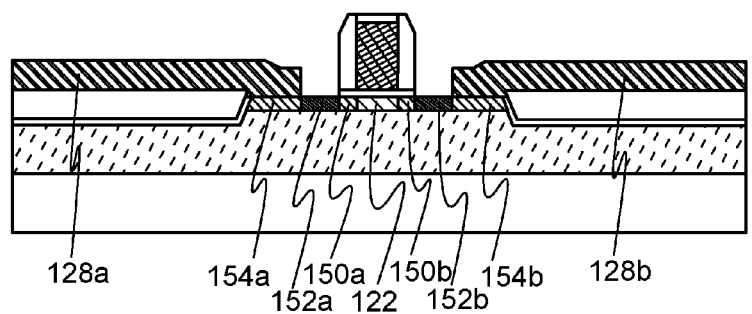
FIGS. 9A and 9B are cross-sectional views illustrating a method for manufacturing a semiconductor device according to an embodiment of the present invention.

Next, after formation of a conductive film, the conductive film is selectively etched to form the conductive films 128a and 128b (see FIG. 9A).

Next, the dopant is further added to the oxide semiconductor film 106a, so that regions 150a, 150b, 152a, 152b, 154a, and 154b containing the dopant are formed (see FIG. 9A). Here, the dopant is added to the oxide semiconductor film 106a with the use of the gate electrode 116a, the insulating film 118a, the sidewall insulating films 124a and 124b, and the conductive films 128a and 128b as masks, so that the regions 150a, 150b, 152a, 152b, 154a, and 154b to which the dopant is added and a region to which the dopant is not added (the channel formation region 122) are formed in a self-aligned manner.

For example, the concentration of the dopant in the regions 150a and 150b containing the dopant is preferably substantially the same as that in the regions 120a and 120b containing the dopant illustrated in FIG. 5A. Further, the concentration of the dopant in the regions 152a and 152b containing the dopant is preferably higher than that in the regions 150a and 150b containing the dopant.

The concentrations of the dopant in the regions 150a, 150b, 152a, 152b, 154a, and 154b containing the dopant are higher than or equal to $5 \times 10^{18}$ atoms/cm$^3$ and lower than or equal to $1 \times 10^{22}$ atoms/cm$^3$, preferably higher than or equal to $5 \times 10^{18}$ atoms/cm$^3$ and lower than $5 \times 10^{20}$ atoms/cm$^3$. The dopant is added to the exposed regions of the oxide semiconductor film 106a, so that the regions 152a and 152b containing the dopant are formed. On the other hand, the dopant is not added to the regions of the oxide semiconductor film 106a, which overlap with the sidewall insulating films 124a and 124b and the conductive films 128a and 128b, because the sidewall insulating films 124a and 124b and the conductive films 128a and 128b serve as masks; as a result, the concentrations of the dopant in the regions 150a, 150b, 154a, and 154b containing the dopant are substantially the same. Accordingly, the concentration of the dopant in the regions 152a and 152b containing the dopant is higher than the concentrations of the dopant in the regions 150a, 150b, 154a, and 154b containing the dopant.

After formation of the regions 150a, 150b, 152a, 152b, 154a, and 154b containing the dopant, heat treatment may be performed so that the sheet resistance of the regions 150a, 150b, 152a, 152b, 154a, and 154b containing the dopant is further reduced.

As a result, the contact resistance between the conductive film 128a and the region 154a containing the dopant and between the conductive film 128b and the region 154b containing the dopant can be reduced and an electric field applied to each end portion of the channel formation region 122 can be relaxed. Accordingly, on-state current of the transistor to be completed later can be increased and a short channel effect can be suppressed.

After that, the insulating film 130 is formed over the conductive films 128a and 128b and the insulating film 118a, and the insulating film 132 is formed over the insulating film 130.

Figure 9B:
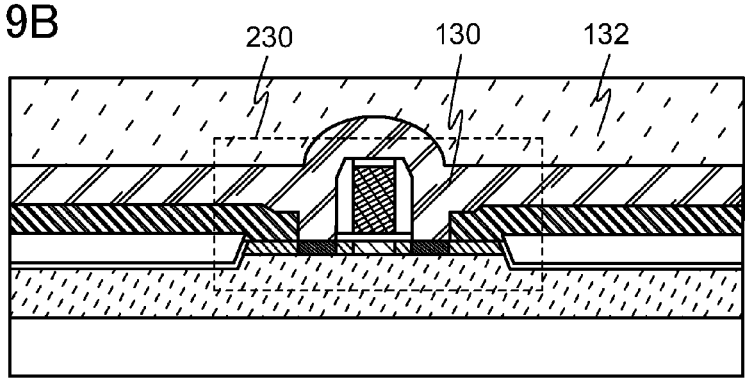

Through the above steps, the transistor 230 according to an embodiment of the present invention can be manufactured (see FIG. 9B). The transistor described in this embodiment includes, in the oxide semiconductor film, the channel formation region 122 serving as a channel region, the regions 150a and 150b containing the dopant, between which the channel formation region 122 is sandwiched, and the regions 154a and 154b containing the dopant, between which the regions 150a and 150b are sandwiched, and which are in contact with the conductive films 128a and 128b serving as a source electrode and a drain electrode. Thus, on-state current of the transistor can be increased and a short channel effect can be suppressed. Further, the threshold voltage can be prevented from shifting in the negative direction, and leakage current between a source and a drain of the transistor can be reduced; thus, electrical characteristics of the transistor can be improved.

Next, an example of a method for manufacturing a transistor with larger on-state current than the transistor 210 illustrated in FIGS. 2A to 2C is described with reference to FIGS. 3A to 3E, FIGS. 4A to 4D, FIGS. 5A to 5C, and FIGS. 10A and 10B. The difference between the structure of a transistor 240 illustrated in FIG. 10B and that of the transistor 210 illustrated in FIGS. 2A to 2C is a structure of the regions containing a dopant in the oxide semiconductor film 106a.

First, as in the transistor 210 illustrated in FIGS. 2A to 2C, through the steps illustrated in FIGS. 3A to 3E, FIGS. 4A to 4D, and FIGS. 5A to 5C, the insulating film 102a over the substrate 100, the oxide semiconductor film 106a, the insulating film 110a in contact with the side surfaces of the oxide semiconductor film 106a, the insulating film 112a over the insulating film 110a, the gate insulating film 114a, the gate electrode 116a over the insulating film 114a, and the insulating film 118a over the gate electrode 116a are provided. Further, in the oxide semiconductor film 106a, the channel formation region 122 and the regions 120a and 120b containing the dopant between which the channel formation region 122 is sandwiched are formed. Further, the sidewall insulating films 124a and 124b are formed.

Figure 10A:
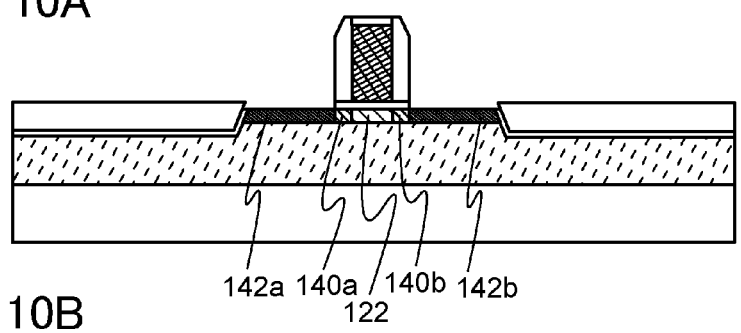
FIGS. 10A and 10B are cross-sectional views illustrating a method for manufacturing a semiconductor device according to an embodiment of the present invention.

Next, the dopant is further added to the oxide semiconductor film 106a, so that regions 140a, 140b, 142a, and 142b containing the dopant are formed (see FIG. 10A). Here, the dopant is added to the oxide semiconductor film 106a with the use of the gate electrode 116a, the insulating film 118a, and the sidewall insulating films 124a and 124b as masks, so that the regions 140a, 140b, 142a, and 142b to which the dopant is added and a region to which the dopant is not added (the channel formation region 122) are formed in a self-aligned manner.

For example, the concentration of the dopant in the regions 140a and 140b containing the dopant is preferably substantially the same as that in the regions 120a and 120b containing the dopant illustrated in FIG. 5A. Further, the concentration of the dopant in the regions 142a and 142b containing the dopant is preferably higher than that in the regions 140a and 140b containing the dopant.

Specifically, the concentrations of the dopant in the regions 140a, 140b, 142a, and 142b containing the dopant is higher than or equal to $5\times10^{18}$ atoms/cm$^3$ and lower than or equal to $1\times10^{22}$ atoms/cm$^3$, preferably higher than or equal to $5\times10^{18}$ atoms/cm$^3$ and lower than $5\times10^{20}$ atoms/cm$^3$.

After formation of the regions 140a, 140b, 142a, and 142b containing the dopant, heat treatment may be performed so that the sheet resistance of the regions 140a, 140b, 142a, and 142b containing the dopant is further reduced.

As a result, the contact resistance between the conductive film 126a and the region 142a containing the dopant and between the conductive film 126b and the region 142b containing the dopant can be reduced and an electric field applied to each end portion of the channel formation region 122 can be relaxed. Accordingly, on-state current of the transistor to be completed later can be increased and a short channel effect can be suppressed.

After that, the conductive films 126a and 126b and the conductive films 128a and 128b are formed. When the conductive films 126a and 126b are provided in contact with the sidewall insulating films 124a and 124b, a surface of the oxide semiconductor film 106a can be surely covered with the conductive films even when mask misalignment occurs. Further, variation in electrical characteristics of transistors due to mask misalignment can be suppressed. Furthermore, the oxide semiconductor film 106a is not exposed to an etching gas in formation of the source electrode and the drain electrode, which is preferable.

Next, the insulating film 130 is formed over the conductive films 126a and 126b, the conductive films 128a and 128b, and the insulating film 118a, and the insulating film 132 is formed over the insulating film 130.

Figure 10B:
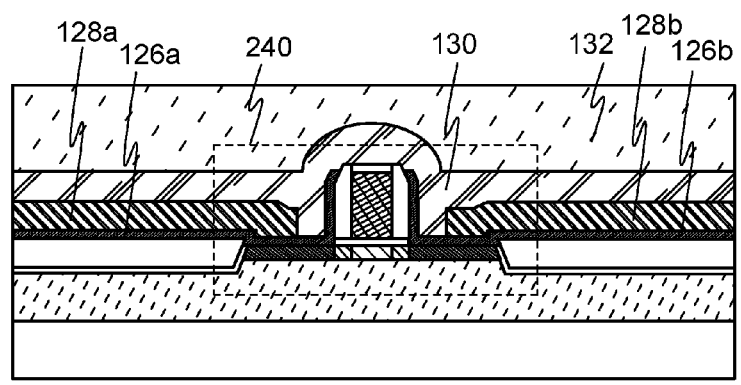

Through the above steps, the transistor 240 according to an embodiment of the present invention can be manufactured (see FIG. 10B). The transistor described in this embodiment includes, in the oxide semiconductor film, the channel formation region 122 serving as a channel region, the regions 140a and 140b containing the dopant, between which the channel formation region 122 is sandwiched, and the regions 142a and 142b containing the dopant, between which the regions 140a and 140b are sandwiched, and which are in contact with the conductive films 126a and 126b serving as a source electrode and a drain electrode. Thus, on-state current of the transistor can be increased and a short channel effect can be suppressed. Further, the threshold voltage can be prevented from shifting in the negative direction, and leakage current between a source and a drain of the transistor can be reduced; thus, electrical characteristics of the transistor can be improved.

Next, another example of a method for manufacturing a transistor with larger on-state current than the transistor illustrated in FIGS. 2A to 2C is described with reference to FIGS. 3A to 3E, FIGS. 4A to 4D, FIGS. 5A to 5C, FIGS. 7A to 7C, and FIGS. 11A and 11B. The difference between the structure of a transistor 250 illustrated in FIG. 11B and the structures of the transistor illustrated in FIGS. 2A to 2C and the transistor illustrated in FIG. 10B is a structure of the regions containing a dopant in the oxide semiconductor film 106a.

As in the transistor illustrated in FIGS. 2A to 2C, through the steps illustrated in FIGS. 3A to 3E, FIGS. 4A to 4D, and FIGS. 5A to 5C, the insulating film 102a over the substrate 100, the oxide semiconductor film 106a, the insulating film 110a in contact with the side surfaces of the oxide semiconductor film 106a, the insulating film 112a over the insulating film 110a, the gate insulating film 114a, the gate electrode 116a over the gate insulating film 114a, and the insulating film 118a over the gate electrode 116a are provided. Further, the sidewall insulating films 124a and 124b are formed.

Figure 11A:
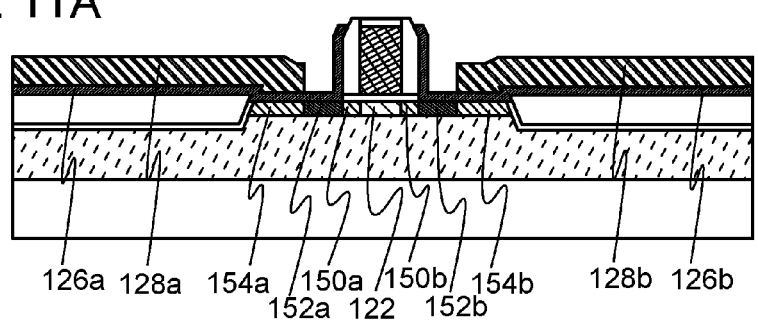
FIGS. 11A and 11B are cross-sectional views illustrating a method for manufacturing a semiconductor device according to an embodiment of the present invention.

Next, after formation of two conductive films, the conductive films are selectively etched to form the conductive films 126a, 126b, 128a, and 128b (see FIG. 11A).

Next, the dopant is added to the oxide semiconductor film 106a, so that the regions 150a, 150b, 152a, 152b, 154a, and 154b containing the dopant are formed (see FIG. 11A). Here, the dopant is added to the oxide semiconductor film 106a with the use of the gate electrode 116a, the insulating film 118a, the sidewall insulating films 124a and 124b, and the conductive films 128a and 128b as masks, so that the regions 150a, 150b, 152a, 152b, 154a, and 154b to which the dopant is added and a region to which the dopant is not added (the channel formation region 122) are formed in a self-aligned manner.

For example, the concentration of the dopant in the regions 150a and 150b containing the dopant is preferably substantially the same as that in the regions 120a and 120b containing the dopant illustrated in FIG. 5A. Further, the concentration of the dopant in the regions 152a and 152b containing the dopant is preferably higher than that in the regions 150a and 150b containing the dopant.

The concentrations of the dopant in the regions 150a, 150b, 152a, 152b, 154a, and 154b containing the dopant are higher than or equal to $5\times10^{18}$ atoms/cm$^3$ and lower than or equal to $1\times10^{22}$ atoms/cm$^3$, preferably higher than or equal to $5\times10^{18}$ atoms/cm$^3$ and lower than $5\times10^{20}$ atoms/cm$^3$. The dopant passing through the conductive films 126a and 126b is added to the oxide semiconductor film 106a, so that the regions 152a and 152b containing the dopant are formed. On the other hand, the dopant is not added to the regions of the oxide semiconductor film 106a, which overlap with the sidewall insulating films 124a and 124b and the conductive films 128a and 128b, because the sidewall insulating films 124a and 124b and the conductive films 128a and 128b serve as masks; as a result, the concentrations of the dopant in the regions 150a, 150b, 154a, and 154b containing the dopant are substantially the same. Accordingly, the concentration of the dopant in the regions 152a and 152b containing the dopant is higher than the concentrations of the dopant in the regions 150a, 150b, 154a, and 154b containing the dopant.

After formation of the regions 150a, 150b, 152a, 152b, 154a, and 154b containing the dopant, heat treatment may be performed so that the sheet resistance of the regions 150a, 150b, 152a, 152b, 154a, and 154b containing the dopant is further reduced.

As a result, the contact resistance between the conductive film 126a and the region 152a containing the dopant and between the conductive film 126b and the region 152b containing the dopant can be reduced and an electric field applied to each end portion of the channel formation region 122 can be relaxed. Accordingly, on-state current of the transistor to be completed later can be increased and a short channel effect can be suppressed.

After that, the insulating film 130 is formed over the conductive films 126a and 126b, the conductive films 128a and 128b, and the insulating film 118a, and the insulating film 132 is formed over the insulating film 130.

Figure 11B:
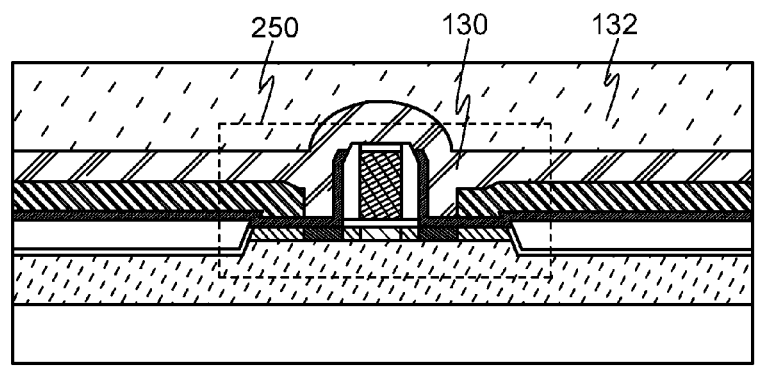

Through the above steps, the transistor 250 according to an embodiment of the present invention can be manufactured (see FIG. 11B). The transistor described in this embodiment includes, in the oxide semiconductor film, the channel formation region 122 serving as a channel region, the regions 150a and 150b containing the dopant, between which the channel formation region 122 is sandwiched, and the regions 152a and 152b containing the dopant, between which the regions 150a and 150b are sandwiched, and which are in contact with the conductive films 126a and 126b serving as a source electrode and a drain electrode. Thus, on-state current of the transistor can be increased and a short channel effect can be suppressed. Further, the threshold voltage can be prevented from shifting in the negative direction, and leakage current between a source and a drain of the transistor can be reduced; thus, electrical characteristics of the transistor can be improved.

Further, the dopant is added to the oxide semiconductor film through the conductive films 126a and 126b, whereby the oxide semiconductor film can be prevented from being damaged by the dopant, which is preferable.

Embodiment 4

In this embodiment, semiconductor devices with structures which are partly different from the semiconductor devices illustrated in FIGS. 1A to 1C and FIGS. 2A to 2C will be described with reference to FIGS. 12A to 12C.

Figure 12A:
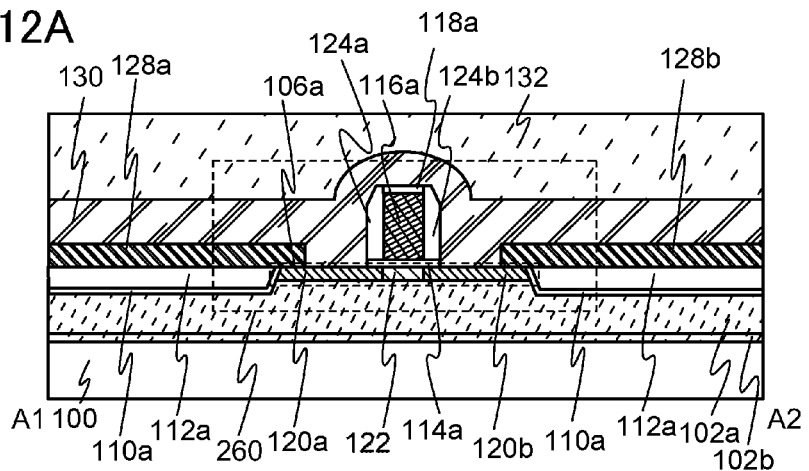
FIGS. 12A to 12C are cross-sectional views each illustrating a semiconductor device according to an embodiment of the present invention.

FIG. 12A illustrates a transistor 260 with a structure which is partly different from the transistor illustrated in FIGS. 1A to 1C. In the transistor 200 illustrated in FIGS. 1A to 1C, as illustrated in FIG. 3E, the insulating film 110 is removed until the oxide semiconductor film 106a is exposed after the insulating film 112 is subjected to planarization treatment; therefore, a step is generated between the insulating film 110a and the insulating film 112a. In contrast, in the semiconductor device illustrated in FIG. 12A, the insulating film 112 and the insulating film 110 are subjected to planarization treatment, so that there is no step between the insulating film 110a and the insulating film 112a. Thus, coverage with the conductive films 128a and 128b can be favorable.

As described with reference to FIG. 3A, an insulating film provided over the substrate 100 may have a stacked-layer structure including. FIG. 12A illustrates the case where a two-layer structure including an insulating film 102b and the insulating film 102a is employed, in which an aluminum oxide film is used as the insulating film 102b and a silicon oxide film is used as the insulating film 102a.

Figure 12B:
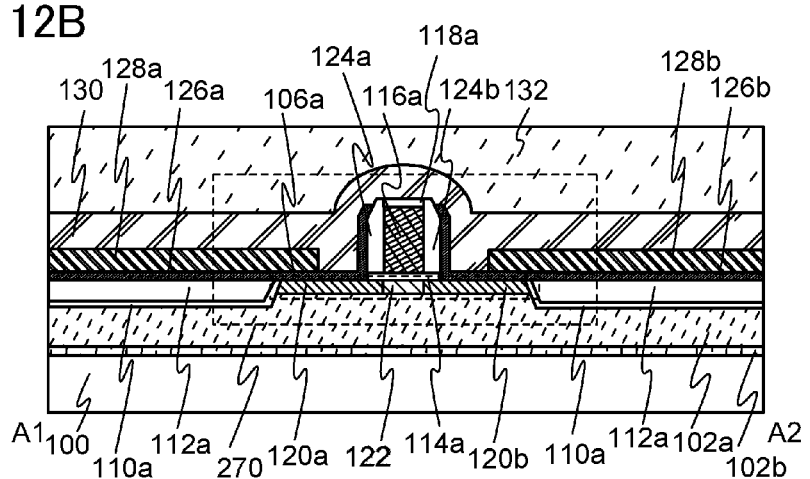

FIG. 12B illustrates a transistor 270 with a structure which is partly different from the transistors illustrated in FIGS. 2A to 2C and FIG. 12A. In the transistor 210 illustrated in FIGS. 2A to 2C, as illustrated in FIG. 3E, the insulating film 110 is removed until the oxide semiconductor film 106a is exposed after the insulating film 112 is subjected to planarization treatment; therefore, a step is generated between the insulating film 110a and the insulating film 112a. In contrast, in the semiconductor device illustrated in FIG. 12B, the insulating film 112 and the insulating film 110 are subjected to planarization treatment, so that there is no step between the insulating film 110a and the insulating film 112a. Thus, coverage with the conductive films 126a and 126b and the conductive films 128a and 128b can be favorable.

As described with reference to FIG. 3A, an insulating film provided over the substrate 100 may have a stacked-layer structure including. FIG. 12B illustrates the case where a two-layer structure including the insulating film 102b and the insulating film 102a is employed, in which an aluminum oxide film is used as the insulating film 102b and a silicon oxide film is used as the insulating film 102a.

Figure 12C:
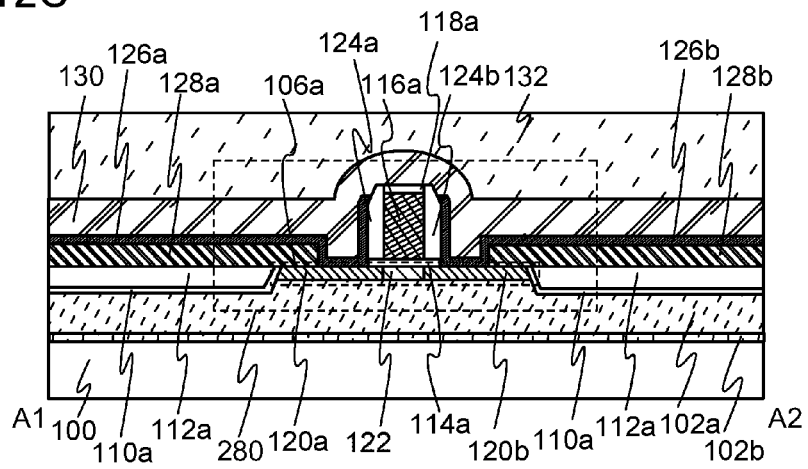

FIG. 12C illustrates a transistor 280 with a structure which is partly different from the structures of the transistors illustrated in FIGS. 2A to 2C and FIGS. 12A and 12B. In the transistor 210 illustrated in FIGS. 2A to 2C, the conductive film 128a which is thicker than the conductive film 126a is formed over the conductive film 126a, and the conductive film 128b which is thicker than the conductive film 126b is formed over the conductive film 126b. In contrast, in the transistor 280 illustrated in FIG. 12C, the conductive films 126a and 126b are respectively formed over the conductive films 128a and 128b which are thicker than the conductive films 126a and 126b, and the conductive films 126a and 126b are in contact with the sidewall insulating films 124a and 124b, respectively.

Each of the semiconductor devices illustrated in FIGS. 12A to 12C can be freely combined with any of the semiconductor devices illustrated in FIGS. 1A to 1C, FIGS. 2A to 2C, FIGS. 8A and 8B, FIGS. 9A and 9B, FIGS. 10A and 10B, and FIGS. 11A and 11B.

Embodiment 5

In this embodiment, examples of a circuit configuration of a semiconductor device using the transistor described in any of the above embodiments and operation thereof will be described with reference to FIGS. 13A and 13B, FIG. 14, and FIGS. 15A and 15B. Note that in each of circuit diagrams, in some cases, "OS" is written beside a transistor in order to indicate that the transistor includes an oxide semiconductor.
<Cross-sectional Structure of Semiconductor Device>

First, an example of a cross-sectional structure of a semiconductor device will be described with reference to FIG. 13A. The semiconductor device illustrated in FIG. 13A includes a transistor 160 including a first semiconductor material in a lower portion and a capacitor 164 and a transistor 300 including a second semiconductor material in an upper portion. One memory cell includes the transistor 160, the transistor 300, and the capacitor 164.

Figure 13A:
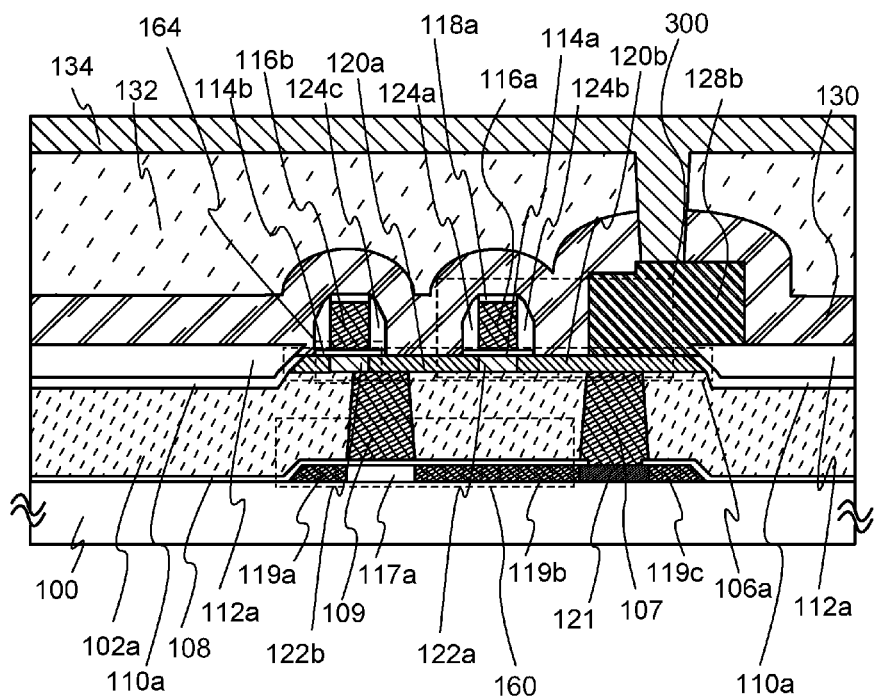
FIGS. 13A and 13B are a cross-sectional view and a circuit diagram illustrating a semiconductor device according to an embodiment of the present invention.

The transistor 160 in FIG. 13A includes, over the substrate 100, a channel formation region 117a including a semiconductor material (e.g., silicon), impurity regions 119a and 119b between which the channel formation region 117a is sandwiched, a gate insulating layer 108 over the channel formation region 117a, and a gate electrode 109 over the gate insulating layer 108. Note that FIG. 13A illustrates an element in which distinct source and drain electrodes are not provided; such an element is also referred to as a transistor for the sake of convenience. Further, in such a case, in description of a connection of a transistor, a source region and a source electrode are collectively referred to as a "source electrode", and a drain region and a drain electrode are collectively referred to as a "drain electrode", in some cases. That is, in this specification, the term "source electrode" may include a source region.

The impurity region 119a serves as one of a source electrode and a drain electrode of the transistor 160. The impurity region 119b serves as the other of the source electrode and the drain electrode of the transistor 160. In FIG. 13A, the impurity region 119b is connected to the conductive film 128b through the impurity region 121, a wiring 107, and the region 120b containing the dopant in the oxide semiconductor layer. In other words, the other of the source electrode and the drain electrode of the transistor 160 is electrically connected to one of a source electrode and a drain electrode of the transistor 300.

Note that an embodiment of the present invention is not limited to the structure. Electrical connections among a memory cell, a transistor, and a capacitor can be changed as appropriate. For example, the impurity region 119b may be electrically connected to an impurity region 119a in another memory cell through the impurity region 121 and an impurity region 119c. In that case, an opening does not need to be formed in the gate insulating layer 108. Further, the wiring 107 is not necessarily formed. In other words, in the case where the other of the source electrode and the drain electrode of the transistor 160 is electrically connected to one of a source electrode and a drain electrode of a transistor 160 in another memory cell, the other of the source electrode and the drain electrode of the transistor 160 is not necessarily electrically connected to the one of the source electrode and the drain electrode of the transistor 300.

The wiring 107 can be formed using a material and a step similar to those of the gate electrode 109. With the wiring 107, dishing caused in CMP treatment can be prevented and the top surfaces of the insulating film 102a, the gate electrode 109, and the wiring 107 can be planarized more.

Although the gate electrode 109 and the wiring 107 each have a one-layer structure in FIG. 13A, there is no limitation. The gate electrode 109 and the wiring 107 may each have a two-layer structure. For example, a structure in which a tungsten layer is stacked over a tantalum nitride layer may be employed. Since tantalum nitride has high work function, the absolute value of the threshold voltage of the transistor 160 can be larger as compared to the case where only tungsten is used, and stress can be relieved. Further, as compared to the case where only tantalum nitride is used, resistance of the gate electrode 109 can be reduced.

Note that in order to realize higher integration, the transistor 160 preferably has a structure without a sidewall insulating layer as illustrated in FIG. 13A. On the other hand, in the case where characteristics of the transistor 160 are emphasized, sidewall insulating layers may be provided on side surfaces of the gate electrode 109 and the impurity regions 119a and 119b may include impurity regions having impurity concentrations different from the impurity regions 119a and 119b, which are provided in regions overlapping with the sidewall insulating layers.

A transistor according to an embodiment of the present invention is used as the transistor 300 in FIG. 13A. The transistor 300 includes the channel formation region 122a, the gate electrode 116a, the regions 120a and 120b containing the dopant, the sidewall insulating films 124a and 124b, the gate insulating film 114a, the insulating film 118a, and the conductive film 128b.

The capacitor 164 in FIG. 13A includes an insulating layer 114b, an electrode 116b, a region 122b in the oxide semiconductor layer to which the dopant is not added, and the gate electrode 109. In other words, the gate electrode 116b serves as one electrode of the capacitor 164, and the gate electrode 109 serves as the other electrode of the capacitor 164.

The insulating film 130 is provided to cover the transistor 300 and the capacitor 164, and the insulating film 132 is provided over the insulating film 130. A wiring 134 is connected to the conductive film 128b through an opening formed in the insulating film 130 and the insulating film 132. Although the region 120b containing the dopant is connected to the wiring 134 through the conductive film 128b in FIG. 13A, the disclosed invention is not limited thereto. For example, the wiring 134 may be directly in contact with the region 120b containing the dopant.

Although all the transistors are n-channel transistors here, it is needless to say that p-channel transistors can be used. Since the technical nature of the disclosed invention is to use a semiconductor material with which off-state current can be sufficiently decreased, such as an oxide semiconductor, in the transistor 300 so that data can be stored, it is not necessary to limit a specific structure of the semiconductor device, such as a material of the semiconductor device or a structure of the semiconductor device, to the structure described here.

<Basic Circuit>

Next, a basic circuit structure of the semiconductor device illustrated in FIG. 13A and its operation will be described with reference to FIG. 13B. In the semiconductor device in FIG. 13B, a first wiring (1st Line) is electrically connected to a source electrode or a drain electrode of the transistor 160, and a second wiring (2nd Line) is electrically connected to the drain electrode or the source electrode of the transistor 160. Further, a third wiring (3rd Line) is electrically connected to a source electrode or a drain electrode of the transistor 300, and a fourth wiring (4th Line) is electrically connected to a gate electrode of the transistor 300. A gate electrode of the transistor 160 and the drain electrode or the source electrode of the transistor 300 are electrically connected to one electrode of the capacitor 164, and a fifth wiring (5th Line) is electrically connected to the other electrode of the capacitor 164. Note that the first wiring (1st Line) may be electrically connected to the third line (3rd Line).

Here, a transistor according to an embodiment of the present invention is used as the transistor 300. The transistor according to an embodiment of the present invention is characterized by extremely small off-state current. For that reason, the potential of the gate electrode of the transistor 160 can be held for an extremely long time by turning off the transistor 300. Provision of the capacitor 164 facilitates holding of charge given to the gate electrode of the transistor 160 and reading of held data.

Note that there is no particular limitation on the transistor 160. In terms of increasing the speed of reading data, it is preferable to use, for example, a transistor with high switching rate such as a transistor formed using single crystal silicon.

The semiconductor device in FIG. 13B can write, hold, and read data as described below, utilizing a characteristic in which the potential of the gate electrode of the transistor 160 can be held.

First, writing and holding of data will be described. The potential of the fourth wiring is set to a potential at which the transistor 300 is turned on, whereby the transistor 300 is turned on. Accordingly, the potential of the third wiring is supplied to the gate electrode of the transistor 160 and the capacitor 164. That is, predetermined charge is applied to the gate electrode of the transistor 160 (writing of data). Here, one of charges corresponding to two different levels of potential (hereinafter a charge for applying a low potential $V_L$ is referred to as charge $Q_L$ and a charge for applying a high potential $V_H$ is referred to as charge $Q_H$) is applied. Note that charges for applying three or more different levels of potential may be employed to improve storage capacity. After that, the potential of the fourth wiring is set to a potential at which the transistor 300 is turned off, whereby the transistor 300 is turned off. Thus, the charge applied to the gate electrode of the transistor 160 is held (holding of data).

Since the off-state current of the transistor 300 is extremely small, the charge in the gate electrode of the transistor 160 is held for a long period.

Second, reading of data will be described. While a predetermined potential (a fixed potential) is applied to the first wiring, an appropriate potential (a read-out potential) is applied to the fifth wiring, whereby the potential of the second wiring changes depending on the amount of charge held in the gate electrode of the transistor 160. This is because in general, when the transistor 160 is an n-channel transistor, an apparent threshold voltage $V_{th\_H}$ in the case where $Q_H$ is given to the gate electrode of the transistor 160 is lower than an apparent threshold voltage $V_{th\_L}$ in the case where $Q_L$ is given to the gate electrode of the transistor 160. Here, an apparent threshold voltage refers to the potential of the fifth wiring which is needed to turn on the transistor 160. Thus, by setting the potential of the fifth wiring to a potential $V_0$ which is between $V_{th\_H}$ and $V_{th\_L}$ (e.g., $V_0$=ground potential GND), charge given to the gate electrode of the transistor 160 can be determined. For example, in the case where $Q_H$ is given in writing, when the potential of the fifth wiring is set to $V_0$ ($>V_{th\_H}$), the transistor 160 is turned on. In the case where $Q_L$ is given in writing, even when the potential of the fifth wiring is set to $V_0$ ($<V_{th\_L}$), the transistor 160 remains off. Thus, the data held can be read by measuring the potential of the second wiring.

Note that in the case where memory cells are arrayed, it is necessary to read out data only from an intended memory cell. Thus, in the case where data of a predetermined memory cell is read and data of the other memory cells are not read, fifth wirings in memory cells that are not a target for reading may be supplied with a potential at which the transistors 160 are turned off regardless of the state of the gate electrodes, that is, a potential lower than $V_{th\_H}$ (e.g., $V_1$).

Then, rewriting of data will be described. Rewriting of data is performed in a manner similar to that of the writing and holding of data. That is, the potential of the fourth wiring is set to a potential at which the transistor 300 is turned on, whereby the transistor 300 is turned on. Accordingly, the potential of the third wiring (a potential for new data) is applied to the gate electrode of the transistor 160 and the capacitor 164. After that, the potential of the fourth wiring is set to a potential at which the transistor 300 is turned off, whereby the transistor 300 is turned off. Thus, charge for the new data is applied to the gate electrode of the transistor 160.

In the semiconductor device according to an embodiment of the present invention, data can be directly rewritten by another writing of data as described above. Therefore, extracting of charge from a floating gate with the use of high voltage, which is needed in a flash memory or the like, is not needed and thus a reduction in operation speed caused by erasing operation can be suppressed. In other words, high-speed operation of the semiconductor device can be realized.

Note that the drain electrode (or the source electrode) of the transistor 300 is electrically connected to the gate electrode of the transistor 160, and thereby has an effect similar to that of a floating gate of a floating-gate transistor which is used as a non-volatile memory element. In the following description, the portion where the drain electrode (or the source electrode) of the transistor 300 and the gate electrode of the transistor 160 are electrically connected to each other is called a node FG in some cases. When the transistor 300 is off, the node FG can be regarded as being embedded in an insulator and charge is held in the node FG. The off-state current of the transistor 300 including an oxide semiconductor is smaller than or equal to one hundred thousandth of the off-state current of a transistor including a silicon semiconductor; thus, loss of the charge accumulated in the node FG due to leakage current of the transistor 300 is negligible. That is, with the transistor 300 including an oxide semiconductor, a non-volatile memory device which can hold data without power supply can be realized.

For example, when the off-state current of the transistor 300 is smaller than or equal to 10 zA (1 zA (zeptoampere) is $1\times10^{-21}$ A) at room temperature (25° C.) and the capacitance value of the capacitor 164 is approximately 10 fF, data can be held for $10^6$ seconds or longer. It should be appreciated that the holding time changes depending on the transistor characteristics and the capacitance value.

In the semiconductor memory device according to an embodiment of the present invention, a problem of deterioration of a gate insulating film (a tunnel insulating film), which occurs in a conventional floating-gate transistor, does not exist. That is, the deterioration of a gate insulating film due to injection of electrons into a floating gate, which has been regarded as a problem, can be solved. This means that there is no limitation on the number of times of writing in principle. In addition, high voltage which is needed for writing or erasing data in a conventional floating-gate transistor is not necessary.

In the semiconductor device according to an embodiment of the present invention, the node FG has an effect similar to that of a floating gate of a floating-gate transistor in a flash memory or the like, but the node FG of this embodiment has a feature which is essentially different from that of the floating gate in the flash memory or the like.

In a flash memory, since a potential applied to a control gate is high, it is necessary to keep a proper distance between cells in order to prevent the potential from affecting a floating gate of the adjacent cell. This is one of the factors inhibiting high integration of the semiconductor device. The factor is attributed to a basic principle of a flash memory, in which tunneling current is generated by application of a high electric field.

In contrast, the semiconductor device according to this embodiment is operated by switching of a transistor including an oxide semiconductor and does not use the above principle of charge injection by tunneling current. That is, unlike in a flash memory, a high electric field for charge injection is not necessary. Accordingly, an effect of a high electric field for a control gate on an adjacent cell does not need to be taken into account, and thus high integration can be facilitated.

In addition, it is also advantageous over a flash memory that a high electrical field is unnecessary and a large peripheral circuit (such as a booster circuit) is unnecessary. For example, the highest voltage applied to the memory cell according to this embodiment (the difference between the highest potential and the lowest potential applied to terminals of the memory cell at the same time) can be 5 V or lower, preferably 3 V or lower in each memory cell in the case where two levels (one bit) of data are written.

Note that in addition to the increase in the degree of integration, a multilevel technique can be employed in order to increase the storage capacity of the semiconductor device. For example, three or more levels of data are written to one memory cell, whereby the storage capacity can be increased as compared to that in the case where two-level (one-bit) data is written. The multilevel technique can be achieved by, for example, giving charge Q, which is different from charge $Q_L$ for supplying a low potential and charge $Q_H$ for supplying a high potential, to the gate electrode of the first transistor, in addition to the charge $Q_L$ and the charge $Q_H$. In this case, enough storage capacity can be ensured even in a circuit structure with a relatively large scale (e.g., 15 $F^2$ to 50 $F^2$; F is the minimum feature size).

Next, a semiconductor device having a structure which is partly different from the semiconductor device illustrated in FIGS. 13A and 13B will be described with reference to FIG. 14. The semiconductor device illustrated in FIG. 14 includes the conductive film 126a which is provided in contact with the sidewall insulating films 124a and 124c and the oxide semiconductor film 106a, and the conductive film 126b which is provided in contact with the sidewall insulating film 124b and the oxide semiconductor film 106a, which is different from the semiconductor device illustrated in FIGS. 13A and 13B. One memory cell includes the transistor 160, a transistor 310, and the capacitor 164. Since the basic circuit structure of the semiconductor device illustrated in FIG. 14 and its operation are similar to those of the semiconductor device illustrated in FIG. 13B, detailed description is not repeated.

When the conductive films 126a and 126b serving as a source electrode and a drain electrode are provided in contact with the sidewall insulating films 124a and 124b, a surface of the oxide semiconductor film 106a can be surely covered with the conductive films even when mask misalignment occurs. Further, variation in electrical characteristics of transistors due to mask misalignment can be suppressed. Furthermore, the oxide semiconductor film 106a is not exposed to an etching gas in formation of the source electrode and the drain electrode, which is preferable.

Figure 15A:
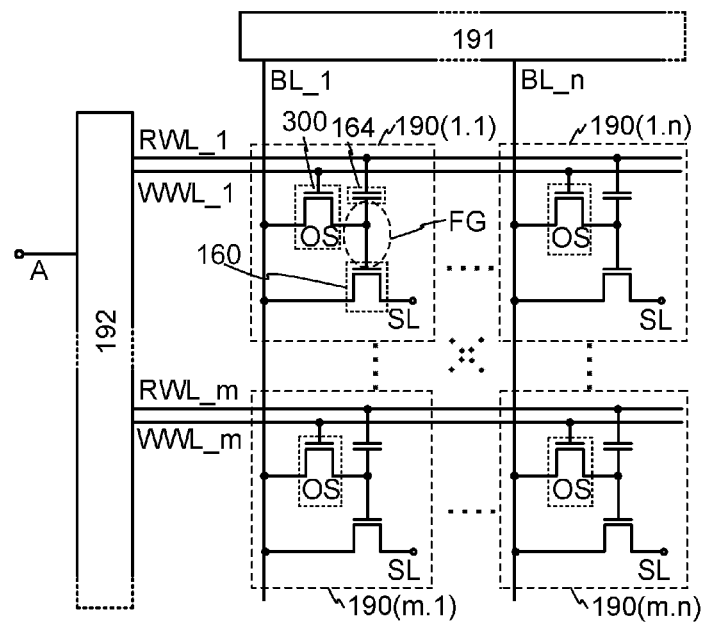
FIGS. 15A and 15B are circuit diagrams each illustrating a semiconductor device according to an embodiment of the present invention.
Figure 15B:
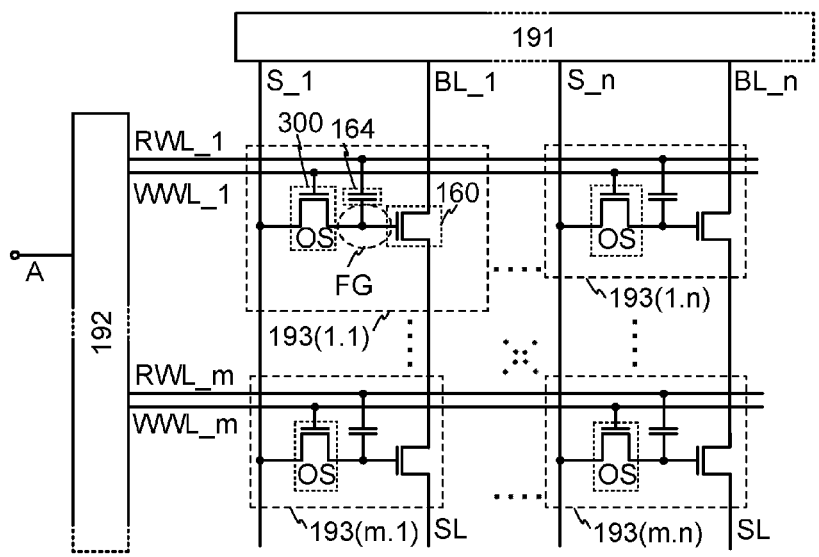

FIGS. 15A and 15B are each an example of a circuit diagram of a semiconductor device including (m×n) memory cells 190. The structure of the memory cell 190 in FIGS. 15A and 15B is similar to that of the memory cell in FIGS. 13A and 13B. In other words, the first wiring and the third wiring in FIGS. 13A and 13B are electrically connected to each other, which correspond to a bit line BL in FIGS. 15A and 15B; the second wiring in FIGS. 13A and 13B corresponds to a source line SL in FIGS. 15A and 15B; the fourth wiring in FIGS. 13A and 13B corresponds to a writing word line WWL in FIGS. 15A and 15B; and the fifth wiring in FIGS. 13A and 13B corresponds to a reading word line RWL in FIGS. 15A and 15B (see FIGS. 15A and 15B).

The semiconductor device in FIG. 15A includes m (m is an integer greater than or equal to 2) write word lines WWL, m read word lines RWL, n (n is an integer greater than or equal to 2) bit lines BL, a memory cell array having the memory cells 190 arranged in a matrix of m (rows) (in the vertical direction)×n (columns) (in the horizontal direction), a first driver circuit 191 connected to the n bit lines BL, and a second driver circuit 192 connected to the m write word lines WWL and the m read word lines RWL. Note that the memory cell array in FIG. 15A is an NOR memory cell array in which memory cells are connected in parallel.

The semiconductor device in FIG. 15B includes m (m is an integer greater than or equal to 2) write word lines WWL, m read word lines RWL, n (n is an integer greater than or equal to 2) bit lines BL, n signal lines S, a memory cell array having the memory cells 190 arranged in a matrix of m (rows) (in the vertical direction)×n (columns) (in the horizontal direction), a first driver circuit 191 connected to the n bit lines BL and the n signal lines S, and a second driver circuit 192 connected to the m write word lines WWL and the m read word lines RWL. Note that the memory cell array in FIG. 15B is a NAND memory cell array in which memory cells are connected in series.

In addition to the transistor 300 and the transistor 310, any of the transistors (transistors 200, 210, 220, 230, 240, and 250) described in the above embodiments can be used as a transistor represented by OS in FIGS. 15A and 15B. The case where the transistor 300 is used is illustrated in FIGS. 15A and 15B.

In FIGS. 15A and 15B, an address selection signal line A is connected to the second driver circuit 192. The address selection signal line A is a line which transmits a signal for selecting a row address of the memory cell.

Next, writing, holding, and reading of data in the semiconductor device illustrated in FIG. 15A will be described.

Figure 13B:
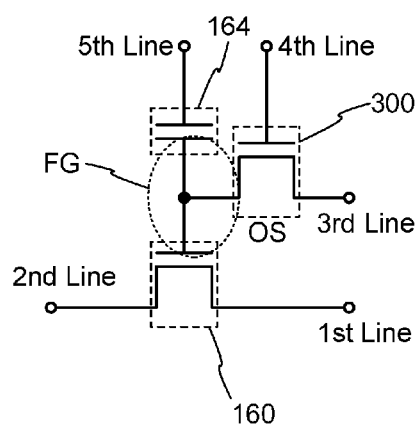
Figure 14:
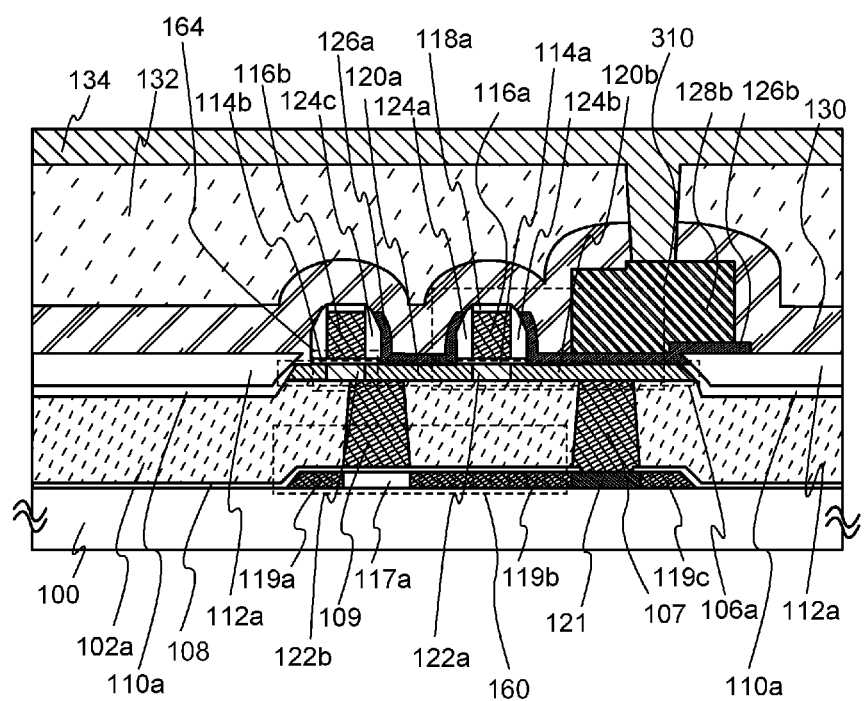
FIG. 14 is a cross-sectional view illustrating a semiconductor device according to an embodiment of the present invention.

In the semiconductor device illustrated in FIG. 15A, writing, holding, and reading of data are basically similar to those in the case of FIGS. 13A and 13B. A specific writing operation is described below. Note that as an example, the case where the potential $V_H$ (here, $V_H$ is lower than a power supply potential VDD, i.e., $V_H$<VDD) or potential $V_L$ is supplied to the node FG is described; however, the relation among potentials supplied to the node FG is not limited to this example. Data that is held when the potential $V_H$ is supplied to the node FG is referred to as data "1", and data that is held when the potential $V_L$ is supplied to the node FG is referred to as data "0".

First, the memory cell 190 that is a target for writing is selected by setting the potentials of the read word line RWL and the write word line WWL, which are connected to the memory cell 190, to $V_0$ and VDD, respectively.

In the case where data "0" is written in the memory cell 190, $V_L$ is supplied to the bit line BL. In the case where data "1" is written in the memory cell 190, $V_H$ or a potential higher than $V_H$ by the threshold voltage of the transistor 300 is supplied to the bit line BL in consideration of a potential decrease in the transistor 300 by its threshold voltage.

Data is held by setting the potential of the read word line RWL and the potential of the writing word line WWL to $V_1$ (here, $V_1$ is lower than $V_0$. In other words, $V_1$<$V_0$, e.g., $V_1$ is lower than $V_0$ by VDD).

When the potential of the read word line RWL is decreased from $V_0$ to $V_1$, the potential in the node FG is decreased by $V_0$-$V_1$ due to capacitive coupling with the capacitor 164. Therefore, the transistor 160 is turned off regardless of whether data "1" or data "0" is written.

Since $V_1$ is supplied to the writing word line WWL, the transistor 300 is in an off state. Off-state current of the transistor 300 is extremely small; thus, the charge in the node FG is held for a long time.

Data is read by setting the potential of the reading word line RWL to $V_0$ and the potential of the writing word line WWL to $V_1$.

When the potential of the read word line RWL is increased from $V_1$ to $V_0$, the potential in the node FG is increased by $V_0$-$V_1$ due to capacitive coupling with the capacitor 164. Therefore, the potential in the node FG is $V_H$ in the case where data "1" is supplied to the node FG, whereas the potential in the node FG is $V_L$ in the case where data "0" is supplied to the node FG.

By the above reading operation, if data "1" is written in the memory cell 190, the transistor 160 is turned on and the potential of the bit line BL is decreased. If data "0" is written, the transistor 160 is turned off and the potential of the bit line BL is maintained at the level at the beginning of reading or is increased.

A semiconductor device according to an embodiment of the present invention is used as the transistor 300. The semiconductor device according to an embodiment of the present invention includes an oxide semiconductor in a channel formation region, so that off-state current of the transistor is small. Therefore, in the case where such a transistor is used in the semiconductor devices illustrated in FIGS. 15A and 15B, stored data can be held for a long time even when power is not supplied, and a memory device which does not have the limitation on the number of writing can be obtained.

Embodiment 6

In this embodiment, an example of a circuit structure of a semiconductor device using the transistor described in any of the above embodiments and its operation are described with reference to FIGS. 16A to 16C and FIG. 17. Note that in each of circuit diagrams, in some cases, "OS" is written beside a transistor in order to indicate that the transistor includes an oxide semiconductor.

<Cross-sectional Structure of Semiconductor Device>

In this embodiment, an example of a semiconductor device whose structure corresponds to that of a so-called dynamic random access memory (DRAM) is described with reference to FIG. 16A. The semiconductor device in FIG. 16A includes a transistor 320 and a capacitor 168.

Figure 16A:
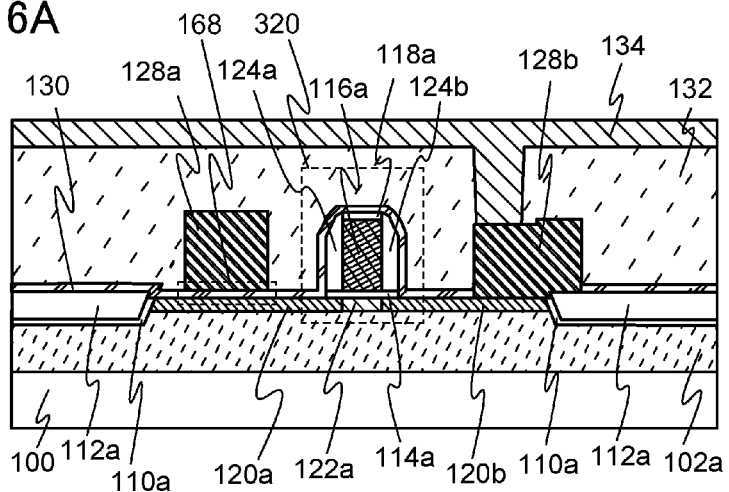
FIGS. 16A to 16C are cross-sectional views and a circuit diagram illustrating a semiconductor device according to an embodiment of the present invention.

A transistor according to an embodiment of the present invention is used as the transistor 320 in FIG. 16A. The transistor 320 includes the channel formation region 122a, the gate electrode 116a, the regions 120a and 120b containing the dopant, the conductive films 128a and 128b, the sidewall insulating films 124a and 124b, the gate insulating film 114a, and the insulating film 118a.

The capacitor 168 in FIG. 16A includes the region 120a containing the dopant, the insulating film 130, and the conductive film 128a. In other words, the conductive film 128a serves as one electrode of the capacitor 168, and the region 120a containing the dopant serves as the other electrode of the capacitor 168.

The insulating film 132 is provided to cover the transistor 320 and the capacitor 168. The conductive film 128b is connected to the wiring 134 through an opening formed in the insulating film 130 and the insulating film 132. Although the region 120b containing the dopant is connected to the wiring 134 through the conductive film 128b in FIG. 16A, the disclosed invention is not limited thereto. For example, without providing the conductive film 128b, the wiring 134 may be directly in contact with the region 120b containing the dopant.

Next, a semiconductor device having a structure which is partly different from the semiconductor device illustrated in FIG. 16A will be described with reference to FIG. 16B. The semiconductor device illustrated in FIG. 16B includes the conductive film 126a which is provided in contact with the sidewall insulating film 124a and the oxide semiconductor film 106a, and the conductive film 126b which is provided in contact with the sidewall insulating film 124b and the oxide semiconductor film 106a, which is different from the semiconductor device illustrate in FIG. 16A. Further, the conductive film 128a is provided over the conductive film 126a with the insulating film 130 interposed therebetween. Furthermore, the conductive film 126b is connected to the conductive film 128b through an opening provided in the insulating film 130.

Figure 16B:
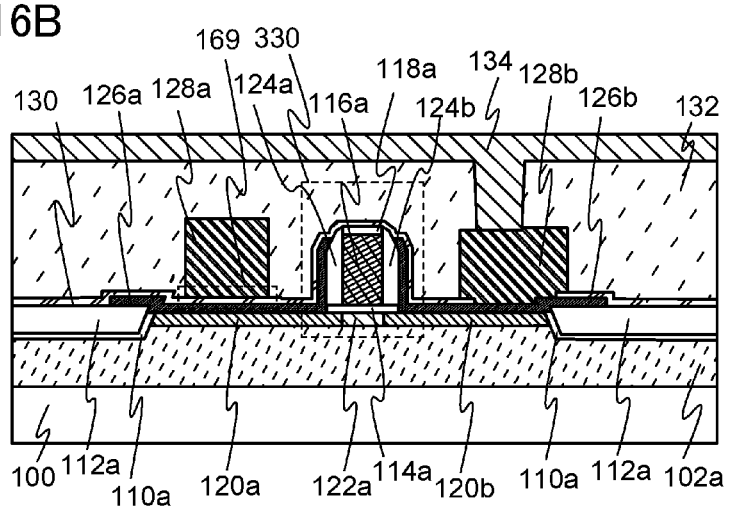

A capacitor 169 illustrated in FIG. 16B includes the conductive film 126a, the insulating film 130, and the conductive film 128. In other words, the conductive film 128a serves as one electrode of the capacitor 169 and the conductive film 126a serves as the other electrode of the capacitor 169.

The insulating film 132 is provided to cover the transistor 320 and the capacitor 169. The conductive film 128b is connected to the wiring 134 through an opening formed in the insulating film 130 and the insulating film 132. Although the conductive film 126b is connected to the wiring 134 through the conductive film 128b in FIG. 16B, the disclosed invention is not limited thereto. For example, without providing the conductive film 128b, the wiring 134 may be directly in contact with the conductive film 126b.

<Basic Circuit>

Figure 16C:
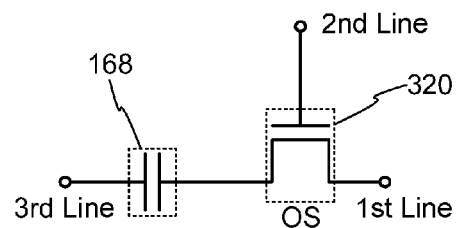

Next, a basic circuit structure of the semiconductor device illustrated in FIG. 16A and its operation will be described with reference to FIG. 16C. In the semiconductor device illustrated in FIG. 16C, a first wiring (1st Line) is electrically connected to a source electrode or a drain electrode of the transistor 320, a second wiring (2nd Line) is electrically connected to a gate electrode of the transistor 320, and one electrode of the capacitor 168 is electrically connected to the drain electrode or the source electrode of the transistor 320. Further, a third wiring (3rd Line) is electrically connected to the other electrode of the capacitor 168. Note that description with reference to FIG. 16C can be referred to for a basic circuit structure of the semiconductor device illustrated in FIG. 16B and its operation.

Here, a transistor including an oxide semiconductor is used as the transistor 320, for example. A transistor including an oxide semiconductor has a characteristic of a significantly small off-state current. Therefore, when the transistor 320 is turned off, a potential supplied to the capacitor 168 can be held for an extremely long time.

The semiconductor device illustrated in FIG. 16C utilizes a characteristic in which the potential supplied to the capacitor 168 can be held, whereby writing, holding, and reading of data can be performed as follows.

Firstly, writing and holding of data will be described. For simplicity, the potential of the third wiring is fixed here. First, the potential of the second wiring is set to a potential at which the transistor 320 is turned on, so that the transistor 320 is turned on. In this manner, the potential of the first wiring is supplied to the one electrode of the capacitor 168. That is, predetermined charge is given to the capacitor 168 (writing of data). After that, the potential of the second wiring is set to a potential at which the transistor 320 is turned off, so that the transistor 320 is turned off. Thus, the charge given to the capacitor 168 is held (holding of data). The transistor 320 has extremely small off-state current as described above, and thus can hold charge for a long time.

Next, reading of data will be described. By setting the potential of the second wiring to a potential at which the transistor 320 is turned on while a predetermined potential (a fixed potential) is supplied to the first wiring, the potential of the first wiring varies depending on the amount of charge held in the capacitor 168. Therefore, the stored data can be read by the potential of the first wiring.

Next, rewriting of data will be described. Rewriting of data is performed in a manner similar to that of the writing and holding of data. In other words, the potential of the second wiring is set to a potential at which the transistor 320 is turned on, so that the transistor 320 is turned on. Accordingly, the potential of the first wiring (a potential for new data) is supplied to the one electrode of the capacitor 168. After that, the potential of the second wiring is set to a potential at which the transistor 320 is turned off, so that the transistor 320 is turned off. Accordingly, charge for the new data is given to the capacitor 168.

In the semiconductor device according to the disclosed invention, data can be directly rewritten by another writing of data as described above. Therefore, high-speed operation of the semiconductor device can be realized.

Note that an n-channel transistor (an n-type transistor) in which electrons are carriers is used in the above description, but it will be appreciated that a p-channel transistor in which holes are majority carriers can be used instead of the n-channel transistor.

Figure 17:
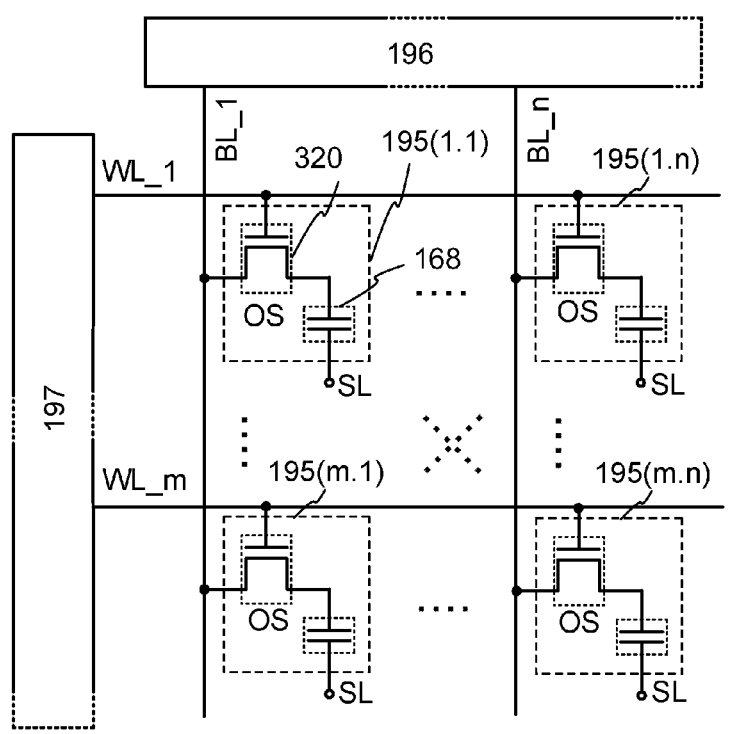
FIG. 17 is a circuit diagram illustrating a semiconductor device according to an embodiment of the present invention.

FIG. 17 illustrates an example of a circuit diagram of a semiconductor device including m×n memory cells 195. The structure of the memory cells 195 in FIG. 17 is similar to that in FIG. 16C. In other words, the first wiring in FIG. 16C corresponds to a bit line BL in FIG. 17; the second wiring in FIG. 16C corresponds to a word line WL in FIG. 17; and the third wiring in FIG. 16C corresponds to a source line SL in FIG. 17 (see FIG. 17).

The semiconductor device illustrated in FIG. 17 includes n bit lines BL, m word lines WL, a memory cell array having the memory cells 195 arranged in a matrix of m (rows) (in the vertical direction)×n (columns) (in the horizontal direction), a first driver circuit 196 connected to the n bit lines BL, and a second driver circuit 197 connected to the m word lines WL.

The memory cell 195 includes the transistor 320 and the capacitor 168. A gate electrode of the transistor 320 is connected to one of the word lines WL. One of a source electrode and a drain electrode of the transistor 320 is connected to one of the bit lines BL. The other of the source electrode and the drain electrode of the transistor 320 is connected to one electrode of the capacitor 168. The other electrode of the capacitor 168 is connected to one of source lines SL and supplied a predetermined potential. The transistor described in any of the above embodiments is applied to the transistor 320.

The semiconductor device according to an embodiment of the present invention includes an oxide semiconductor in a channel formation region, so that off-state current of the transistor is smaller than that of a transistor including single crystal silicon in a channel formation region. Accordingly, when the transistor is applied to the semiconductor devices illustrated in FIGS. 15A and 15B and FIGS. 16A to 16C, which are each regarded as a so-called DRAM, a memory having an extremely long interval between refresh periods can be obtained.

The structures and methods described in this embodiment can be combined as appropriate with any of the structures and methods described in the other embodiments.

Embodiment 7

A semiconductor device having an image sensor function for reading data of an object can be manufactured with the use of a semiconductor device according to an embodiment of the present invention.

Figure 18A:
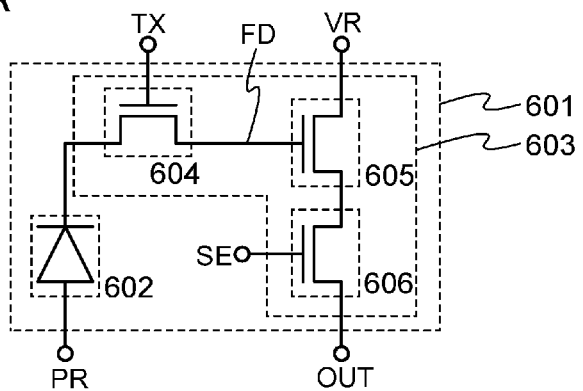
FIGS. 18A to 18C are a circuit diagram and cross-sectional views illustrating a semiconductor device according to an embodiment of the present invention.
Figure 18B:
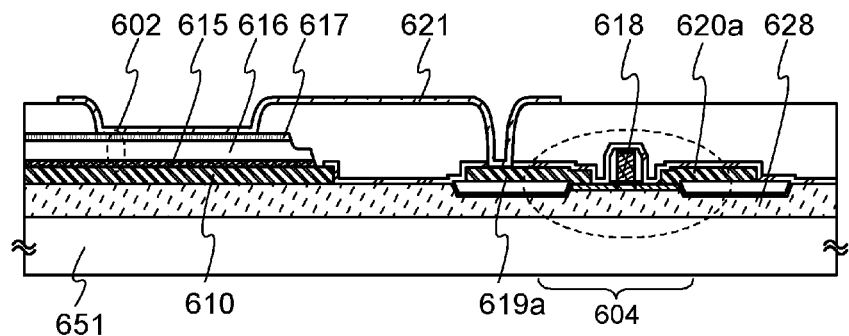
Figure 18C:
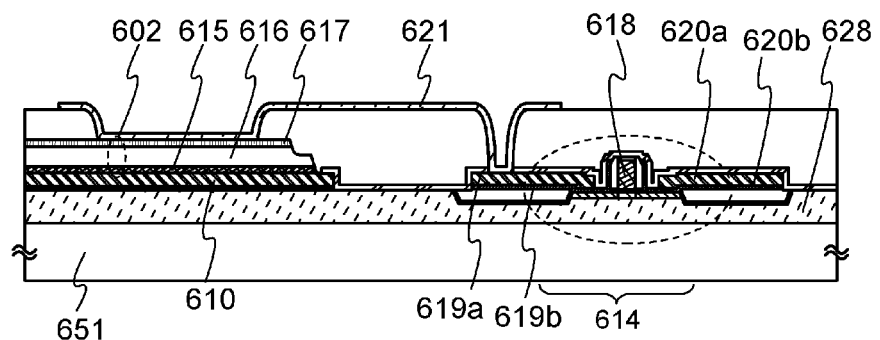

FIG. 18A illustrates an example of a semiconductor device having an image sensor function. FIG. 18A is an equivalent circuit diagram of a photosensor, and FIG. 18B and FIG. 18C are each a cross-sectional view of part of the photosensor.

In FIG. 18A, a photosensor 601 includes a photodiode 602 and an amplifier circuit 603. The photodiode 602 is a photoelectric conversion element which generates current when a junction of semiconductors is irradiated with light. The amplifier circuit 603 is a circuit which amplifies current obtained through light reception by the photodiode 602 or a circuit which holds charge accumulated with the current. When light that enters the photodiode 602 is detected, the photosensor 601 can read data on an object to be detected.

Note that a light source such as a backlight can be used at the time of reading data on an object.

The configuration of the amplifier circuit 603 may be any configuration as long as current generated in the photodiode 602 can be amplified. The amplifier circuit 603 includes at least a transistor 605 which amplifies current generated in the photodiode 602.

A specific configuration of the photosensor 601 in FIG. 18A will be described below on the assumption that one of a source electrode and a drain electrode is a first terminal and the other is a second terminal.

In the photosensor 601 in FIG. 18A, the amplifier circuit 603 includes a transistor 604, a transistor 605, and a transistor 606. The transistor 604 functions as a switching element which controls supply of the current to the amplifier circuit 603. The current value or the resistance value between a first terminal and a second terminal of the transistor 605 depends on a potential supplied to a second terminal of the transistor 604. The transistor 606 functions as a switching element for supplying the potential of an output signal, which is set in accordance with the current value or the resistance value, to a wiring OUT.

In this embodiment, a semiconductor device according to an embodiment of the present invention can be used as the transistor 604. Since oxygen defects included in the oxide semiconductor in the transistor 604 are reduced, the negative shift of the threshold voltage can be reduced and leakage current between a source and a drain of the transistor can be reduced. Thus, with the use of the semiconductor device according to an embodiment of the present invention, a semiconductor device with improved electrical characteristics can be provided.

Specifically, in FIG. 18A, an anode of the photodiode 602 is connected to a wiring PR. A cathode of the photodiode 602 is connected to a first terminal of the transistor 604. The second terminal of the transistor 604 is connected to another semiconductor element included in the amplifier circuit 603; thus, the connection of the second terminal of the transistor 604 differs depending on the configuration of the amplifier circuit 603. In FIG. 18A, the second terminal of the transistor 604 is connected to a gate electrode of the transistor 605. A gate electrode of the transistor 604 is connected to a wiring TX. The wiring TX is supplied with a potential of a signal for controlling the switching of the transistor 604. The first terminal of the transistor 605 is connected to a wiring VR which is supplied with the high-level power supply potential VDD. The second terminal of the transistor 605 is connected to a first terminal of the transistor 606. A second terminal of the transistor 606 is connected to the wiring OUT. A gate electrode of the transistor 606 is connected to a wiring SE, and the wiring SE is supplied with a potential of a signal for controlling the switching of the transistor 606. The wiring OUT is supplied with a potential of an output signal which is output from the amplifier circuit 603.

In FIG. 18A, a node where the second terminal of the transistor 604 and the gate electrode of the transistor 605 are connected to each other is denoted by a node FD. The potential of the output signal is determined by the amount of charge accumulated at the node FD. In order to hold charge at the node FD more reliably, a storage capacitor may be connected to the node FD.

Even when different components are connected to each other in a circuit diagram, there is actually a case where one conductive film has functions of a plurality of components, such as a case where part of a wiring serves as an electrode. The term "connection" also means such a case where one conductive film has functions of a plurality of components.

Note that FIG. 18A illustrates the case where the wiring PR, the wiring TX, and the wiring OUT are connected to the photosensor 601; however, the number of wirings included in the photosensor 601 in an embodiment of the present invention is not limited to the number in this example. In addition to the above wirings, a wiring supplied with a power supply potential, a wiring supplied with a potential of a signal for resetting the amount of electric charge held in the amplifier circuit 603, or the like may be connected to the photosensor 601.

Note that although FIG. 18A illustrates the configuration of the photosensor 601 in which the amplifier circuit 603 includes only one transistor 604 which functions as a switching element, an embodiment of the present invention is not limited to this configuration. In an embodiment of the present invention, one transistor functions as one switching element; alternatively, a plurality of transistors may function as one switching element. In the case where a plurality of transistors functions as one switching element, the plurality of transistors may be connected to each other in parallel, in series, or in combination of parallel connection and series connection.

Note that in this specification, the state where the transistors are connected to each other in series means a state where only one of a first terminal and a second terminal of a first transistor is connected to only one of a first terminal and a second terminal of a second transistor. Further, the state in which the transistors are connected to each other in parallel means a state where the first terminal of the first transistor is connected to the first terminal of the second transistor and the second terminal of the first transistor is connected to the second terminal of the second transistor.

In FIG. 18A, a semiconductor device according to an embodiment of the present invention can be used as the transistor 604 included in the amplifier circuit 603. Since oxygen defects included in the oxide semiconductor in the transistor 604 are reduced, the negative shift of the threshold voltage can be reduced and leakage current between a source and a drain of the transistor can be reduced. When the oxide semiconductor film is used for the active layer of the transistor 604, the off-state current of the transistor 604 can be significantly reduced. The transistor 604 functions as a switching element for holding electric charge accumulated in the photosensor 601; thus, leakage of the electric charge in an electric charge holding period can be suppressed.

FIG. 18B illustrates a cross section including the photodiode 602 and the transistor 604 in the photosensor 601.

The photodiode 602 included in the photosensor 601 includes, over a substrate 651, a p-type semiconductor film 615, an i-type semiconductor film 616, and an n-type semiconductor film 617 which are sequentially stacked. The conductive film 610 is electrically connected to the p-type semiconductor film 615 functioning as the anode of the photodiode 602.

A conductive film 618 included in the photosensor 601 serves as the gate electrode of the transistor 604. A conductive film 619a serves as the first terminal of the transistor 604. A conductive film 620a serves as the second terminal of the transistor 604. A conductive film 621 is connected to an n-type semiconductor film 617 and the conductive film 619a.

In FIG. 18B, the photosensor 601 includes a conductive film 610 serving as the wiring PR. The conductive film 610, the conductive film 619a, and the conductive film 620a can be formed in such a manner that one conductive film formed over an insulating film 628 is processed into desired shapes.

Note that the cross-sectional view of the photosensor 601 in FIG. 18B shows a state after the process up to and including the step of forming the conductive film 621. In a display device, a display element as well as the photosensor 601 is provided; thus, a display element is practically formed after the conductive film 621 is formed.

FIG. 18C illustrates a cross section including the photodiode 602 and the transistor 614 in the photosensor 601. The transistor 614 corresponds to the transistor 604 illustrated in FIGS. 18A and 18B. The transistor 614 has a structure which is partly different from the transistor 604 illustrated in FIGS. 18A and 18B.

The conductive film 618 included in the photosensor 601 serves as a gate electrode of the transistor 614. The conductive film 619a and a conductive film 619b serve as a first terminal of the transistor 614. The conductive film 620a and the conductive film 619b serve as a second terminal of the transistor 614. The conductive film 621 is connected to an n-type semiconductor film 617 and the conductive film 619a.

This embodiment can be implemented in appropriate combination with the structures described in the other embodiments.

Embodiment 8

In this embodiment, the cases where any of the semiconductor devices described in the above embodiments is applied to an electronic appliance will be described with reference to FIG. 19, FIG. 20, and FIG. 21.

Figure 19:
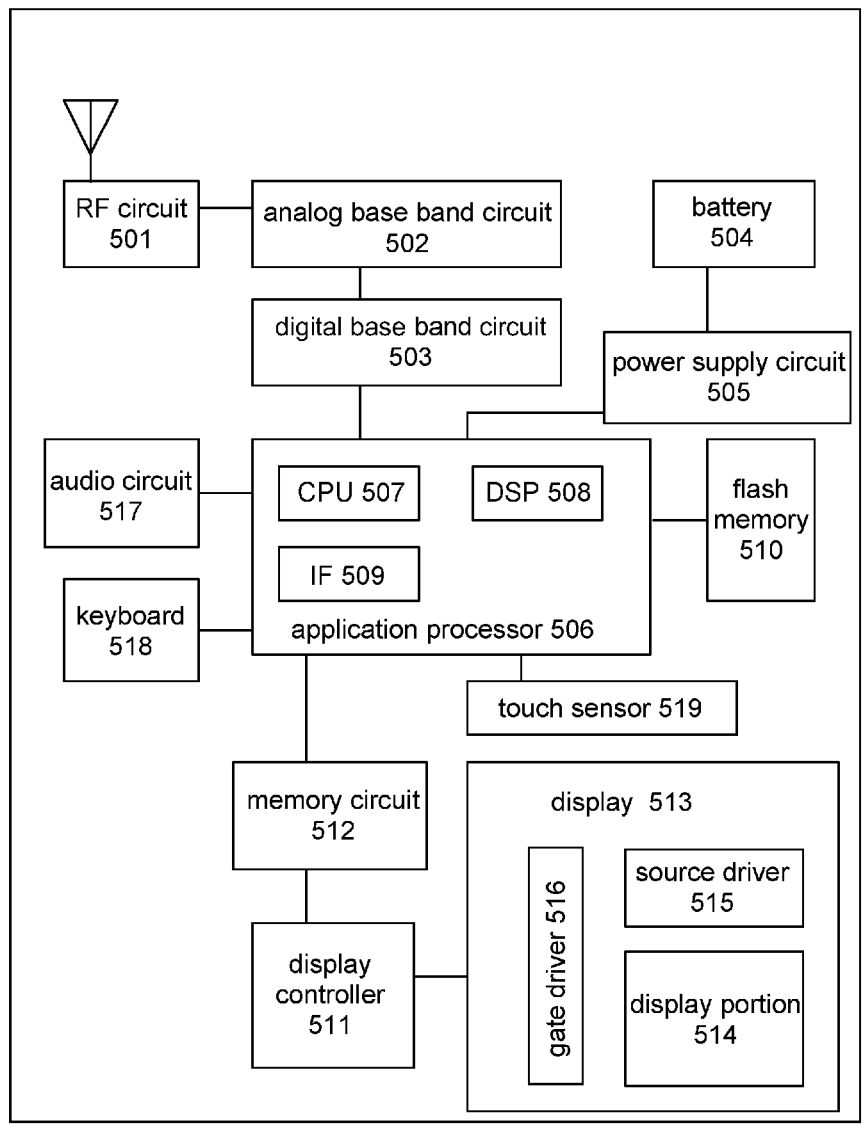
FIG. 19 is a block diagram of an electronic device according to an embodiment of the present invention.

FIG. 19 is a block diagram of a portable device. The portable device in FIG. 19 includes an RF circuit 501, an analog base band circuit 502, a digital base band circuit 503, a battery 504, a power supply circuit 505, an application processor 506, a flash memory 510, a display controller 511, a memory circuit 512, a display 513, a touch sensor 519, an audio circuit 517, a keyboard 518, and the like. The display 513 includes a display portion 514, a source driver 515, and a gate driver 516. The application processor 506 includes a CPU 507, a DSP 508, and an interface 509 (an IF 509). A memory circuit generally includes an SRAM or a DRAM, and the semiconductor device described in the above embodiments is used for the memory circuit 512, so that data can be written and read at high speed, data can be held for a long time, and power consumption can be sufficiently reduced.

Figure 20:
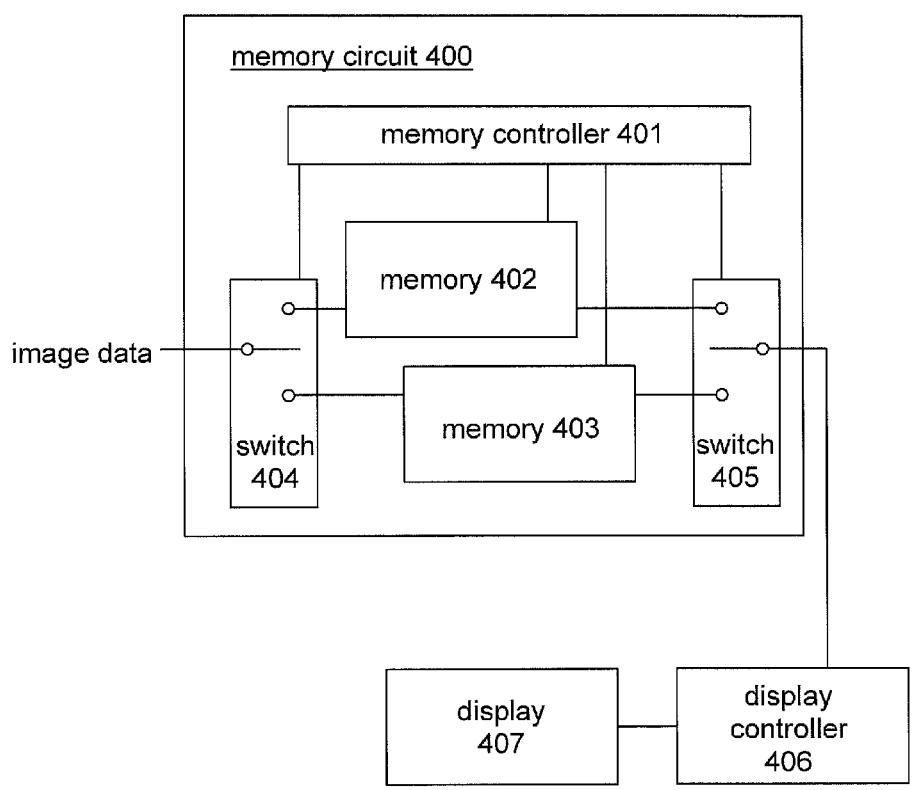
FIG. 20 is a block diagram of an electronic device according to an embodiment of the present invention.

Next, FIG. 20 is an example in which the semiconductor device described in the above embodiments is used for a memory circuit 400 of a display. The memory circuit 400 in FIG. 20 includes a memory 402, a memory 403, a switch 404, a switch 405, and a memory controller 401. The memory 402 and the memory 403 are formed using the semiconductor device described in the above embodiments.

First, image data is formed by an application processor (not shown). The formed image data (an input image data 1) is stored in the memory 402 through the switch 404. Then, the image data stored in the memory 402 (a stored image data 1) is transmitted to the display 407 through the switch 405 and the display controller 406.

In the case where the input image data 1 is not changed, the stored image data 1 is read from the display controller 406 through the memory 402 and the switch 405 at a frequency about 30 Hz to 60 Hz in general.

Upon rewriting data on the screen (that is, in the case where the input image data is changed), the application processor generates new image data (an input image data 2). The input image data 2 is stored in the memory 403 through the switch 404. Also during this period, the stored image data 1 is read periodically from the memory 402 through the switch 405. After the termination of storing the new image data in the memory 403 (a stored image data 2), reading of the stored image data 2 is started from the following frame of the display 407; the stored image data 2 is transmitted to the display 407 through the switch 405 and the display controller 406 to be displayed, which is repeated until the next new image data is stored in the memory 402.

In this manner, data writing and data reading are performed alternately in the memory 402 and the memory 403, whereby display is performed on the display 407. Note that the memory 402 and the memory 403 are not necessarily provided separately, and may be obtained by dividing one memory. The semiconductor device described in the above embodiments is used for the memory 402 and the memory 403, whereby data can be written and read at high speed, data can be stored for a long time, and power consumption can be sufficiently reduced.

Figure 21:
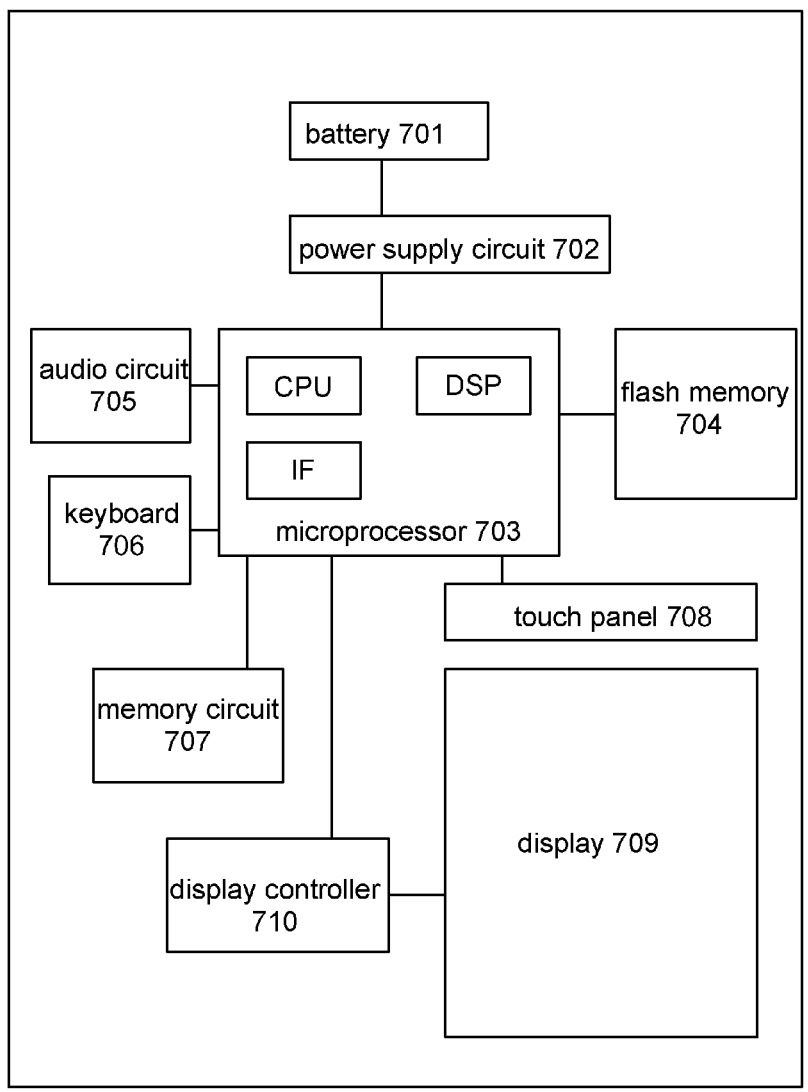
FIG. 21 is a block diagram of an electronic device according to an embodiment of the present invention.

Next, FIG. 21 is a block diagram of an e-book reader. The e-book reader in FIG. 21 includes a battery 701, a power supply circuit 702, a microprocessor 703, a flash memory 704, an audio circuit 705, a keyboard 706, a memory circuit 707, a touch panel 708, a display 709, and a display controller 710. The semiconductor device described in the above embodiments can be used for the memory circuit 707. The memory circuit 707 functions to maintain the contents of an e-book temporarily, for example, highlighting. When a user wants to mark part in the e-book, the user can show the part differently from surroundings by changing the display color, underlining, bolding the text, changing the font of the text, or the like, which are the highlighting functions of the e-book reader of this embodiment. That is, data of the content which is required of the user can be stored and maintained by the highlighting functions. In order to maintain that content for a long period, that content may be copied in the flash memory 704. Also in such a case, the semiconductor device described in the above embodiments is used, whereby data can be written and read at high speed, data can be stored for a long time, and power consumption can be sufficiently reduced.

Embodiment 9

In this embodiment, the case where any of the semiconductor devices described in the above embodiments is applied to an electronic appliance will be described with reference to FIGS. 22A to 22F. In this embodiment, examples of the electronic device to which the semiconductor device described in any of the above embodiments is applied include a computer, a mobile phone (also referred to as a cellular phone or a mobile phone device), a personal digital assistant (including a portable game machine, an audio reproducing device, and the like), a camera such as a digital camera or a digital video camera, an electronic paper, and a television device (also referred to as a television or a television receiver).

Figure 22A:
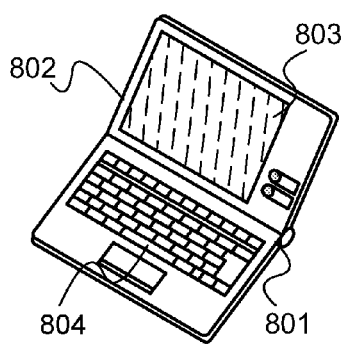
FIGS. 22A to 22F each illustrate an electronic device according to an embodiment of the present invention.

FIG. 22A shows a notebook personal computer including a housing 801, a housing 802, a display portion 803, a keyboard 804, and the like. At least one of the housing 801 and the housing 802 includes a semiconductor circuit (e.g., a memory circuit), and the memory circuit includes the semiconductor device described in any of the above embodiments. Consequently, a notebook personal computer in which data writing and data reading are performed at high speed, data is stored for a long time, and power consumption is sufficiently reduced can be obtained.

Figure 22D:
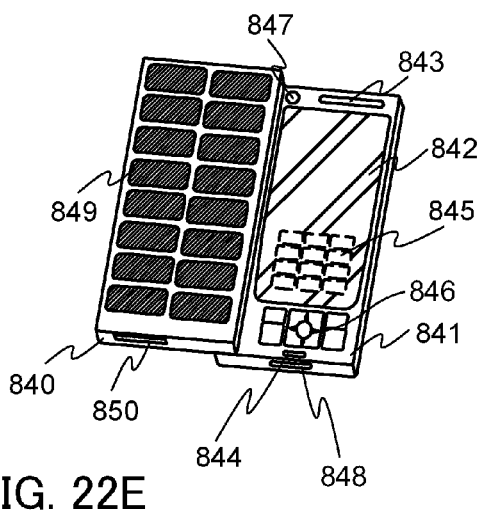
Figure 22B:
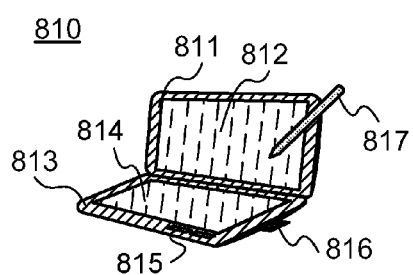

FIG. 22B is a tablet terminal 810. The tablet terminal 810 includes a housing 811 including a display portion 812, a housing 813 including a display portion 814, operation keys 815, and an external interface 816. In addition, a stylus 817 for operating the tablet terminal 810, and the like are provided. A semiconductor circuit (e.g., a memory circuit) is included in each of the housing 811 and the housing 813 and at least one of the electric circuits includes the semiconductor device described in any of the above embodiments. Accordingly, a tablet terminal in which data writing and data reading are performed at high speed, data is stored for a long time, and power consumption is sufficiently reduced can be obtained.

Figure 22E:
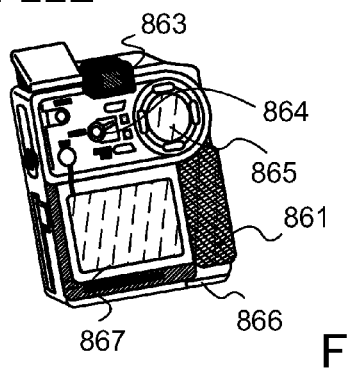
Figure 22C:
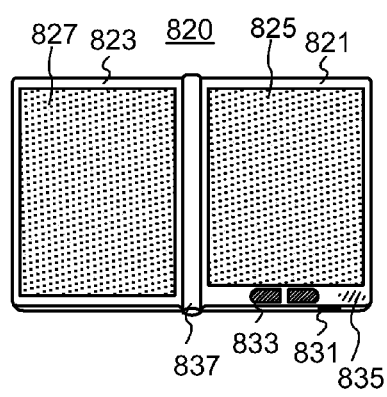

FIG. 22C is an e-book reader 820 incorporating electronic paper, which includes two housings, a housing 821 and a housing 823. The housing 821 and the housing 823 includes a display portion 825 and a display portion 827, respectively. The housing 821 and the housing 823 are connected by a hinge 837 and can be opened and closed along the hinge 837. The housing 821 further includes a power switch 831, operation keys 833, a speaker 835, and the like. At least one of the housing 821 and the housing 823 includes a semiconductor circuit (e.g., a memory circuit), and the memory circuit includes the semiconductor device described in any of the above embodiments. Consequently, an e-book reader in which data writing and data reading are performed at high speed, data is stored for a long time, and power consumption is sufficiently reduced can be obtained.

FIG. 22D is a mobile phone including a housing 840 and a housing 841. Moreover, the housing 840 and the housing 841 in a state where they are developed as illustrated in FIG. 22D can be slid so that one is lapped over the other; in this manner, the size of the mobile phone can be reduced, which makes the mobile phone suitable for being carried. The housing 841 includes a display panel 842, a speaker 843, a microphone 844, operation keys 845, a pointing device 846, a camera lens 847, an external connection terminal 848, and the like. In addition, the housing 840 includes a solar cell 849 for charging the mobile phone, an external memory slot 850, and the like. Further, an antenna is incorporated in the housing 841. At least one of the housing 840 and the housing 841 includes a semiconductor circuit (e.g., a memory circuit), and the semiconductor circuit includes the semiconductor device described in any of the above embodiments. Accordingly, a mobile phone in which data writing and data reading are performed at high speed, data is stored for a long time, and power consumption is sufficiently reduced can be obtained.

FIG. 22E is a digital camera including a main body 861, a display portion 867, an eyepiece 863, an operation switch 864, a display portion 865, a battery 866, and the like. The main body 861 includes a semiconductor circuit (e.g., a memory circuit), and the semiconductor circuit includes the semiconductor device described in any of the above embodiments. Accordingly, a digital camera in which data writing and data reading are performed at high speed, data is stored for a long time, and power consumption is sufficiently reduced can be obtained.

Figure 22F:
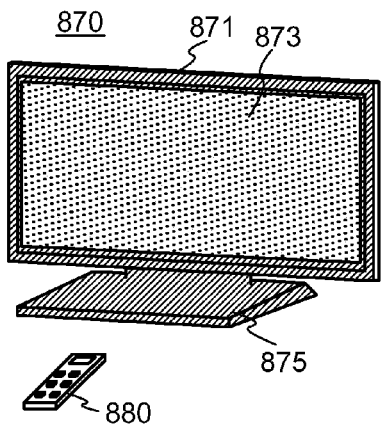

FIG. 22F illustrates a television set 870 including a housing 871, a display portion 873, a stand 875, and the like. The television set 870 can be operated with an operation switch of the housing 871 or a remote controller 880. A semiconductor circuit (e.g., a memory circuit) is provided in each of the housing 871 and the remote controller 880, and the semiconductor device described in any of the above embodiments is mounted in the semiconductor circuit. Consequently, a television set in which data writing and data reading are performed at high speed, data is stored for a long time, and power consumption is sufficiently reduced can be obtained.

As described above, the semiconductor device in any of the above embodiments is mounted on each of the electronic devices described in this embodiment. Therefore, electronic devices with low power consumption can be realized.

This application is based on Japanese Patent Application serial no. 2011-014632 filed with Japan Patent Office on Jan.

26, 2011, and Japanese Patent Application serial no. 2011-014633 filed with Japan Patent Office on Jan. 26, 2011, the entire contents of which are hereby incorporated by reference.

What is claimed is:

1. A semiconductor device comprising:
a first insulating film having a projection portion and a depression portion over a substrate;
an oxide semiconductor film over the projection portion only of the first insulating film;
a second insulating film in the depression portion of the first insulating film;
a third insulating film over and in direct contact with the second insulating film;
a gate insulating film over and in direct contact with a top surface of the oxide semiconductor film;
a gate electrode over the gate insulating film;
a source electrode and a drain electrode over and in direct contact with the oxide semiconductor film, the second insulating film and the third insulating film; and
wherein the region of the first insulating film is surrounded by the depression portion,
wherein entire region of the third insulating film is located at a lower position than a top surface of the gate electrode,
wherein the top surface of the oxide semiconductor film is not covered by the second insulating film,
wherein the third insulating film is not in contact with the oxide semiconductor film,
wherein a side surface of the oxide semiconductor film is covered by and in direct contact with the second insulating film, and
wherein the oxide semiconductor film comprises a channel formation region and first regions containing a dopant between which the channel formation region is sandwiched.

2. The semiconductor device according to claim 1, wherein the second insulating film comprises an insulating material from which oxygen is released by heat treatment.

3. The semiconductor device according to claim 1, wherein the oxide semiconductor film comprises one or more elements selected from In, Ga, Sn, and Zn.

4. The semiconductor device according to claim 1,
wherein the second insulating film comprises an insulating material from which oxygen is released by heat treatment, and
wherein the third insulating film comprises aluminum oxide.

5. The semiconductor device according to claim 1, wherein the dopant is at least one element selected from hydrogen, helium, neon, argon, krypton, xenon, nitrogen, phosphorus, arsenic, boron, and aluminum.

6. An electronic device comprising the semiconductor device according to claim 1.

7. A semiconductor device comprising:
a first insulating film having a projection portion and a depression portion over a substrate;
an oxide semiconductor film over the projection portion only of the first insulating film;
a second insulating film in the depression portion of the first insulating film;
a third insulating film over and in direct contact with the second insulating film;
a gate insulating film over and in direct contact with a top surface of the oxide semiconductor film;
a gate electrode over the gate insulating film; and
a source electrode and a drain electrode over the oxide semiconductor film, the second insulating film and the third insulating film,
wherein the region of the first insulating film is surrounded by the depression portion,
wherein entire region of the third insulating film is located at a lower position than a top surface of the gate electrode,
wherein the top surface of the oxide semiconductor film is not covered by the second insulating film,
wherein the third insulating film is not in contact with the oxide semiconductor film,
wherein a side surface of the oxide semiconductor film is covered by and in direct contact with the second insulating film,
wherein the oxide semiconductor film comprises a channel formation region, first regions containing a dopant between which the channel formation region is sandwiched, and second regions containing the dopant between which the first regions are sandwiched, and
wherein a dopant concentration of the first regions is different from a dopant concentration of the second regions.

8. The semiconductor device according to claim 7, further comprising:
sidewall insulating films in direct contact with the gate electrode,
wherein the first regions overlap with the sidewall insulating films, and
wherein the dopant concentration of the first regions is lower than the dopant concentration of the second regions.

9. The semiconductor device according to claim 7, wherein the second insulating film comprises an insulating material from which oxygen is released by heat treatment.

10. The semiconductor device according to claim 7, wherein the oxide semiconductor film comprises one or more elements selected from In, Ga, Sn, and Zn.

11. The semiconductor device according to claim 7,
wherein the second insulating film comprises an insulating material from which oxygen is released by heat treatment, and
wherein the third insulating film comprises aluminum oxide.

12. The semiconductor device according to claim 7, wherein the dopant is at least one element selected from hydrogen, helium, neon, argon, krypton, xenon, nitrogen, phosphorus, arsenic, boron, and aluminum.

13. An electronic device comprising the semiconductor device according to claim 7.

14. A semiconductor device comprising:
a first insulating film having a projection portion and a depression portion over a substrate;
an oxide semiconductor film over the projection portion only of the first insulating film;
a second insulating film in the depression portion of the first insulating film;
a gate insulating film over the oxide semiconductor film;
a gate electrode over the gate insulating film;
a first conductive film over and in direct contact with the oxide semiconductor film and the second insulating film; and
a second conductive film over and in direct contact with the first conductive film,
wherein the region of the first insulating film is surrounded by the depression portion, wherein a width of the first conductive film is larger than a width of the second conductive film, wherein a side surface of the oxide semiconductor film is covered by and in direct contact with the second insulating film, and wherein the oxide semiconductor film comprises a channel formation region and regions containing a dopant between which the channel formation region is sandwiched.

15. The semiconductor device according to claim 14, further comprising:

sidewall insulating films in direct contact with the gate electrode, wherein the first conductive film is in contact with the sidewall insulating films.

16. The semiconductor device according to claim 15, wherein the first conductive film is thinner than the second conductive film.

17. The semiconductor device according to claim 14, wherein the second insulating film comprises an insulating material from which oxygen is released by heat treatment.

18. The semiconductor device according to claim 14, wherein the oxide semiconductor film comprises one or more elements selected from In, Ga, Sn, and Zn.

19. The semiconductor device according to claim 14, further comprising:

a third insulating film over and in direct contact with the second insulating film, wherein the second insulating film comprises an insulating material from which oxygen is released by heat treatment, and wherein the third insulating film comprises aluminum oxide.

20. The semiconductor device according to claim 14, wherein the dopant is at least one element selected from hydrogen, helium, neon, argon, krypton, xenon, nitrogen, phosphorus, arsenic, boron, and aluminum.

21. An electronic device comprising the semiconductor device according to claim 14.

22. A semiconductor device comprising:

a first insulating film having a projection portion and a depression portion over a substrate;

an oxide semiconductor film over the projection portion only of the first insulating film;

a second insulating film in the depression portion of the first insulating film;

a gate insulating film over the oxide semiconductor film;

a gate electrode over the gate insulating film;

a first conductive film over and in direct contact with the oxide semiconductor film and the second insulating film; and a second conductive film over and in direct contact with the first conductive film, wherein the region of the first insulating film is surrounded by the depression portion, wherein a width of the first conductive film is larger than a width of the second conductive film, wherein a side surface of the oxide semiconductor film is covered by and in direct contact with the second insulating film, wherein the oxide semiconductor film comprises a channel formation region, first regions containing a dopant between which the channel formation region is sandwiched, and second regions containing the dopant between which the first regions containing the dopant are sandwiched, and wherein a dopant concentration of the first regions is different from a dopant concentration of the second regions.

23. The semiconductor device according to claim 22, further comprising:

sidewall insulating films in direct contact with the gate electrode, wherein the dopant concentration of the first regions is lower than the dopant concentration of the second regions.

24. The semiconductor device according to claim 22, further comprising:

sidewall insulating films in direct contact with the gate electrode, wherein the first conductive film is in contact with the sidewall insulating films.

25. The semiconductor device according to claim 24, wherein the first conductive film is thinner than the second conductive film.

26. The semiconductor device according to claim 22, wherein the second insulating film comprises an insulating material from which oxygen is released by heat treatment.

27. The semiconductor device according to claim 22, wherein the oxide semiconductor film comprises one or more elements selected from In, Ga, Sn, and Zn.

28. The semiconductor device according to claim 22, further comprising:

a third insulating film over and in direct contact with the second insulating film, wherein the second insulating film comprises an insulating material from which oxygen is released by heat treatment, and wherein the third insulating film comprises aluminum oxide.

29. The semiconductor device according to claim 22, wherein the dopant is at least one element selected from hydrogen, helium, neon, argon, krypton, xenon, nitrogen, phosphorus, arsenic, boron, and aluminum.

30. An electronic device comprising the semiconductor device according to claim 22.

31. The semiconductor device according to claim 1, further comprising:

a fourth insulating film over and in direct contact with an upper surface of the source electrode, an upper surface of the drain electrode, the second insulating film, and the third insulating film.

32. The semiconductor device according to claim 7, further comprising:

a fourth insulating film over and in direct contact with an upper surface of the source electrode, an upper surface of the drain electrode, the second insulating film, and the third insulating film.

33. The semiconductor device according to claim 14, wherein the first conductive film is a source electrode or a drain electrode.

34. The semiconductor device according to claim 22, wherein the first conductive film is a source electrode or a drain electrode.

* * * * *